United States Patent
Shitagaki et al.

(10) Patent No.: US 8,841,653 B2
(45) Date of Patent: Sep. 23, 2014

(54) LIGHT-EMITTING ELEMENT, LIGHT-EMITTING DEVICE, LIGHTING DEVICE, AND ELECTRONIC APPLIANCE

(75) Inventors: Satoko Shitagaki, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 468 days.

(21) Appl. No.: 12/787,932

(22) Filed: May 26, 2010

(65) Prior Publication Data

US 2010/0301382 A1 Dec. 2, 2010

(30) Foreign Application Priority Data

May 29, 2009 (JP) .................................. 2009-131613

(51) Int. Cl.
*H01L 51/54* (2006.01)
*H01L 51/50* (2006.01)
*H01L 51/00* (2006.01)

(52) U.S. Cl.
CPC ......... *H01L 51/5052* (2013.01); *H01L 51/0072* (2013.01); *H01L 2251/552* (2013.01); *H01L 51/0074* (2013.01); *H01L 51/0054* (2013.01)
USPC .............. 257/40; 257/E51.018; 257/E51.022; 313/504; 313/506; 428/690

(58) Field of Classification Search
USPC ............................ 257/40, E51.018, E21.022; 313/498–512
See application file for complete search history.

(56) References Cited

U.S. PATENT DOCUMENTS 6,285,039 B1    9/2001   Kobori et al.
6,475,648 B1 * 11/2002   Hatwar et al. ................ 428/690
6,580,213 B2 *   6/2003   Yamazaki ..................... 313/506

(Continued)

FOREIGN PATENT DOCUMENTS

CN        001543282 A    11/2004
EP         0 857 007 A1    8/1998

(Continued)

OTHER PUBLICATIONS

"Principles of Solar Cells, LEDs and Diodes" by Adrian Kitai, Wiley Published 2011.*

(Continued)

*Primary Examiner* — Mark Tornow
*Assistant Examiner* — Eric Ward
(74) *Attorney, Agent, or Firm* — Husch Blackwell LLP

(57) ABSTRACT

A light-emitting element whose lifetime is improved. In addition, a light-emitting device, a lighting device, and an electronic appliance in which the light-emitting element is used. A light-emitting element including, between an anode and a cathode, a hole-transport layer and a layer containing a light-emitting substance provided to be in contact with a cathode side surface of the hole-transport layer, in which the hole-transport layer includes a first organic compound and an anti-reduction substance, and in which the layer containing a light-emitting substance includes a second organic compound and a light-emitting substance and has at least an electron-transport property is provided. In addition, a light-emitting device including the light-emitting element, or a lighting device or an electronic appliance including the light-emitting device is provided.

25 Claims, 30 Drawing Sheets

(56) References Cited

U.S. PATENT DOCUMENTS

| | | |
|---|---|---|
| 6,603,140 B2 | 8/2003 | Kobori et al. |
| 6,750,472 B2 | 6/2004 | Suzuki et al. |
| 6,867,538 B2 | 3/2005 | Adachi et al. |
| 6,951,694 B2 | 10/2005 | Thompson et al. |
| 7,158,161 B2 | 1/2007 | Gyoutoku et al. |
| 7,387,904 B2 | 6/2008 | Saito et al. |
| 7,453,204 B2 | 11/2008 | Kitamura |
| 7,462,883 B2 | 12/2008 | Kumaki et al. |
| 7,521,855 B2 | 4/2009 | Sakata et al. |
| 7,545,840 B2 | 6/2009 | Yukawa |
| 7,605,534 B2 | 10/2009 | Yamazaki et al. |
| 7,626,198 B2 | 12/2009 | Hirakata et al. |
| 7,649,197 B2 | 1/2010 | Iwaki et al. |
| 7,649,211 B2 | 1/2010 | Ohsawa |
| 7,667,389 B2 | 2/2010 | Ikeda et al. |
| 7,683,532 B2 | 3/2010 | Abe et al. |
| 7,714,501 B2 | 5/2010 | Nomura et al. |
| 7,838,874 B2 | 11/2010 | Ibe et al. |
| 7,897,270 B2 * | 3/2011 | Kim et al. .......... 428/690 |
| 7,943,925 B2 | 5/2011 | Yamazaki |
| 8,007,927 B2 | 8/2011 | Lin et al. |
| 8,221,905 B2 | 7/2012 | Lin et al. |
| 8,319,212 B2 | 11/2012 | Ibe et al. |
| 8,367,850 B2 | 2/2013 | Ma et al. |
| 8,580,402 B2 | 11/2013 | Lin et al. |
| 8,586,204 B2 | 11/2013 | Xia et al. |
| 8,652,652 B2 | 2/2014 | Brooks et al. |
| 2002/0093283 A1 | 7/2002 | Seo et al. |
| 2002/0101154 A1 | 8/2002 | Seo et al. |
| 2002/0121860 A1 | 9/2002 | Seo et al. |
| 2002/0139303 A1 | 10/2002 | Yamazaki et al. |
| 2004/0161192 A1 | 8/2004 | Hamano et al. |
| 2004/0183082 A1 * | 9/2004 | Yamazaki .......... 257/79 |
| 2005/0084712 A1 * | 4/2005 | Kido et al. .......... 428/690 |
| 2005/0116633 A1 | 6/2005 | Yamazaki et al. |
| 2005/0170208 A1 | 8/2005 | Yatsunami et al. |
| 2005/0221121 A1 * | 10/2005 | Ishihara et al. .......... 428/690 |
| 2005/0225234 A1 * | 10/2005 | Tyan et al. .......... 313/504 |
| 2006/0008672 A1 * | 1/2006 | Jarikov .......... 428/690 |
| 2006/0008740 A1 * | 1/2006 | Kido et al. .......... 430/296 |
| 2006/0046096 A1 | 3/2006 | Nomura et al. |
| 2006/0051563 A1 | 3/2006 | Okumoto et al. |
| 2006/0057427 A1 | 3/2006 | Tsukahara et al. |
| 2006/0118166 A1 | 6/2006 | Iwaki |
| 2006/0180812 A1 | 8/2006 | Sakata et al. |
| 2006/0228822 A1 | 10/2006 | Hayakawa et al. |
| 2006/0232203 A1 | 10/2006 | Noda |
| 2006/0243967 A1 | 11/2006 | Nomura et al. |
| 2006/0250076 A1 | 11/2006 | Hofmann et al. |
| 2006/0263638 A1 | 11/2006 | Kawakami et al. |
| 2006/0270066 A1 | 11/2006 | Imahayashi et al. |
| 2006/0284189 A1 | 12/2006 | Sakata et al. |
| 2006/0284204 A1 | 12/2006 | Yamazaki et al. |
| 2006/0292394 A1 | 12/2006 | Iwaki et al. |
| 2007/0000487 A1 | 1/2007 | Sakata |
| 2007/0001570 A1 | 1/2007 | Nomura et al. |
| 2007/0007516 A1 | 1/2007 | Seo et al. |
| 2007/0013301 A1 | 1/2007 | Yamazaki et al. |
| 2007/0029929 A1 | 2/2007 | Nakamura et al. |
| 2007/0085106 A1 | 4/2007 | Kawakami et al. |
| 2007/0116983 A1 * | 5/2007 | Kanno et al. .......... 428/690 |
| 2007/0150206 A1 * | 6/2007 | Iwaki et al. .......... 702/19 |
| 2007/0172699 A1 | 7/2007 | Nakashima et al. |
| 2007/0194306 A1 | 8/2007 | Yamazaki et al. |
| 2007/0200125 A1 | 8/2007 | Ikeda et al. |
| 2007/0210322 A1 | 9/2007 | Ohsawa et al. |
| 2008/0008905 A1 | 1/2008 | Yamazaki |
| 2008/0017853 A1 | 1/2008 | Egawa et al. |
| 2008/0203406 A1 | 8/2008 | He et al. |
| 2008/0231177 A1 * | 9/2008 | Nomura et al. .......... 313/504 |
| 2008/0246028 A1 | 10/2008 | Ikeda et al. |
| 2008/0258610 A1 * | 10/2008 | Ikeda et al. .......... 313/504 |
| 2008/0308794 A1 | 12/2008 | Ibe et al. |
| 2009/0001879 A1 | 1/2009 | Ikeda et al. |
| 2009/0001886 A1 | 1/2009 | Ibe et al. |
| 2009/0004506 A1 | 1/2009 | Nomura et al. |
| 2009/0102368 A1 | 4/2009 | Shitagaki et al. |
| 2009/0153034 A1 | 6/2009 | Lin et al. |
| 2009/0165854 A1 | 7/2009 | Yamazaki et al. |
| 2009/0200918 A1 | 8/2009 | Seo et al. |
| 2009/0236590 A1 | 9/2009 | Ohsawa |
| 2009/0278445 A1 | 11/2009 | Jen et al. |
| 2010/0059741 A1 | 3/2010 | Ohsawa et al. |
| 2010/0096617 A1 * | 4/2010 | Shanks .......... 257/13 |
| 2010/0096622 A1 | 4/2010 | Iizumi et al. |
| 2010/0123152 A1 | 5/2010 | Sugisawa et al. |
| 2011/0057171 A1 * | 3/2011 | Adamovich et al. .......... 257/40 |
| 2011/0204353 A1 | 8/2011 | Yamazaki |
| 2013/0175510 A1 | 7/2013 | Ma et al. |
| 2014/0008643 A1 | 1/2014 | Lin et al. |
| 2014/0042413 A1 | 2/2014 | Xia et al. |

FOREIGN PATENT DOCUMENTS

| | | |
|---|---|---|
| EP | 1 342 769 A1 | 9/2003 |
| EP | 1 524 706 A2 | 4/2005 |
| EP | 1 530 245 A2 | 5/2005 |
| EP | 1 713 136 A1 | 10/2006 |
| EP | 1 992 672 A1 | 11/2008 |
| EP | 2 117 063 A1 | 11/2009 |
| JP | 9-63771 | 3/1997 |
| JP | 11-307259 | 11/1999 |
| JP | 2001-297883 A | 10/2001 |
| JP | 2003-151776 A | 5/2003 |
| JP | 2004-522264 | 7/2004 |
| JP | 2005-2612 | 1/2005 |
| JP | 2005-190998 | 7/2005 |
| JP | 2005-228733 A | 8/2005 |
| JP | 2005-310741 A | 11/2005 |
| JP | 2006-279014 | 10/2006 |
| JP | 2006-295192 | 10/2006 |
| JP | 2007-227117 A | 9/2007 |
| JP | 2007-302630 A | 11/2007 |
| JP | 2008-509565 | 3/2008 |
| JP | 2008-204934 | 9/2008 |
| JP | 2009-021574 A | 1/2009 |
| JP | 2009-81447 | 4/2009 |
| JP | 2009-117823 | 5/2009 |
| JP | 2010-515255 | 5/2010 |
| TW | 200901530 A | 1/2009 |
| WO | WO 02/071813 A1 | 9/2002 |
| WO | WO 2006/100889 A1 | 9/2006 |
| WO | WO 2007/133633 A2 | 11/2007 |
| WO | WO 2008/102644 A1 | 8/2008 |
| WO | WO 2009/021107 A1 | 2/2009 |
| WO | WO 2009/021126 A2 | 2/2009 |
| WO | WO 2009/030981 A2 | 3/2009 |
| WO | WO 2009/051248 A1 | 4/2009 |
| WO | WO 2009/085344 A2 | 7/2009 |
| WO | WO 2009/086028 A2 | 7/2009 |

OTHER PUBLICATIONS

"Low-Drive-Voltage OLEDs with a Buffer Layer Having Molybdenum Oxide" to Ikeda et al., SID 06 Digest, Published 2006.*

Tsutsui, T. et al., "High Quantum Efficiency in Organic Light-Emitting Devices with Iridium-Complex as a Triplet Emissive Center", Jpn. J. Appl. Phys., vol. 38, Part 2, No. 12B, Dec. 15, 1999, pp. L1502-L1504.

Goldsmith, C.R. et al., "C-H Bond Activation by a Ferric Methoxide Complex: Modeling the Rate-Determining Step in the Mechanism of Lipoxygenase," J. Am. Chem. Soc., vol. 124, No. 1, 2002, pp. 83-96.

Onishi, T. et al, "A Method of Measuring and Energy Level, " *High Molecular EL Materials Development of Light-Emitting High Molecular Compounds*, Kyoritsu Shuppan, Dec. 25, 2004, p. 64-67 (with English translation, pp. 1-3).

International Search Report re application No. PCT/JP2010/058488, dated Jul. 6, 2010.

Written Opinion re application No. PCT/JP2010/058488, dated Jul. 6, 2010.

Chinese Office Action re Application No. CN 201080024607.3, dated Jan. 26, 2014.

* cited by examiner

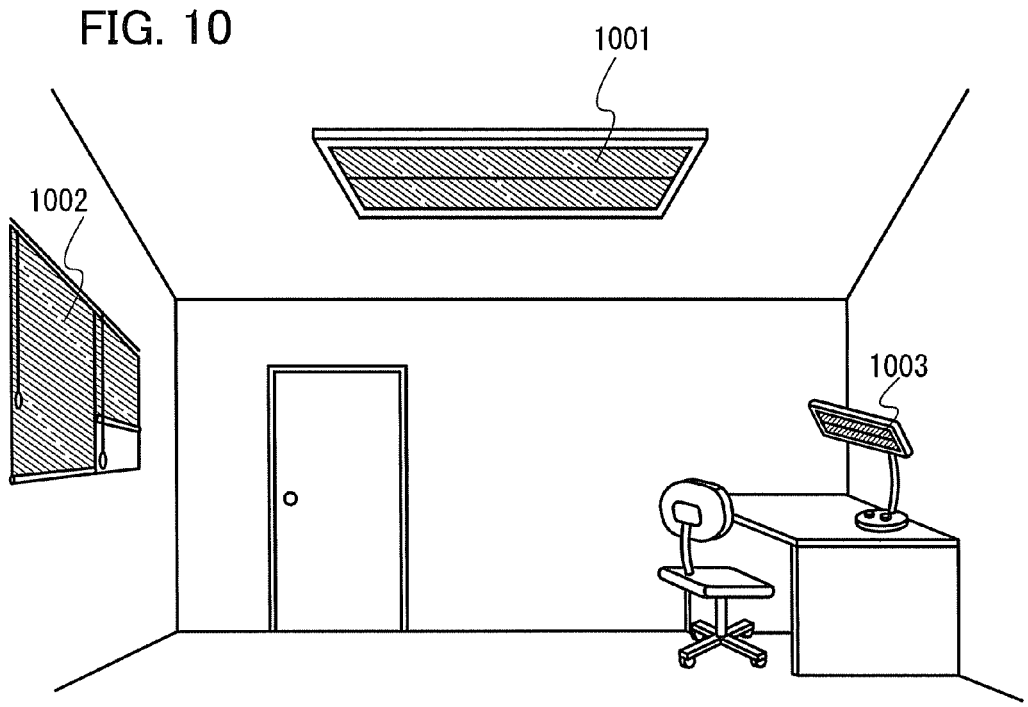

LIGHT-EMITTING ELEMENT, LIGHT-EMITTING DEVICE, LIGHTING DEVICE, AND ELECTRONIC APPLIANCE

TECHNICAL FIELD

The present invention relates to a current excitation type light-emitting element, and particularly to a light-emitting element in which a layer containing an organic compound is provided between electrodes. Further, the present invention relates to a light-emitting device including the light-emitting element, a lighting device and an electronic appliance in which the light-emitting device is used.

BACKGROUND ART

In recent years, research has been extensively conducted on light-emitting elements using electroluminescence (EL). In a basic structure of these light-emitting elements, a light-emitting substance is sandwiched between a pair of electrodes. By applying voltage to such a light-emitting element, light emission can be obtained from the light-emitting substance.

Since such a light-emitting element is a self-luminous type, there are advantages such as higher visibility of a pixel and no necessity of a backlight, compared to a liquid crystal display. Accordingly, such a light-emitting element is suitable for a flat panel display element. Another major advantage of such a light-emitting element is that it can be manufactured to be thin and lightweight. In addition, high response speed is also one of the features.

Furthermore, since such a light-emitting element can be formed into a film shape, plane light emission can be easily obtained. Therefore, a large-area element can be formed by utilizing the plane light emission. This is a feature that is hard to be obtained in point light sources typified by a filament lamp and an LED or linear light sources typified by a fluorescent light tube. Therefore, such a light-emitting element also has a high utility value as a plane light source that can be applied to a lighting device or the like.

Deterioration of a light-emitting element is one of the reasons why the above-described light-emitting element with many advantages and a light-emitting device including such a light-emitting element are limited to a partial practical use. A light-emitting element deteriorates such that the luminance is lowered in accordance with the accumulation of driving time even if the same amount of current is fed thereto. It is essential to obtain a light-emitting element whose degree of deterioration is acceptable for an actual product so that the light-emitting device can be widespread. A light-emitting element has been researched from many aspects such as aspects of a driver circuit, sealing, an element structure, and a material (for example, see Patent Document 1).

REFERENCE

Patent Document

[Patent Document 1]
Japanese Published Patent Application No. 2008-204934

DISCLOSURE OF INVENTION

It is an object of an embodiment of the present invention to achieve long lifetime of a light-emitting element. It is another object of an embodiment of the present invention to provide a lighting device or an electronic appliance in which a light-emitting element with long lifetime is used.

One embodiment of the present invention is a light-emitting element including, between an anode and a cathode, a hole-transport layer and a layer containing a light-emitting substance provided to be in contact with a cathode side surface of the hole-transport layer. The hole-transport layer contains a first organic compound and an anti-reduction substance, and the layer containing a light-emitting substance contains a second organic compound and a light-emitting substance. The layer containing a light-emitting substance has at least an electron-transport property.

In the above light-emitting element, the layer containing a light-emitting substance preferably has a bipolar property.

Another embodiment of the present invention is a light-emitting element including, between an anode and a cathode, a hole-transport layer and a layer containing a light-emitting substance provided to be in contact with a cathode side surface of the hole-transport layer. The layer containing a light-emitting substance contains a first light-emitting layer provided on an anode side and a second light-emitting layer provided to be in contact with a cathode side surface of the first light-emitting layer. The hole-transport layer contains a first organic compound and an anti-reduction substance. The first light-emitting layer contains a second organic compound as a host material and a light-emitting substance as a guest material. The second light-emitting layer contains a third organic compound as a host material and a light-emitting substance as a guest material. The layer containing a light-emitting substance has at least an electron-transport property and the light-emitting substance of the second light-emitting layer has a hole-trapping property.

In the above light-emitting element, the concentration of the light-emitting substance contained in the first light-emitting layer is preferably higher than the concentration of the light-emitting substance contained in the second light-emitting layer.

In the above light-emitting element, metal oxide is preferably contained as the anti-reduction substance, and the concentration of the metal oxide contained in the first organic compound is preferably greater than or equal to 67 wt % and less than 100 wt %, more preferably, greater than or equal to 80 wt % and less than 100 wt %.

In the above light-emitting element, it is preferable that the anode and the hole-transport layer be in contact with each other.

Another embodiment of the present invention is a light-emitting device including the light-emitting element having any of the above structures, or a lighting device or an electronic appliance including the light-emitting device.

Embodiments of the present invention described above achieve at least one of the above objects.

Note that a light-emitting device in this specification includes an image display device using a light-emitting element. Further, the category of the light-emitting device includes a module in which a light-emitting element is provided with a connector such as an anisotropic conductive film, TAB (tape automated bonding) tape, or a TCP (tape carrier package); a module in which the top of the TAB tape or the TCP is provided with a printed wiring board; and a module in which an IC (integrated circuit) is directly mounted on a light-emitting element by a COG (chip on glass) method.

Further, in this specification, the term "an organic compound having an electron-transport property" refers to an organic compound having at least an electron-transport property, and the electron-transport property is higher than a hole-transport property, and the term "an organic compound having a hole-transport property" refers to an organic compound having at least a hole-transport property, and the hole-transport property is higher than an electron-transport property.

By implementing an embodiment of the present invention, a light-emitting element with long lifetime can be obtained.

BRIEF DESCRIPTION OF DRAWINGS

In the accompanying drawings:

FIG. 10 is a diagram of an example illustrating a lighting device according to one embodiment of the present invention;

BEST MODE FOR CARRYING OUT THE INVENTION

Embodiments of the present invention will be described with reference to the accompanying drawings. It is easily understood by those skilled in the art that the present invention can be carried out with many different modes, modes and details of the present invention can be modified in various ways without departing from the spirit and the scope of the present invention. Therefore, the present invention is not interpreted as being limited to the following description of the embodiments and examples. Note that the description of "quantity", "amount", or "content" in this specification is based on mass, if not otherwise specified. Further, the term "anode" in this specification refers to an electrode that injects a hole to a layer containing a light-emitting substance, and the term "cathode" refers to an electrode that injects an electron to the layer containing a light-emitting substance.

(Embodiment 1)

Figure 1A:
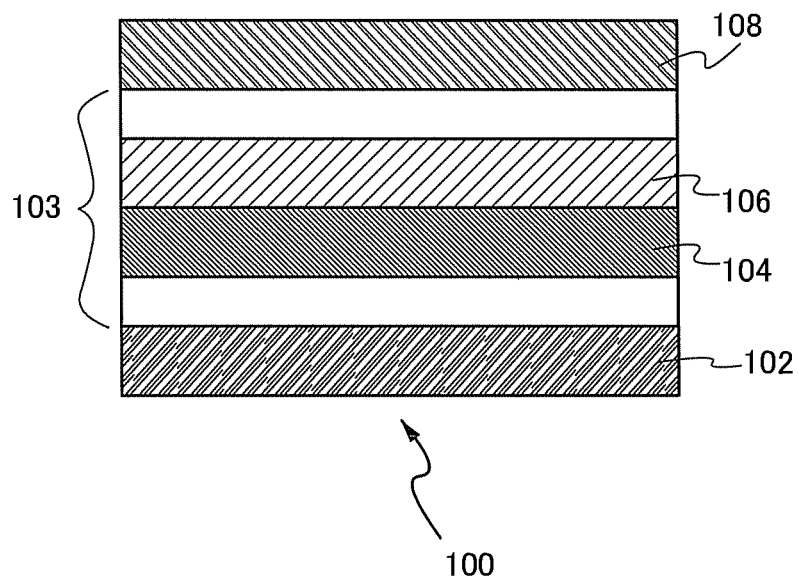
FIGS. 1A and 1B are schematic diagrams illustrating a light-emitting element according to one embodiment of the present invention.

FIG. 1A is a conceptual diagram of a light-emitting element 100 of this embodiment. The light-emitting element 100 of this embodiment includes an EL layer 103 including a plurality of layers between an anode 102 and a cathode 108. The EL layer 103 includes at least a hole-transport layer 104 and a layer 106 containing a light-emitting substance, which is provided to be in contact with the cathode side surface of the hole-transport layer 104.

The hole-transport layer 104 contains a first organic substance and an anti-reduction substance. The layer 106 containing a light-emitting substance contains a second organic compound and a light-emitting substance.

Figure 1B:
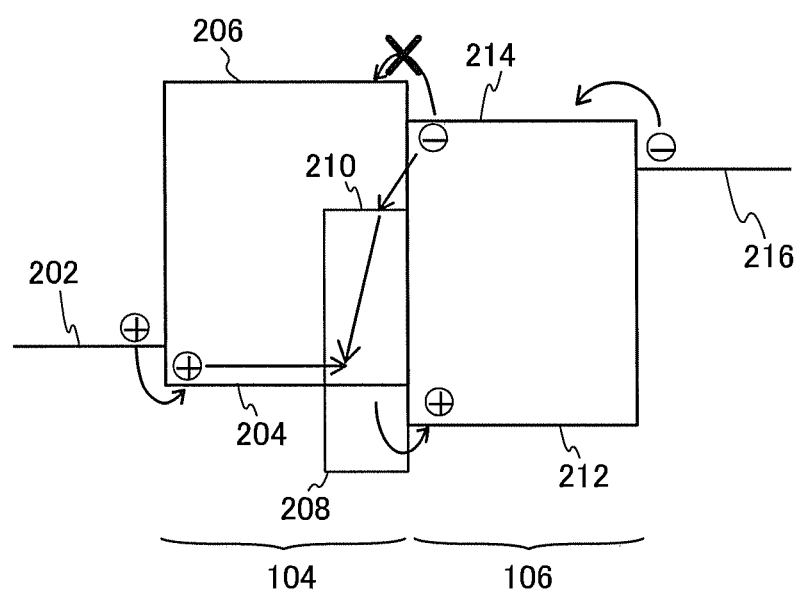

FIG. 1B is an example of a band diagram of the light-emitting element 100 described in this embodiment. In FIG. 1B, reference numeral 202 denotes the Fermi level of the anode 102; 204, the HOMO (highest occupied molecular orbital) level of the first organic compound contained in the hole-transport layer 104; 206, the LUMO (lowest unoccupied molecular orbital) level of the first organic compound; 208, the HOMO (or the donor) level of the anti-reduction substance contained in the hole-transport layer 104; 210, the LUMO (or the acceptor) level of the anti-reduction substance; 212, the HOMO level of the layer 106 containing a light-emitting substance; 214, the LUMO level of the layer 106 containing a light-emitting substance; and 216, the Fermi level of the cathode 108.

In FIG. 1B, a hole injected from the anode 102 is injected into the layer 106 containing a light-emitting substance through the hole-transport layer 104. On the other hand, an electron injected from the cathode 108 is injected into the layer 106 containing a light-emitting substance and recombined with a hole therein, whereby light is emitted.

In the case where the layer 106 containing a light-emitting substance has an electron-transport property, an electron injected from the cathode 108 into the layer 106 containing a light-emitting substance may transfer in the layer 106 containing a light-emitting substance and may reach the hole-transport layer 104. In the case of a conventional element structure where the hole-transport layer 104 does not contain an anti-reduction substance when an electron reaches the hole-transport layer 104, an organic compound contained in the hole-transport layer 104 is reduced, which leads to deterioration of the hole-transport layer. That is, when an electron passes through the layer containing a light-emitting substance and reaches the hole-transport layer without recombination, the electron causes deterioration of the light-emitting element 100, which leads to reduction in reliability.

However, in the light-emitting element 100 described in this embodiment, the hole-transport layer 104 which is in contact with the layer 106 containing a light-emitting substance contains an anti-reduction substance whose LUMO (or acceptor) level 210 is lower than the LUMO level 206 of the first organic compound. That is, the hole-transport layer 104 contains an anti-reduction substance which easily accepts an electron as compared with the first organic compound. Thus, even when an electron passes through the layer 106 containing a light-emitting substance and reaches the hole-transport layer 104, the anti-reduction substance accepts the electron; therefore, a hole passing through the hole-transport layer 104 and an electron in the LUMO level 210 of the anti-reduction substance can be recombined with each other without being into excited-state, and thermal deactivation can occur. This can prevent the first organic compound from being reduced; thus, deterioration of the hole-transport layer 104 can be suppressed. Accordingly, the light-emitting element 100 having high reliability along with long lifetime can be obtained.

Note that in the light-emitting element 100 described in this embodiment, deterioration of the hole-transport layer 104 due to an electron passing through the hole-transport layer 104 from the layer 106 containing a light-emitting substance can be suppressed by the anti-reduction substance. Accordingly, the layer 106 containing a light-emitting substance preferably has an electron-transport property. It is more preferable that the layer 106 containing a light-emitting substance have a bipolar property. When the layer 106 containing a light-emitting substance has a bipolar property, a light-emitting region is hardly localized at the interface between the layer 106 containing a light-emitting substance and the hole-transport layer 104; thus, a light-emitting element which shows preferable characteristics with small decline of the light-emitting efficiency can be manufactured.

Figure 2A:
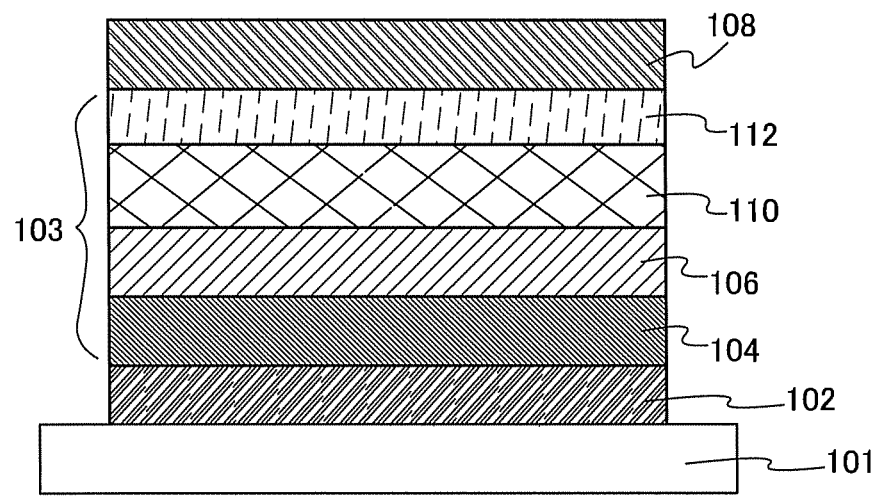
FIGS. 2A and 2B are each a diagram illustrating an example of an element structure of a light-emitting element according to one embodiment of the present invention.

Next, the light-emitting element described above will be described more specifically in accordance with a manufacturing method thereof, using FIGS. 2A and 2B. Note that an element structure and a manufacturing method described here are just examples, and other known structures, materials, and manufacturing methods can be applied without departing from the purpose of this embodiment.

First, the anode 102 is formed over a substrate 101. For the anode 102, a metal, an alloy, a conductive compound, a mixture thereof, or the like having a high work function (specifically, greater than or equal to 4.0 eV) is preferably used. Specifically, indium tin oxide (ITO), indium tin oxide containing silicon or silicon oxide, indium oxide containing zinc oxide (ZnO), indium oxide containing tungsten oxide and zinc oxide (IWZO), or the like are given. Such a conductive metal oxide film is usually formed by a sputtering method, but may also be formed by applying a sol-gel method or the like. For example, a film of indium oxide containing zinc oxide (ZnO) can be formed by a sputtering method using a target in which 1 wt % to 20 wt % zinc oxide is added to indium oxide. In addition, a film of indium oxide containing tungsten oxide and zinc oxide (IWZO) can be formed by a sputtering method using a target in which 0.5 wt % to 5 wt % tungsten oxide and 0.1 wt % to 1 wt % zinc oxide are contained in indium oxide. Moreover, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used.

Then, the EL layer 103 is formed. The EL layer 103 includes at least the hole-transport layer 104 and the layer 106 containing a light-emitting substance which is provided to be in contact with the cathode side surface of the hole-transport layer 104. The EL layer 103 may have a structure in which layers other than these layers are further stacked. The EL layer 103 can be formed using either a low molecular material or a high molecular material. Note that a material for forming the EL layer 103 is not limited to a material containing only an organic compound material, and may partially include an inorganic compound. In addition, other than the hole-transport layer 104 and the layer 106 containing a light-emitting substance, functional layers with various functions such as a hole-injection layer, a hole-blocking layer, an electron-transport layer, an electron-injection layer can be provided. In the EL layer 103, a layer having two or more functions of the above layers may be formed. Needless to say, a layer other than the above functional layers may also be provided. In this embodiment, as illustrated in FIG. 2A, a light-emitting element having a structure in which the hole-transport layer 104, the layer 106 containing a light-emitting substance, the electron-transport layer 110, and an electron-injection layer 112 are stacked in this order from the anode 102 side over the substrate 101 is described as an example of the EL layer 103.

The hole-transport layer 104 contains the first organic compound having a high hole-transport property and an anti-reduction substance. As a substance having a high hole-transport property used for the hole-transport layer 104, various compounds such as an aromatic amine compound, a carbazole derivative, aromatic hydrocarbon, and a high-molecular compound (such as an oligomer, a dendrimer, or a polymer) can be used. A substance having a hole mobility of greater than or equal to $10^{-6}$ cm$^2$/Vs is preferably used as a substance having a high hole-transport property. However, other materials can also be used, as long as they have a hole-transport property higher than an electron-transport property. The organic compound which can be used for the first organic compound is specifically described below.

Examples of the aromatic amine compound include 4,4'-bis[N-(1-naphthyl)-N-phenylamino]biphenyl (NPB or α-NPD), N,N'-bis(4-methylphenyl)-N,N'-diphenyl-p-phenylenediamine (DTDPPA), 4,4'-bis[N-(4-diphenylaminophenyl)-N-phenylamino]biphenyl (DPAB), 4,4'-bis(N-{4-[N'-(3-methylphenyl)-N'-phenylamino]phenyl}-N-phenyl) amino)biphenyl (DNTPD), and 1,3,5-tris[N-(4-diphenylaminophenyl)-N-phenylamino]benzene (DPA3B).

As the carbazole derivative, the following can be specifically used: 3-[N-(9-phenylcarbazol-3-yl)-N-phenylamino]-9-phenylcarbazole (PCzPCA1); 3,6-bis[N-(9-phenylcarbazol-3-yl)-N-phenylamino]-9-phenylcarbazole (PCzPCA2); 3-[N-(1-naphthyl)-N-(9-phenylcarbazol-3-yl)amino]-9-phenylcarbazole (PCzPCN1); 4,4'-di(N-carbazolyl)biphenyl (CBP); 1,3,5-tris[4-(N-carbazolyl)phenyl]benzene (TCPB); 9-[4-(10-phenyl-9-anthryl)phenyl]-9H-Carbazole (CzPA); 1,4-bis[4-(N-carbazolyl)phenyl]-2,3,5,6-tetraphenylbenzene; or the like.

Examples of the aromatic hydrocarbon include 2-tert-butyl-9,10-di(2-naphthyl)anthracene (t-BuDNA), 2-tert-butyl-9,10-di(1-naphthyl)anthracene, 9,10-bis(3,5-diphenylphenyl)anthracene (DPPA), 2-tert-butyl-9,10-bis(4-phenylphenyl)anthracene (t-BuDBA), 9,10-di(2-naphthyDanthracene (DNA), 9,10-diphenylanthracene (DPAnth), 2-tert-butylanthracene (t-BuAnth), 9,10-bis(4-methyl-1-naphthyl)anthracene (DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, and tetracene. Note that the aromatic hydrocarbon having a hole mobility of greater than or equal to $1\times10^{-6}$ $cm^2/Vs$ and 14 to 42 carbon atoms is more preferably used.

The aromatic hydrocarbon which can be used for the first organic compound may have a vinyl skeleton. As the aromatic hydrocarbon having a vinyl group, for example, 4,4'-bis(2,2-diphenylvinyl)biphenyl (DPVBi) and 9,10-bis[4-(2,2-diphenylvinyl)phenyl]anthracene (DPVPA) are given. Note that the hole-transport layer is preferably formed using a substance having a hole mobility of greater than or equal to $1\times10^{-6}$ $cm^2/Vs$, but any substance can be used as long as the substance has a hole-transport property higher than an electron-transport property. In addition, the structure of the hole-transport layer is not limited to a single-layer structure but also may be a stacked-layer structure including two or more layers made of substances which satisfy the above conditions. The hole-transport layer can be formed by a vacuum evaporation method or the like.

As the anti-reduction substance used in the hole-transport layer 104, a substance whose electron-accepting property is higher than that of the first organic compound used in the hole-transport layer can be used. For example, oxides of metals belonging to Groups 4 to 8 in the periodic table can be given. Specifically, vanadium oxide, niobium oxide, tantalum oxide, chromium oxide, molybdenum oxide, tungsten oxide, manganese oxide, rhenium oxide, or the like is a preferable material since the acceptor level is low and the electron-accepting property is especially high. In particular, molybdenum oxide is a preferable material because of its stability in the atmosphere, a low hygroscopic property, and easiness in handling.

Alternatively, as the anti-reduction substance, an organic compound can be employed. In the case of using an organic compound as the anti-reduction substance, the organic compound should have an electron-accepting property higher than that of the first organic compound. Therefore, when an organic compound is used as the anti-reduction substance, a substance whose LUMO level is deeper (the absolute value is larger) than that of the first organic compound is selected and used. Further, an organic compound whose HOMO level is almost or substantially equal to or deeper than that of the first organic compound is selected as the anti-reduction substance so as not to prevent holes from being transported in the hole-transport layer 104. Note that when an energy gap (or a triplet excitation energy) of an organic compound used as the anti-reduction substance is smaller than an energy gap of the light-emitting substance contained in the layer 106 containing a light-emitting substance, energy transfers from the light-emitting substance to the organic compound used as the anti-reduction substance, which causes a decrease in light-emitting efficiency or deterioration of color purity in some cases; thus, an organic compound whose energy gap (or a triplet excitation energy) is larger than the energy gap of the light-emitting substance is preferably selected as the anti-reduction substance.

Note that as the anti-reduction substance, metal oxide is preferably used because the cost thereof is lower than that of an organic compound and a molecular shape of the metal oxide does not change when the metal oxide accepts an electron, which can further improve lifetime of a light-emitting element. In addition, the use of metal oxide as the anti-reduction substance allows a material having a wide gap to be used as the first organic compound serving as a hole-transport material. Moreover, when the concentration of the metal oxide, which is used as the anti-reduction substance, contained in the first organic compound is set to be greater than or equal to 67 wt % and less than 100 wt %, preferably greater than or equal to 80 wt % and less than 100 wt %, the layer 106 containing a light-emitting substance can be formed by a wet method, whereby the layer 106 containing a light-emitting substance can be manufactured at low cost.

Metal oxide which can be used as the anti-reduction substance has an extremely high electron-accepting property. Therefore, when such metal oxide is contained in the hole-transport layer 104, even in the case where the hole-transport layer 104 is formed to be in contact with the anode 102, an injection barrier with respect to a hole is reduced, so that a hole can be injected efficiently into the layer 106 containing a light-emitting substance.

Note that a hole-injection layer containing a substance having a high hole-injection property may be provided between the hole-transport layer 104 and the anode 102. Examples of the substance having a high hole-injection property include metal oxide such as vanadium oxide, molybdenum oxide, ruthenium oxide, and aluminum oxide. Alternatively, in the case of using an organic compound, a porphyrin-based compound is effective, and phthalocyanine (abbreviation: $H_2Pc$), copper phthalocyanine (abbreviation: CuPc), or the like can be used. As the hole-transport layer 104, a high-molecular compound (such as oligomer, dendrimer, or polymer) can be used. For example, high molecular compounds, such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl) benzidine (abbreviation: Poly-TPD). In addition, high molecular compounds added with acid, such as poly(3,4- ethylenedioxythiophene)/poly(styrenesulfonic acid) (PEDOT/PSS) and polyaniline/poly(styrenesulfonic acid) (PAni/PSS) can also be used.

The layer 106 containing a light-emitting substance is formed to be in contact with the cathode 108 side of the hole-transport layer 104, and contains the second organic compound and the light-emitting substance. In this embodiment, an example in which the layer 106 containing a light-emitting substance has a single-layer structure is described. Note that the structure of the layer 106 containing a light-emitting substance is not limited to a single-layer structure, and may be a stacked-layer structure including two or more layers.

As a light-emitting substance contained in the layer 106 containing a light-emitting substance, any of fluorescent compounds described below can be used. For example, the following can be given: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl) triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl) phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N'N'',N''',N''''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedintrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis (4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij] quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis [2-(8-methoxy-1,1,7,7-tetramethyl-2,3,6,7-tetrahydro-1H,5H-benzo[in]quinolinzin-9-yl)ethenyl]-4H-pyran-4-ylidene}propanedinitrile (abbreviation: BisDCJTM).

As the light-emitting substance, phosphorescent compounds described below can also be used, for example, bis[2-(4',6'-difluorophenyl)pyridinato-N,C$^{2'}$]iridium(III)tetrakis (1-pyrazolyl)borate (abbreviation: FIr6), bis[2-(4',6'-difluorophenyl)pyridinato-N,C$^{2'}$]iridium(III)picolinate (abbreviation: FIrpic), bis[2-(3',5'-bistrifluoromethylphenyl) pyridinato-N,C$^{2'}$]iridium(III)picolinate (abbreviation: Ir(CF$_3$ppy)$_2$(pic)), bis[2-(4',6'-difluorophenyl)pyridinato-N, C$^{2'}$]iridium(III)acetylacetonate (abbreviation: FIracac), tris (2-phenylpyridinato)iridium(III) (abbreviation: Ir(ppy)$_3$), bis (2-phenylpyridinato)iridium(III)acetylacetonato (abbreviation: Ir(ppy)$_2$(acac)), bis(benzo[h]quinolinato)iridium(III)acetylacetonate (abbreviation: Ir(bzq)$_2$(acac)), bis (2,4-diphenyl-1,3-oxazolato-N,C$^{2'}$)iridium(III)acetylacetonate (abbreviation: Ir(dpo)$_2$(acac)), bis [2-4'-(perfluorophenylphenyl)pyridinato-N,C$^{2'}$]iridium(III) acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), bis[2-(2'-benzo[4,5-α]thienyl) pyridinato-N,C$^{3'}$]iridium(acetylacetonate) (abbreviation: Ir(btp)$_2$(acac)), bis(1-phenylisoquinolinato-N,C$^{2'}$)iridium (III)acetylacetonate (abbreviation: Ir(piq)$_2$(acac)), (acetylacetonato)bis[2,3-bis(4-fluorophenyl)quinoxalinato]iridium (III) (abbreviation: Ir(Fdpq)$_2$(acac)), (acetylacetonato)bis(2, 3,5-triphenylpyrazinato)iridium(III) (abbreviation: Ir(tppr)$_2$ (acac)), (2,3,7,8,12,13,17,18-octaethyl-21H,23H-porphine) platinum(II) (abbreviation: PtOEP), tris(acetylacetonato) (monophenanthroline)terbium (III) (abbreviation: Tb(acac)$_3$ (Phen), tris(1,3-diphenyl-1,3-propanedionato) (monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)).

Note that those light-emitting substances are preferably dispersed in the second organic compound serving as a host material. As the host material, an organic compound having an electron-transport property, preferably, an organic compound having both an electron-transport property and a hole-transport property (i.e., a bipolar property) is used.

Specific examples of the organic compound having an electron-transport property include the following: tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-hydroxyphenyl)benzoxazolato]zinc (abbreviation: Zn(BOX)$_2$), bis [2-(2-hydroxyphenyl)benzothiazolato]zinc(II) (abbreviation: Zn(BTZ)$_2$), 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 2,2',2''-(1,3,5-benzenetriyl)-tris(1-phenyl-1H-benzimidazole) (abbreviation: TPBI), bathophenanthroline (abbreviation: BPhen), bathocuproine (abbreviation: BCP), 9-[4-(5-phenyl-1,3,4-oxadiazol-2-yl) phenyl]-9H-carbazole (abbreviation: CO11), and 3-(4-biphenylyl)-4-phenyl-5-(4-tert-butylphenyl)-1,2,4-triazole (abbreviation: TAZ).

As the host material of the layer 106 containing a light-emitting substance, an organic compound having a bipolar property is preferably used. In this specification, an organic compound having a bipolar property refers to a substance which is capable of transporting both carriers of an electron and a hole, and in which chemical change hardly occurs due to the transport of these carriers. Examples of the organic compound having a bipolar property include 2,3-bis(4-diphenylaminophenyl)quinoxaline (abbreviation: TPAQn), 2,3-bis{4-[N-(1-naphthyl)-N-phenylamino]phenyl}-dibenzo[f,h]quinoxaline (abbreviation: NPADiBzQn), and 4,4'-bis(9-carbazolyl)biphenyl. Alternatively, anthracene derivatives such as 2-tert-butyl-9,10-di(2-naphthyl)anthracene (abbreviation: t-BuDNA), 9,10-di(2-naphthyl)anthracene (abbreviation: DNA), 9-[4-(10-phenyl-9-anthryl)phenyl]-9H-Carbazole (abbreviation: CzPA) 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,9'-bianthryl (abbreviation: BANT), 9-[4-(9-phenylcarbazol-3-yl)]phenyl-10-phenylanthracene (abbreviation: PCzPA), 9-[4-(3-phenyl-9H-carbazol-9-yl)phenyl]-10-phenylanthracene (abbreviation: CzPAP), 9,10-bis[4-(9-phenylcarbazol-3-yl)]phenyl-2-t-butylanthracene (abbreviation: PCzBPA), 3-(9,9-dimethylfluoren-2-yl)-9-[4-(10-phenyl-9-anthryl)phenyl]-9H-carbazole (abbreviation: CzPAFL), 9-{4-[3-(1-naphthyl)-9H-carbazol-9-yl]phenyl}-10-phenylanthracene (abbreviation: mCzPA) CzPAαN), and 9-[3-(10-phenyl-9-anthryl)phenyl]-9H-carbazole (abbreviation: mCzPA) or polycyclic condensed ring derivatives such as 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3) can be used. In the case of using an organic compound having a bipolar property, which is stable even when oxidation and reduction are repeated, as a host material of the layer 106 containing a light-emitting substance, the layer 106 containing a light-emitting substance hardly deteriorates even when light emission by recombination of an electron and a hole is repeated. Accordingly, a light-emitting element having a longer lifetime can be obtained.

Note that the layer 106 containing a light-emitting substance may further contain another substance in addition to the second organic compound and the light-emitting substance.

In the case where metal oxide is used as the anti-reduction substance contained in the hole-transport layer 104 as described above, the concentration of the metal oxide contained in the first organic compound is set to be 67 wt % or more, preferably 80 wt % or more, so that resistance property of the hole-transport layer 104 to solvent is increased; thus, the layer 106 containing a light-emitting substance can be formed by a wet method. Note that when the hole-transport layer 104 has a single-layer structure of metal oxide, since it is difficult to make the thickness of the hole-transport layer 104 large, the concentration of the metal oxide contained in the first organic compound is preferably less than 100 wt %.

Film formation by a wet method is performed in such a manner that a composition including the light-emitting substance, the host material, and solvent is applied. The composition may contain other organic materials. The composition may further contain a binder which improves quality of a film when the composition is formed into the film. For the binder, use of a high molecular compound that is electrically inactive is preferably used. Specifically, polymethylmethacrylate (abbreviation: PMMA), polyimide, or the like can be used.

As a method for forming a film of the composition, any of the following methods can be employed: a spin coating method, a roll coating method, a spray method, a casting method, a dipping method, a droplet discharge (jet) method (an inkjet method), a dispensing method, a variety of printing methods (a method by which a film is formed in a desired pattern, such as screen printing (mimeographing), offset (planographic) printing, letterpress printing, or gravure (intaglio) printing), and the like. Note that the film of the composition can be formed by another method as long as a film can be formed using a liquid composition. In this specification, a film formed by a wet method is extremely thin in some cases depending on its formation conditions, and the film does not necessarily maintain the form of a film; for example, it may include a discontinuous island structure or the like.

In the case of forming the layer 106 containing a light-emitting substance by a wet method, the film formation can be performed under an atmospheric pressure, and facilities necessary for a vacuum apparatus and the like can be reduced. In addition, since a vacuum apparatus does not have to be used, the size of a substrate that is to be processed is not restricted by the size of a vacuum chamber and the substrate can be therefore increased in size. From the aspect of process temperature, heat treatment is necessary only at temperatures of such a degree that the solvent in the composition is removed. Therefore, even substrates and materials which would be decomposed or changed in quality or shape through high-temperature heat treatment can be used.

Furthermore, since a liquid composition having fluidity is used for the film formation, mixture of materials is easy. In addition, good coverage with respect to a region where the film is formed can also be achieved.

A thin film can be formed as selected by a droplet discharging method by which a composition can be discharged in a desired pattern, a printing method by which a composition can be transferred in a desired pattern or a desired pattern can be drawn with the composition, or the like. Therefore, less material is wasted, so that a material can be used efficiently; accordingly, a production cost can be reduced. Furthermore, these methods do not require processing of the shape of the thin film through a photolithography process and therefore simplify the process and improve the productivity.

The electron-transport layer contains a substance having a high electron-transport property. As the substance having a high electron-transport property, for example, a metal complex having a quinoline skeleton or a benzoquinoline skeleton, such as Alq (abbreviation), Almq$_3$ (abbreviation), BeBq$_2$ (abbreviation), or BAlq (abbreviation) can be used. In addition to the above, a metal complex having an oxazole-based or thiazole-based ligand, such as Zn(BOX)$_2$ (abbreviation) or Zn(BTZ)$_2$ (abbreviation) can also be used. Moreover, in addition to the metal complexes, PBD (abbreviation), OXD-7 (abbreviation), CO11 (abbreviation), TAZ (abbreviation), BPhen (abbreviation), BCP (abbreviation), or the like can be used. The substances mentioned here mainly have an electron mobility of $10^{-6}$ cm$^2$/Vs or higher. Note that a substance other than the above-mentioned substances may be used as long as it has an electron-transport property higher than a hole-transport property. The structure of the electron-transport layer is not limited to a single-layer structure and may be a stacked-layer structure including two or more layers formed of the above substances.

In addition to the above substances, a high molecular compound such as PF-Py (abbreviation) or PF-BPy (abbreviation) can be used for the electron-transport layer.

The electron-injection layer contains a substance having a high electron-injection property. As the substance having a high electron-injection property, the following can be employed: an alkali metal or an alkaline earth metal, such as lithium fluoride (LiF), cesium fluoride (CsF), and calcium fluoride (CaF$_2$), or a compound thereof. Alternatively, a layer containing a substance having an electron-transport property and an alkali metal, an alkaline earth metal, or a compound thereof (e.g., Alq containing magnesium (Mg)) can be used. Such a structure can increase the injection efficiency of electrons from the cathode 108.

Note that by change of materials of the anode 102 and the cathode 108, the light-emitting element of this embodiment can have variations. When the anode 102 has a light-transmitting property, light is emitted from the anode 102 side, whereas when the anode 102 has a light-shielding property (reflectivity, in particular) and the cathode 108 has a light-transmitting property, light is emitted from the cathode 108 side. Furthermore, when both the anode 102 and the cathode 108 have a light-transmitting property, light can be emitted from both the anode side and the cathode side.

For the substrate 101 having an insulating surface, which is used as a support of a light-emitting element, for example, glass, plastic, or metal can be used. Note that a material other than these materials may be used as long as it can function as a support of a light-emitting element. In the case where light emitted from the light-emitting element is extracted to the outside through the substrate, the substrate preferably has a light-transmitting property.

Figure 2B:
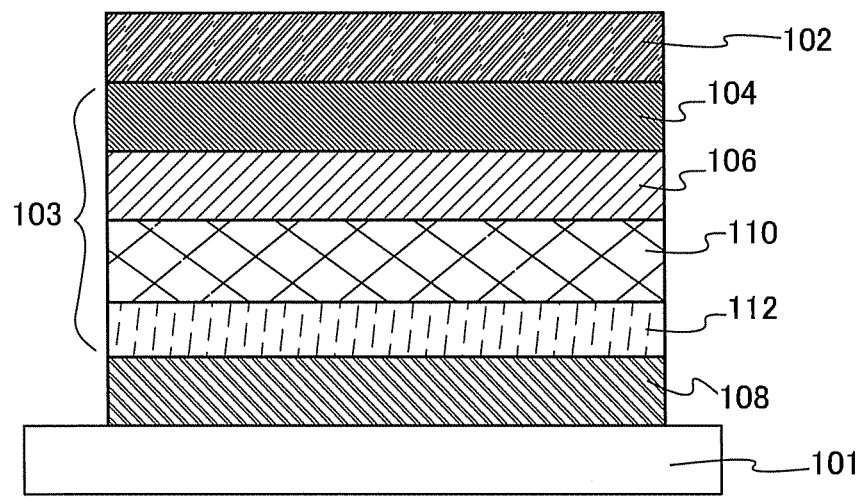

Note that as illustrated in FIG. 2B, a structure in which over the substrate 101 used for a support of the light-emitting element, the cathode 108, the EL layer 103, and the anode 102 are stacked in this order may be employed. In this case, the EL layer has a structure, for example, in which the electron-injection layer 112, the electron-transport layer 110, the layer 106 containing a light-emitting substance, and the hole-transport layer 104 are stacked over the cathode 108 in this order.

In the light-emitting element according to this embodiment as described above, long lifetime can be achieved.

Further, when the layer 106 containing a light-emitting substance has a bipolar property, a light-emitting element with high efficiency can be formed.

In the case where metal oxide is used for the anti-reduction substance contained in the hole-transport layer 104, the concentration of the metal oxide contained in the first organic compound is set to be greater than or equal to 67 wt % and less than 100 wt %, preferably greater than or equal to 80 wt % and less than 100 wt % so that the layer 106 containing a light-emitting substance can be formed by a wet method. When a thin film is formed by a wet method using the composition dissolved in a solvent, the thin film has a favorable film quality without defects and the like. Therefore, a light-emitting element (device) having high reliability can be manufactured by using such a thin film. Further, since a wet method is employed for manufacture of a thin film and a light-emitting element, high efficiency of using a material and a reduction in expensive facilities such as a large vacuum apparatus can be achieved, resulting in low cost and high productivity. Thus, according to this embodiment, highly reliable light-emitting devices, lighting devices, and electronic appliances can be manufactured at low cost with improved productivity.

(Embodiment 2)

In this embodiment, an example of the light-emitting element having the basic structure described in Embodiment 1 will be described with reference to FIGS. 3A and 3B. Specifically, in the light-emitting element described in Embodiment 1, the case of employing a stacked structure of a first light-emitting layer 106a and a second light-emitting layer 106b as the layer 106 containing a light-emitting substance will be described.

Figure 3A:
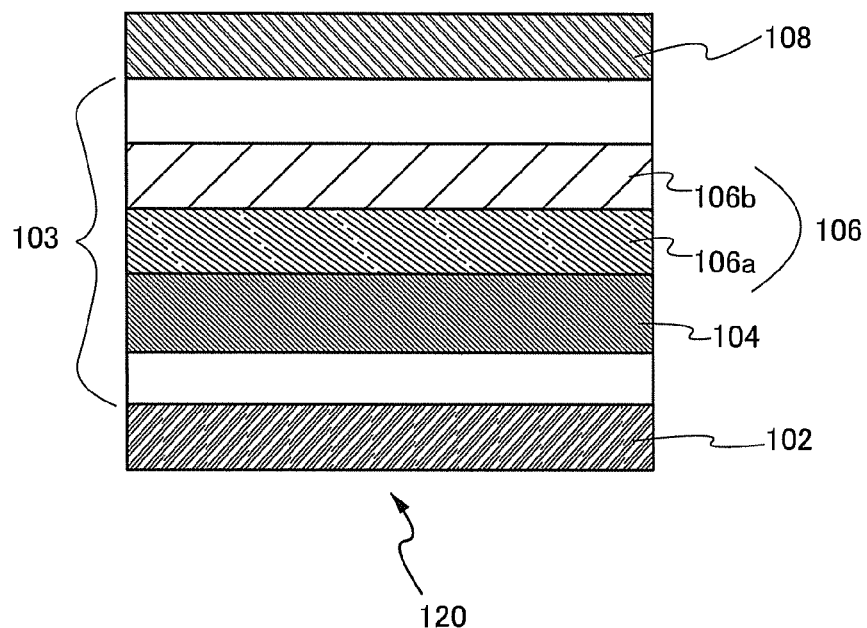
FIGS. 3A and 3B are schematic diagrams illustrating a light-emitting element according to one embodiment of the present invention.

In a light-emitting element 120 described in this embodiment, the EL layer 103 is sandwiched between a pair of the electrodes (the anode 102 and the cathode 108), and the EL layer 103 includes at least the hole-transport layer 104 and the layer 106 containing a light-emitting substance which is provided to be in contact with the cathode side surface of the hole-transport layer 104, as illustrated in FIG. 3A. The layer 106 containing a light-emitting substance includes the first light-emitting layer 106a and the second light-emitting layer 106b that is in contact with the cathode side surface of the first light-emitting layer 106a.

In the light-emitting element 120 described in this embodiment, the hole-transport layer 104 includes the first organic compound having a hole-transport property and the anti-reduction substance. The anode 102, the cathode 108, and the hole-transport layer 104 can be formed using materials similar to those described in Embodiment 1.

The first light-emitting layer 106a contains a light-emitting substance serving as a light emission center and the second organic compound serving as a host material in which the light-emitting substance is dispersed. The second light-emitting layer 106b contains a light-emitting substance serving as a light emission center and a third organic compound serving as a host material in which the light-emitting substance is dispersed. In order that the layer 106 containing a light-emitting substance has at least an electron-transport property, as each of the second and third organic compounds, an organic compound having an electron-transport property is preferably used. A light-emitting substance used for the first light-emitting layer 106a is the same as that used for the second light-emitting layer 106b. Further, the light-emitting substance has a hole-trapping property in the second light-emitting layer 106b.

The first light-emitting layer 106a and the second light-emitting layer 106b serve as a layer emitting light in the light-emitting element 120. Note that the proportion of the light-emitting substance in the first light-emitting layer 106a or the second light-emitting layer 106b is preferably greater than or equal to 0.1 wt % and less than 50 wt %.

Figure 3B:
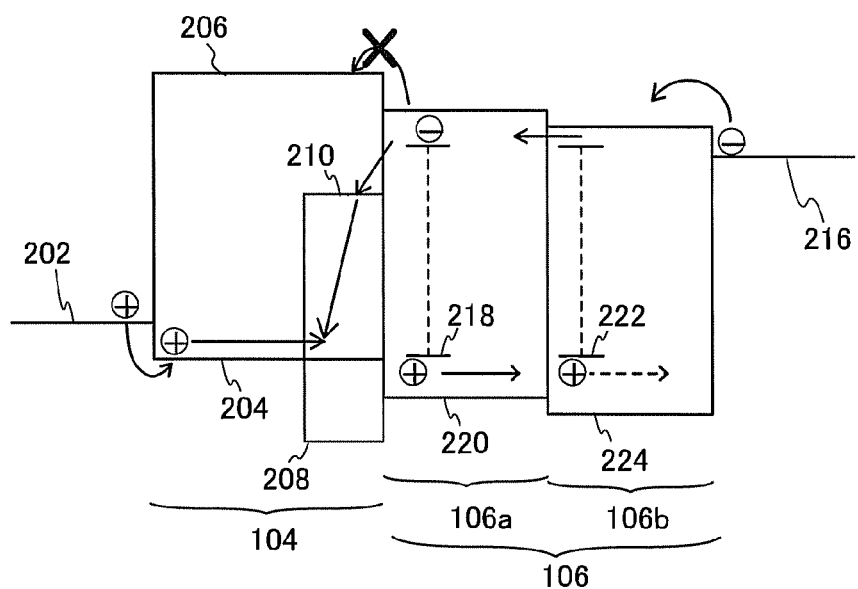

FIG. 3B is an example of a band diagram of the light-emitting element 120 described in this embodiment. In FIG. 3B, reference numeral 202 denotes the Fermi level of the anode 102; 204, the HOMO level of the first organic compound contained in the hole-transport layer 104; 206, the LUMO level of the first organic compound; 208, the HOMO (or the donor) level of the anti-reduction substance contained in the hole-transport layer 104; 210, the LUMO (or the accepter) level of the anti-reduction substance; 218, the HOMO level of the light-emitting substance contained in the first light-emitting layer 106a; 220, the HOMO level of the second organic compound contained in the first light-emitting layer 106a; 224, the HOMO level of the third organic compound contained in the second light-emitting layer 106b; 222, the HOMO level of the light-emitting substance contained in the second light-emitting layer 106b; and 216, the Fermi level of the cathode 108.

In FIG. 3B, an electron injected from the cathode 108 is injected into the second light-emitting layer 106b. On the other hand, a hole injected from the anode 102 is injected into the first light-emitting layer 106a through the hole-transport layer 104, and then transported into the second light-emitting layer 106b through the HOMO level 218 of the light-emitting substance. The movement of the hole injected into the second light-emitting layer 106b is retarded by the light-emitting substance having a hole-trapping property, so that the hole recombines with an electron in the vicinity of an interface between the first light-emitting layer 106a and the second light-emitting layer 106b; thus, light is emitted.

In the light-emitting element 120 described in this embodiment, since a substance used for the first light-emitting layer 106a is the same as that used for the second light-emitting layer 106b, the HOMO level 218 and the HOMO level 222 are equal to each other, so that a hole that is a carrier can be easily transported between the first light-emitting substance and the second light-emitting substance.

A material whose HOMO level is substantially the same as the HOMO level 218 of the light-emitting substance or a material having the HOMO level 220 that is deeper than the HOMO level 218 of the light-emitting substance can be used for the second organic compound that is a host material of the first light-emitting layer 106a. A material having the HOMO level 224 that is deeper than the HOMO level 222 of the light-emitting substance is used for the third organic compound that is a host material of the second light-emitting layer 106b. This structure makes a hole to be trapped by the light-emitting substance in the second light-emitting layer 106b; thus, a hole can be prevented from passing from the second light-emitting layer 106b to the cathode side. Note that the difference between absolute values of the HOMO level 224 of the third organic compound and the HOMO level 222 of the light-emitting substance needs to be at least greater than 0.2 eV, preferably, greater than 0.3 eV.

Figure 4:
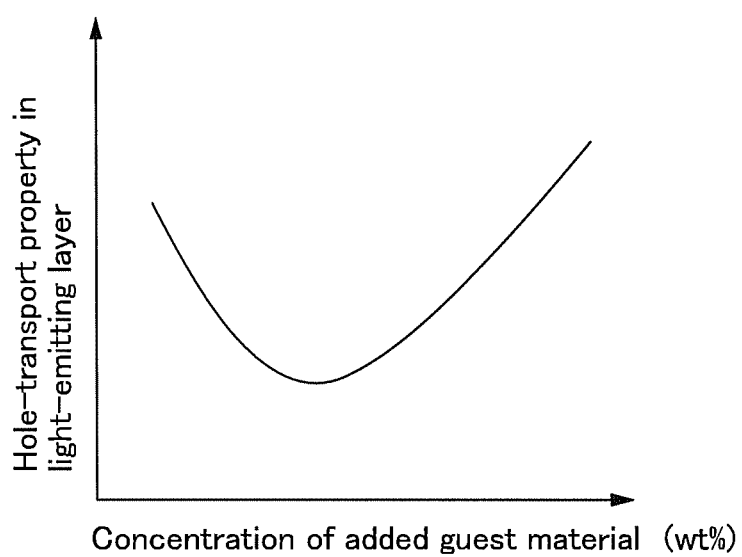
FIG. 4 is a conceptual diagram of relations between a hole-transport property and the concentration of an added guest material in a layer to which the guest material is added.

FIG. 4 is a conceptual diagram of relations between the concentration of an added guest material and a hole-transport property in a light-emitting layer to which the guest material having a HOMO level shallower (the absolute value is smaller) than that of the host material is added. As illustrated in FIG. 4, when a guest material is added at a high concentration, the HOMO level of the guest material serves as a path for transporting a hole, whereby a hole is transported in the light-emitting layer.

In the light-emitting element 120 described in this embodiment, the light-emitting substance contained in the second light-emitting layer 106b has a hole-trapping property. The concentration of the light-emitting substance contained in the first light-emitting layer is preferably higher than that of the light-emitting substance contained in the second light-emitting layer in order to speedily transport a hole to the second light-emitting layer 106b. Although the concentration of the light-emitting substance having a hole-trapping property varies depending on the kind of substance, it is preferable that the concentration of the light-emitting substance contained in the second light-emitting layer 106b be substantially greater than or equal to 5 wt % and less than or equal to 10 wt %. The concentration of the light-emitting substance contained in the first light-emitting layer 106a is preferably a concentration at which the light-emitting substance makes a path for transporting a hole and the hole-trapping property is lowered. That is, it is preferable that the concentration of the light-emitting substance contained in the first light-emitting layer 106a be substantially greater than 10 wt %.

As a method for measuring the highest occupied molecular orbital level (the HOMO level) and the lowest unoccupied molecular orbital level (the LUMO level), there is a calculation method using cyclic voltammetry (CV) measurement. Alternatively, the ionization potential of a thin film is measured with a photoelectron spectrometer and the HOMO level can be calculated. Further, the LUMO level can be calculated from the result of the above calculation and an energy gap obtained from an absorption spectrum of the thin film.

However, in the light-emitting element 120 described in this embodiment, which is similar to the light-emitting element 100 described in Embodiment 1, the hole-transport layer 104 which is in contact with the layer 106 containing a light-emitting substance contains an anti-reduction substance whose LUMO (or acceptor) level 210 is lower than the LUMO level 206 of the first organic compound. That is, the hole-transport layer 104 contains an anti-reduction substance which easily accepts an electron as compared with the first organic compound. Thus, even when an electron passes through the layer 106 containing a light-emitting substance and reaches the hole-transport layer 104, the anti-reduction substance accepts the electron; therefore, a hole passing through the hole-transport layer 104 and an electron in the LUMO level 210 of the anti-reduction substance can be recombined with each other without being into excited-state, and thermal deactivation can occur. This can prevent the first organic compound from being reduced; thus, deterioration of the hole-transport layer 104 can be suppressed. Accordingly, the light-emitting element 100 having high reliability along with long lifetime can be obtained.

In the light-emitting element 120 described in this embodiment, the first light-emitting layer 106a contains the light-emitting substance at high concentration, so that a hole is transported to the second light-emitting layer 106b through the HOMO level of the light-emitting substance, and the hole is trapped by the light-emitting substance having a hole-trapping property in the second light-emitting layer 106b. Therefore, a light-emitting region can be controlled in the vicinity of the interface between the first light-emitting layer 106a and the second light-emitting layer 106b, that is, inside the layer 106 containing a light-emitting substance, whereby a light-emitting element which shows preferable characteristics with small decline of the light-emitting efficiency can be manufactured.

In this embodiment, as the second organic compound used for the first light-emitting layer 106a and the third organic compound used for the second light-emitting layer 106b, the organic compound having an electron-transport property or the organic compound having a bipolar property, which are described as the host material for the layer 106 containing a light-emitting substance in Embodiment 1, can be used as appropriate. In addition, as the light-emitting substance, any of the light-emitting substances described in Embodiment 1 can be used as appropriate. Note that in order that the light-emitting substance has a hole-trapping property in the second light-emitting layer 106b, a material whose HOMO level is deeper than that of the light-emitting substance by 0.3 eV or more is preferably used as the third organic compound.

As a preferable substance used for the host material into which the light-emitting substance is dispersed, a condensed polycyclic material such as a condensed polycyclic aromatic compound typified by an anthracene derivative is given. Such a material has a large band gap; thus, excitation energy is difficult to transfer from a light-emitting substance and a decline in the light-emitting efficiency or deterioration of color purity is not easily caused. Further, the condensed polycyclic material is preferably used since concentration quenching is difficult to occur even when the light-emitting substance is added at high concentration. Moreover, such a condensed polycyclic material has either an electron-transport property or a hole-transport property depending on its substituent, and can be applied to light-emitting elements with various structures. However, since a condensed polycyclic material having a high hole-transport property is also capable of transporting an electron to some extent, effects of deterioration due to an electron passing through the first light-emitting layer 106a and the second light-emitting layer 106b are increased depending on conditions in some cases. In such a case, the deterioration can be effectively suppressed by employing the structure of the light-emitting element 120 of this embodiment in which the anti-reduction substance contained in the hole-transport layer 104 recombines with an electron which passes through the first light-emitting layer 106a and the second light-emitting layer 106b to the hole-transport layer 104. Note that as the condensed polycyclic material, which is used as a host material, tricyclic, tetracyclic, pentacyclic, and hexacyclic condensed aromatic compounds, such as anthracene, phenanthrene, pyrene, naphthacene, chrysene, triphenylene, perylene, dibenzochrysene are especially useful.

According to the light-emitting element of this embodiment as described above, high efficiency and long lifetime can be achieved. Although the case of employing a two-layer structure of the first light-emitting layer 106a and the second light-emitting layer 106b as the layer 106 containing a light-emitting substance is described here, the layer 106 containing a light-emitting substance may have a stacked structure of three or more light-emitting layers. Note that in the case of employing the stacked structure of three or more light-emitting layers, it is preferable that the concentrations of the light-emitting substance in the light-emitting layers be adjusted to descend from the anode 102 side toward the cathode 108 side.

In the case where metal oxide is used for the anti-reduction substance contained in the hole-transport layer 104, the concentration of the metal oxide contained in the first organic compound is set to be greater than or equal to 67 wt % and less than 100 wt %, preferably greater than or equal to 80 wt % and less than 100 wt % so that the layer 106 containing a light-emitting substance can be formed by a wet method. When a thin film is formed by a wet method using the composition dissolved in a solvent, the thin film has a favorable film quality without defects and the like. Therefore, a light-emitting element (device) having high reliability can be manufactured by using such a thin film. Further, since a wet method is employed for manufacture of a thin film and a light-emitting element, high efficiency of using a material and a reduction in expensive facilities such as a large vacuum apparatus can be achieved, resulting in low cost and high productivity. Thus, according to this embodiment, highly reliable light-emitting devices and electronic appliances can be manufactured at low cost with improved productivity.

Note that this embodiment can be freely combined with any of the other embodiments.

(Embodiment 3)

In this embodiment, an embodiment of a light-emitting element having a structure in which a plurality of EL layers is stacked (hereinafter referred to as a stacked element) will be described with reference to FIGS. 5A and 5B. This light-emitting element is a stacked light-emitting element having a plurality of EL layers between a first electrode and a second electrode. A structure of each of the EL layers can be the same as or similar to the structure described in Embodiment 1 or Embodiment 2. That is, the light-emitting element described in Embodiment 1 or Embodiment 2 includes one EL layer, whereas a light-emitting element having a plurality of EL layers will be described in this embodiment.

Figure 5A:
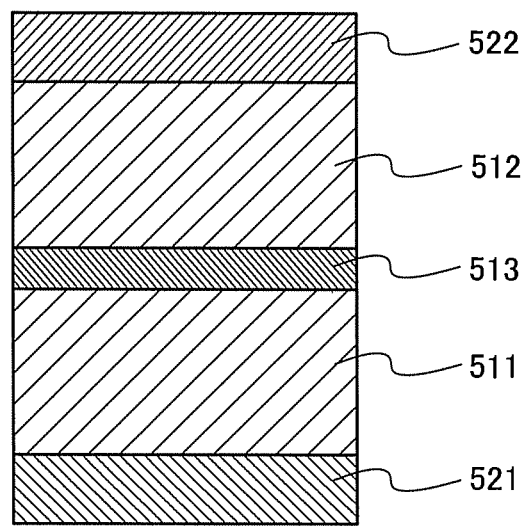
FIGS. 5A and 5B are each a diagram illustrating an example of an element structure of a light-emitting element according to one embodiment of the present invention.
Figure 5B:
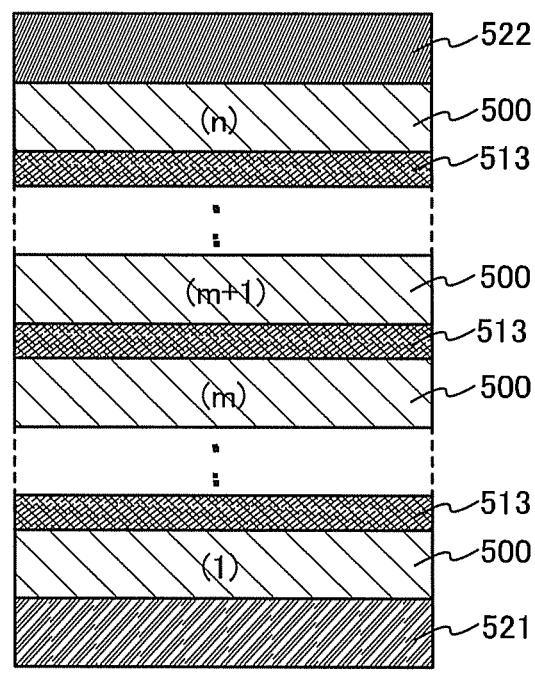

In FIG. 5A, a first EL layer 511 and a second EL layer 512 are stacked between a first electrode 521 and a second electrode 522. One of the first electrode 521 and the second electrode 522 serves as an anode and the other serves as a cathode. The materials of the anode and the cathode described in Embodiment 1 can be used as the materials of the first electrode 521 and the second electrode 522. In addition, structures of the first EL layer 511 and the second EL layer 512 may be the same or different from each other and can be the same as or similar to the structure described in Embodiment 1 or Embodiment 2.

A charge-generation layer 513 injects an electron into one of the EL layers and injects a hole into the other of the EL layers when voltage is applied to the first electrode 521 and the second electrode 522, and may be a single layer or a stacked structure of a plurality of layers. When the stacked structure is employed, it is preferable that a layer configured to inject a hole and a layer configured to inject an electron be staked.

As the layer configured to inject a hole, a semiconductor or an insulator, such as molybdenum oxide, vanadium oxide, rhenium oxide, or ruthenium oxide, can be used. Alternatively, the layer configured to inject a hole may have a structure in which an acceptor substance is added to a substance having a high hole-transport property. A layer including a substance having a high hole-transport property and an acceptor substance includes, as an acceptor substance, 7,7,8,8-tetracyano-2,3,5,6-tetrafluoroquinodimethane (abbreviation: $F_4$-TCNQ) or metal oxide such as vanadium oxide, molybdenum oxide, or tungsten oxide. As the substance having a high hole-transport property, various compounds such as an aromatic amine compound, a carbazole derivative, an aromatic hydrocarbon, a high-molecular compound, oligomer, dendrimer, or polymer can be used. Note that a substance having a hole mobility of $10^{-6}$ cm$^2$/Vs or higher is preferably employed as the substance having a high hole-transport property. Note that other substance than the above materials may be used as long as it has a hole-transport property higher than an electron-transport property. Since a composite material of a substance having a high hole-transport property and an acceptor substance has an excellent carrier-injection property and an excellent carrier-transport property, low-voltage driving and low-current driving can be achieved.

As the layer configured to inject an electron, a semiconductor or an insulator, such as lithium oxide, lithium fluoride, or cesium carbonate, can be used. Alternatively, the layer configured to inject an electron may be formed by adding a donor substance to a substance having a high electron-transport property. As the donor substance, an alkali metal, an alkaline-earth metal, a rare-earth metal, a metal that belongs to Group 13 of the periodic table, or an oxide or carbonate thereof can be used. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may also be used as the donor substance. As the substance having a high electron-transport property, the materials described in Embodiment 1 can be used. Note that a substance having an electron mobility of $10^{-6}$ cm$^2$/Vs or higher is preferably employed as the substance having a high electron-transport property. Note that any other substance may also be used as long as it is a substance in which the electron-transport property is higher than the hole-transport property. Since a composite material of the substance having a high electron-transport property and the donor substance has an excellent carrier-injection property and an excellent carrier-transport property, low-voltage driving and low-current driving can be achieved.

Alternatively, the charge-generation layer 513 may be formed with a combination of a layer including a substance having a high hole-transport property and metal oxide with a transparent conductive film. It is preferable that the charge-generation layer have a high light-transmitting property in view of light extraction efficiency.

In any case, the charge-generation layer 513 sandwiched between the first EL layer 511 and the second EL layer 512 may have any structure as long as an electron is injected into one of the first EL layer 511 and the second EL layer 512 and a hole is injected into the other thereof when voltage is applied to the first electrode 521 and the second electrode 522. For example, any structure is acceptable for the charge-generation layer 513 as long as it injects an electron into the first EL layer 511 and a hole into the second EL layer 512 when voltage is applied so that potential of the first electrode is higher than that of the second electrode.

In FIG. 5A, the light-emitting element having two EL layers is described. Similarly, the present invention can be applied to a light-emitting element in which three or more EL layers are stacked. For example, as in FIG. 5B, a structure in which n (n is a natural number of two or more) EL layers 500 are staked between a pair of electrodes can be employed. In such a case, the charge-generation layer 513 is sandwiched between m-th (m is a natural number, 1≤m≤n−1) EL layer and (m+1)-th EL layer.

As in the case of the light-emitting element described in this embodiment, by arranging a plurality of EL layers to be partitioned from each other with charge-generation layers between a pair of electrodes, light emission in a high luminance region can be achieved with current density kept low. The current density can be kept low, so that a light-emitting element having long lifetime can be realized.

Further, by forming EL layers to emit light of different colors from each other, a light-emitting element as a whole can provide light emission of a desired color. For example, by forming a light-emitting element having two EL layers such that the emission color of the first EL layer and the emission color of the second EL layer are complementary colors, the light-emitting element can provide white light emission as a whole. Note that the word "complementary" means color relationship in which an achromatic color is obtained when colors are mixed. That is, white light emission can be obtained by mixture of light obtained from substances whose emission colors are complementary colors. Further, the same can be applied to a light-emitting element having three EL layers. For example, the light-emitting element as a whole can provide white light emission when the emission color of the first EL layer is red, the emission color of the second EL layer is green, and the emission color of the third EL layer is blue.

Note that this embodiment can be combined with any of the other embodiments as appropriate.

(Embodiment 4)

In this embodiment, as examples of a light-emitting device which is manufactured with the use of the light-emitting element described in the above embodiments, a passive matrix light-emitting device and an active matrix light-emitting device will be described.

FIGS. 6A to 6D and FIG. 7 illustrate an example of a passive matrix light-emitting device.

In a passive-matrix (also referred to as "simple-matrix") light-emitting device, a plurality of anodes arranged in stripes (in stripe form) are provided to be orthogonal to a plurality of cathodes arranged in stripes, and a light-emitting layer is interposed at each intersection. Therefore, a pixel at an intersection of an anode selected (to which voltage is applied) and a cathode selected emits light.

Figure 6A:
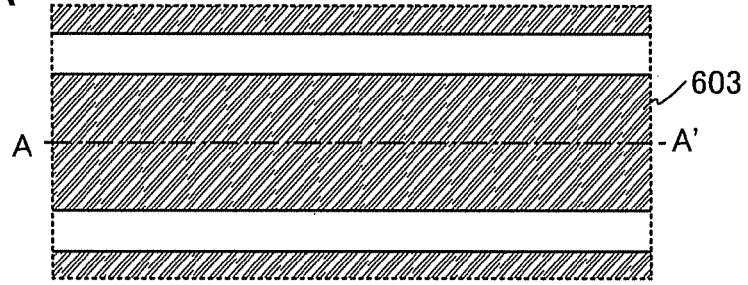
FIGS. 6A to 6D are diagrams of an example illustrating a light-emitting device according to one embodiment of the present invention.
Figure 6B:
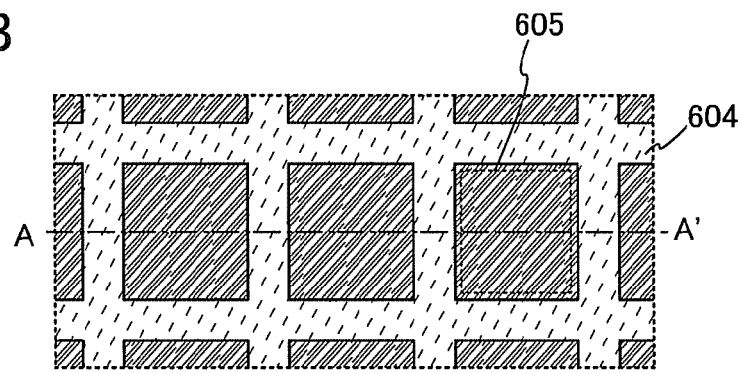
Figure 6C:
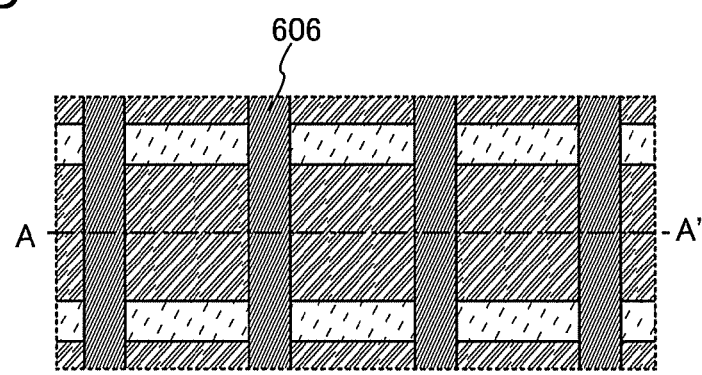
Figure 6D:
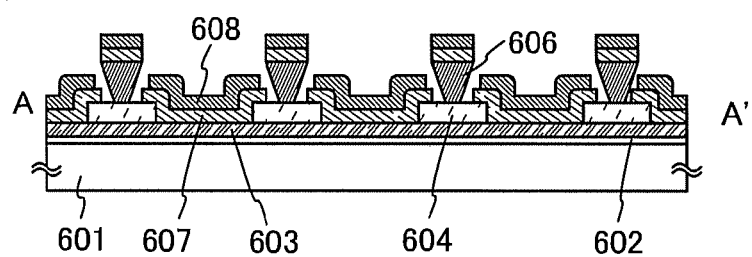

FIGS. 6A to 6C are top views of a pixel portion before sealing, and FIG. 6D is a cross-sectional view taken along chain line A-A' in FIGS. 6A to 6C.

Over a substrate 601, an insulating layer 602 is formed as a base insulating layer. Note that the insulating layer 602 is not necessarily formed if the base insulating layer is not needed. Over the insulating layer 602, a plurality of first electrodes 603 are arranged in stripes with equal spacing therebetween (FIG. 6A). Note that the first electrode 603 corresponds to the anode 102 in Embodiment 1 and Embodiment 2.

A partition wall 604 having openings each corresponding to a pixel is provided over the first electrodes 603. The partition wall 604 having openings is formed using an insulating material (a photosensitive or nonphotosensitive organic material (polyimide, acrylic, polyamide, polyimide amide, resist, or benzocyclobutene) or an SOG film (such as a silicon oxide film containing an alkyl group)). Note that an opening 605 corresponding to each pixel acts as a light-emitting region (FIG. 6B).

Over the partition wall 604 having openings, a plurality of mutually parallel inversely tapered partition walls 606 are provided to intersect with the first electrodes 603 (FIG. 6C). The inversely tapered partition walls 606 are formed by a photolithography method using a positive-type photosensitive resin by which a portion unexposed to light remains as a pattern, and the amount of light exposure or the length of development time is adjusted so that a lower portion of the pattern is etched more.

After the inversely tapered partition walls 606 are formed as illustrated in FIG. 6C, EL layers 607 and second electrodes 608 are sequentially formed as illustrated in FIG. 6D. The EL layer 607 in this embodiment corresponds to the EL layer 103 in Embodiment 1 and Embodiment 2 and includes at least a hole-transport layer and a layer containing a light-emitting substance adjoining the hole-transport layer. In addition, the second electrode 608 corresponds to the cathode 108 in Embodiment 1 and Embodiment 2. The height obtained by adding the height of the partition wall 604 having openings and the height of the inversely tapered partition wall 606 is larger than the sum of the thicknesses of the EL layer 607 and the second electrode 608. Therefore, as illustrated in FIG. 6D, the EL layers 607 and the second electrodes 608 which are separated into a plurality of regions are formed. Note that the plurality of separated regions is electrically isolated from one another.

The second electrodes 608 are electrodes in stripes which are parallel to each other and extend in a direction intersecting with the first electrodes 603. Note that a part of the EL layers 607 and a part of conductive layers forming the second electrodes 608 are formed over the inversely tapered partition walls 606; however, they are separated from the EL layers 607 and the second electrodes 608.

In addition, a sealing member such as a sealing can or a glass substrate may be attached to the substrate 601 with adhesive such as a sealant so that the light-emitting element can be placed in a sealed space, if necessary. In this manner, the light-emitting element can be prevented from deteriorating. The sealed space may be filled with filler or a dry inert gas. In addition, a desiccant or the like may be put between the substrate and the sealing member so that deterioration of the light-emitting element due to moisture or the like can be prevented. The desiccant removes a minute amount of moisture, thereby achieving sufficient desiccation. The desiccant can be a substance which absorbs moisture by chemical adsorption such as an oxide of an alkaline earth metal typified by calcium oxide or barium oxide. Note that a substance which adsorbs moisture by physical adsorption such as zeolite or silica gel may be used as well.

Figure 7:
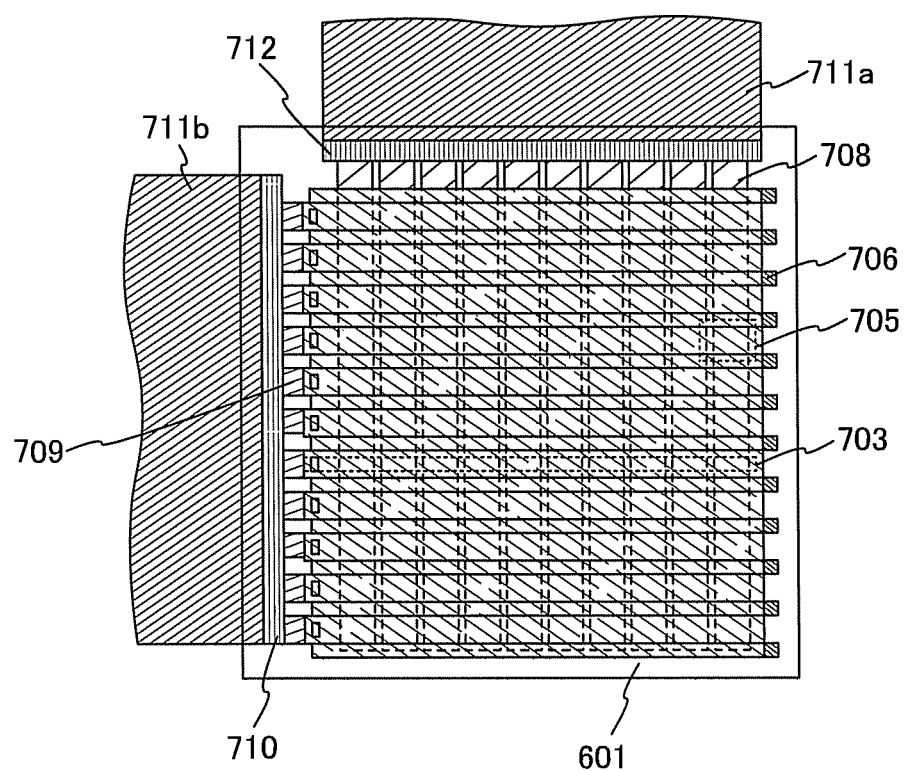
FIG. 7 is a diagram of an example illustrating a light-emitting device according to one embodiment of the present invention.

FIG. 7 is a top view in the case where the passive-matrix light-emitting device illustrated in FIGS. 6A to 6D is provided with an FPC (a flexible printed circuit) or the like.

As illustrated in FIG. 7, in a pixel portion forming an image display, scanning lines and data lines intersect with each other so that they are orthogonal to each other.

The first electrodes 603 in FIGS. 6A to 6D correspond to scanning lines 703 in FIG. 7; the second electrodes 608 in FIGS. 6A to 6D correspond to data lines 708 in FIG. 7; and the inversely tapered partition walls 606 correspond to partition walls 706. The EL layers 607 illustrated in FIG. 6D are interposed between the data lines 708 and the scanning lines 703, and an intersection indicated by a region 705 corresponds to one pixel.

Note that the scanning lines 703 are electrically connected at their ends to connection wirings 709, and the connection wirings 709 are connected to an FPC 711*b* via all input terminal 710. The data lines 708 are connected to an FPC 711*a* via an input terminal 712.

If necessary, a polarizing plate, a circularly polarizing plate (including an elliptically polarizing plate), a retardation plate (a quarter-wave plate or a half-wave plate), or an optical film such as a color filter may be appropriately provided over a light-emitting surface. Further, the polarizing plate or the circularly polarizing plate may be provided with an anti-reflection film. For example, anti-glare treatment may be carried out by which reflected light can be diffused by projections and depressions on the surface so as to reduce the reflection.

Although FIG. 7 illustrates the example in which a driver circuit is not provided over the substrate, an IC chip including a driver circuit may be mounted on the substrate.

When the IC chip is mounted, a data line side IC and a scanning line side IC, in each of which the driver circuit for transmitting a signal to a pixel portion is formed, are mounted on the periphery of (outside) the pixel portion by a COG method. The mounting may be performed using TCP or a wire bonding method other than the COG method. TCP is TAB tape mounted with an IC, and the TAB tape is connected to a wiring over an element formation substrate and the IC is mounted. Each of the data line side IC and the scanning line side IC may be formed using a silicon substrate or may be formed by formation of a driver circuit using a TFT over a glass substrate, a quartz substrate, or a plastic substrate.

Figure 8A:
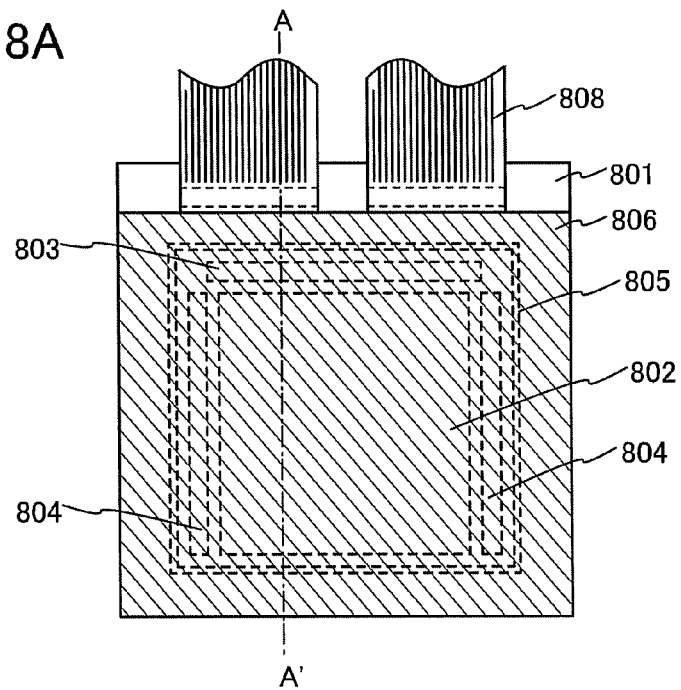
FIGS. 8A and 8B are diagrams illustrating an example of a light-emitting device according to one embodiment of the present invention.
Figure 8B:
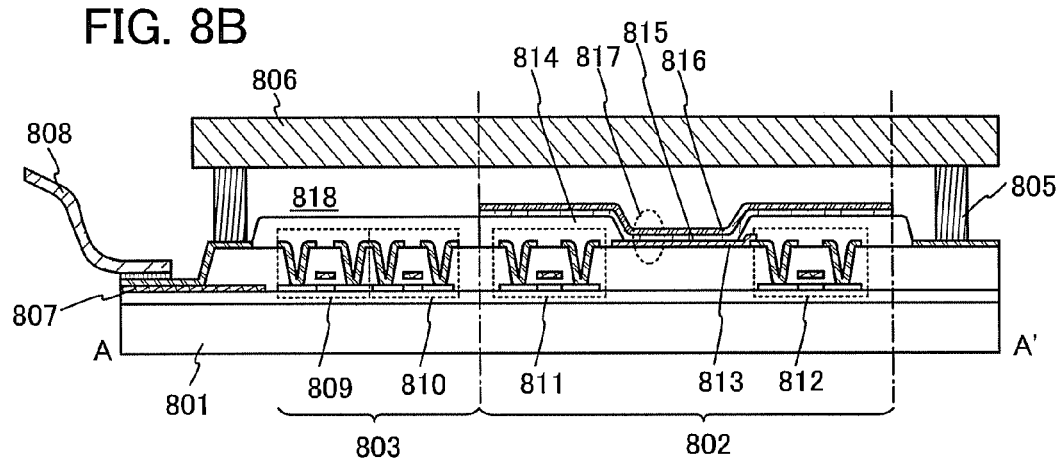

Next, an example of an active-matrix light-emitting device will be described with reference to FIGS. 8A and 8B. Note that FIG. 8A is a top view illustrating a light-emitting device and FIG. 8B is a cross-sectional view taken along chain line A-A' in FIG. 8A. The active-matrix light-emitting device of this embodiment includes, over an element substrate 801, a pixel portion 802, a driver circuit portion (a source side driver circuit) 803, and a driver circuit portion (a gate side driver circuit) 804. The pixel portion 802, the driver circuit portion 803, and the driver circuit portion 804 are sealed with a sealant 805 between the element substrate 801 and a sealing substrate 806.

In addition, over the element substrate 801, a lead wiring 807 for connecting an external input terminal, through which a signal (e.g., a video signal, a clock signal, a start signal, a reset signal, or the like) or electric potential from the outside is transmitted to the driver circuit portion 803 and the driver circuit portion 804, is provided. Here, an example is described in which a FPC 808 is provided as the external input terminal. Although only the FPC is illustrated here, this FPC may have a printed wiring board (PWB) attached. The light-emitting device in this specification includes not only a light-emitting device itself but also a state in which an FPC or a PWB is attached thereto.

Next, a cross-sectional structure will be described with reference to FIG. 8B. Although the driver circuit portions and the pixel portion are formed over the element substrate 801. The pixel portion 802 and the driver circuit portion 803 which is the source side driver circuit are illustrated.

An example is illustrated in which a CMOS circuit which is a combination of an n-channel TFT 809 and a p-channel TFT 810 is formed as the driver circuit portion 803. Note that a circuit included in the driver circuit portion may be formed using various CMOS circuits, PMOS circuits, or NMOS circuits. Although a driver integrated type in which the driver circuit is formed over the substrate is described in this embodiment, the driver circuit is not necessarily formed over the substrate, and the driver circuit can be formed outside, not over the substrate.

Further, the pixel portion 802 has a plurality of pixels, each including a switching TFT 811, a current control TFT 812, and an anode 813 electrically connected to a wiring (a source electrode or a drain electrode) of the current control TFT 812. An insulator 814 is formed so as to cover an edge portion of the anode 813. In this embodiment, the insulator 814 is formed using a positive photosensitive acrylic resin.

In addition, in order to obtain favorable coverage by a film which is to be stacked over the insulator 814, the insulator 814 is preferably formed so as to have a curved surface with curvature at an upper edge portion or a lower edge portion. For example, in the case of using a positive photosensitive acrylic resin as a material for the insulator 814, the insulator 814 is preferably formed so as to have a curved surface with a curvature radius (0.2 µm to 3 µm) at the upper edge portion. Either a negative photosensitive material which becomes insoluble in an etchant by light or a positive photosensitive material which becomes soluble in an etchant by light can be used for the insulator 814. As the insulator 814, without limitation to an organic compound, an inorganic compound such as silicon oxide or silicon oxynitride can be used.

An EL layer 815 and a cathode 816 are stacked over the anode 813. Note that when an ITO film is used as the anode 813, and a stacked film of a titanium nitride film and a film containing aluminum as its main component or a stacked film of a titanium nitride film, a film containing aluminum as its main component, and a titanium nitride film is used as a wiring of the current control TFT 812 which is connected to the anode 813, resistance of the wiring can be low and favorable ohmic contact with the ITO film can be obtained. Note that, although not illustrated, the cathode 816 is electrically connected to the FPC 808 which is an external input terminal.

The light-emitting element includes the anode 813, the EL layer 815, and the cathode 816 as described above. The specific structures and materials of the light-emitting element have been described in Embodiments 1 to 3, so that the repeated description is omitted. Note that the anode 813, the EL layer 815, and the cathode 816 in FIGS. 8A and 8B correspond to the anode 102, the EL layer 103, and the cathode 108 in Embodiment 1 or Embodiment 2, respectively.

In addition, although the cross-sectional view of FIG. 8B illustrates only one light-emitting element 817, a plurality of light-emitting elements are arranged in matrix in the pixel portion 802. Light-emitting elements that emit light of three kinds of colors (R, G, and B) are formed in the pixel portion 802, whereby a light-emitting device capable of full color display can be obtained. Alternatively, a light-emitting device which is capable of full color display may be manufactured by a combination with color filters.

By attachment of the sealing substrate 806 to the element substrate 801 with the sealant 805, a structure in which the light-emitting element 817 is provided in a space 818 surrounded by the element substrate 801, the sealing substrate 806, and the sealant 805 is obtained. Note that the space 818 may be filled with an inert gas (such as nitrogen and argon) or the sealant 805.

It is preferable to use an epoxy-based resin for the sealant 805. In addition, preferably, the material does not transmit moisture or oxygen as much as possible. As the sealing substrate 806, a plastic substrate formed of FRP (fiberglassreinforced plastics), PVF (polyvinyl fluoride), polyester, acrylic, or the like can be used besides a glass substrate or a quartz substrate.

As described above, an active-matrix light-emitting device can be obtained.

Note that the structure described in this embodiment can be combined with any of the structures described in other embodiments as appropriate.

(Embodiment 5)

In this embodiment, various electronic appliances and lighting devices, each of which is completed using the light-emitting device described in the above embodiment, will be described with reference to FIGS. 9A to 9E.

As the electronic appliances described in this embodiment, for example, there are a television set (also called TV or a television receiver), a monitor for a computer or the like, a digital camera, a digital video camera, a digital photo frame, a mobile phone set (also called a mobile phone or a portable telephone device), a portable game machine, a portable information terminal, an audio playback device, a large game machine such as a pachinko machine, and the like. Specific examples of these electronic appliances and lighting devices are illustrated in FIGS. 9A to 9E.

Figure 9A:
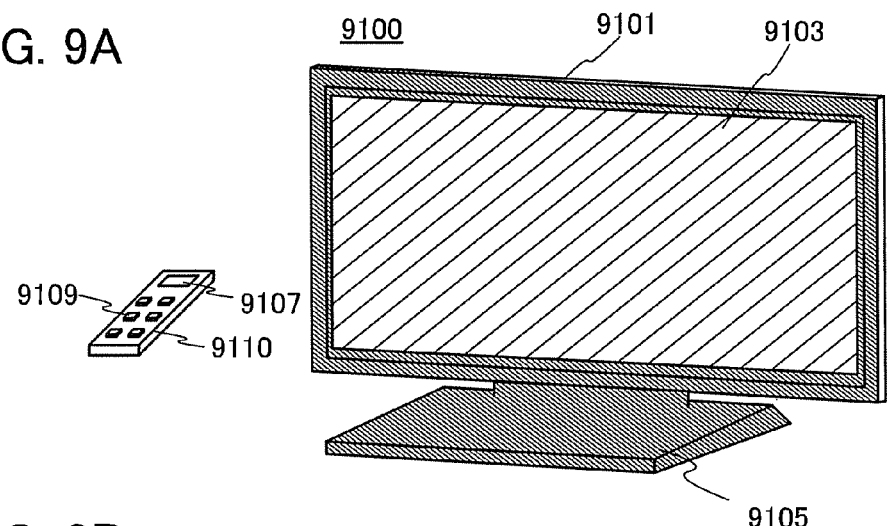
FIGS. 9A to 9E are each a diagram illustrating an example of an electronic appliance according to one embodiment of the present invention.

FIG. 9A illustrates an example of a television set 9100. A display portion 9103 is incorporated in a housing 9101 of the television set 9100. Images can be displayed in the display portion 9103, for which the light-emitting device described in the above embodiment can be used. Further, the housing 9101 is supported by a stand 9105 here.

The television set 9100 can be operated by an operation switch provided on the housing 9101 or a separate remote controller 9110. The channel and volume can be controlled with operation keys 9109 provided on the remote controller 9110 and the images displayed in the display portion 9103 can be controlled. Furthermore, the remote controller 9110 may be provided with a display portion 9107 for displaying data output from the remote controller 9110.

Note that the television set 9100 is provided with a receiver, a modem, and the like. With the receiver, a general television broadcast can be received. Furthermore, when the television set 9100 is connected to a communication network by wired or wireless connection via the modem, one-way (from a transmitter to a receiver) or two-way (between a transmitter and a receiver, between receivers, or the like) data communication can be performed.

Since the light-emitting device formed in accordance with the above embodiments has long lifetime, a television set with long lifetime can be provided by using the light-emitting device for the display portion 9103. Further, since the light-emitting device exhibits high chromaticity, by using the light-emitting device for the display portion 9103 of the television set, an image with improved quality can be displayed.

Figure 9B:
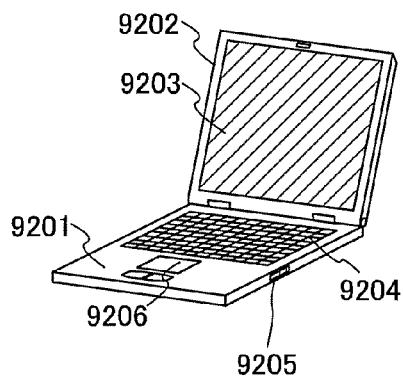

FIG. 9B is a computer including a main body 9201, a housing 9202, a display portion 9203, a keyboard 9204, an external connection port 9205, a pointing device 9206, and the like. Note that the computer is manufactured using the light-emitting device which is formed in accordance with the above embodiments for the display portion 9203.

Since the light-emitting device formed in accordance with the above embodiments has long lifetime, a computer with long lifetime can be provided by using the light-emitting device for the display portion 9203 of the computer. Further, since the light-emitting device exhibits high chromaticity, by using the light-emitting device for the display portion 9203 of the computer, an image with improved quality can be displayed.

Figure 9C:
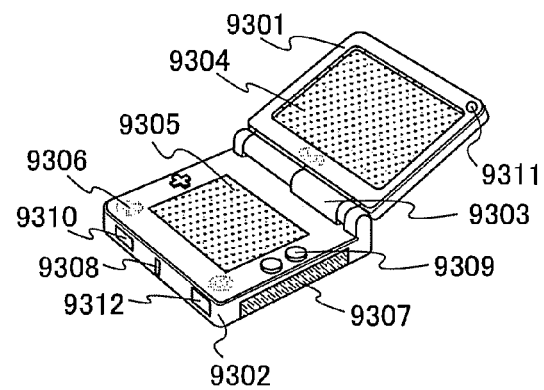

FIG. 9C illustrates a portable amusement machine including two housings: a housing 9301 and a housing 9302. The housing 9301 and 9302 are connected with a connection portion 9303 so as to be opened and closed. A display portion 9304 is incorporated in the housing 9301 and a display portion 9305 is incorporated in the housing 9302. In addition, the portable amusement machine illustrated in FIG. 9C includes an input means such as an operation key 9309, a connection terminal 9310, a sensor 9311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9312. The portable amusement machine may also be provided with a speaker portion 9306, a recording medium insertion portion 9307, an LED lamp 9308, and the like. Needless to say, the structure of the portable amusement machine is not limited to the above and it is acceptable as long as the light-emitting device formed in according with the above embodiments is used at least for one or both of the display portion 9304 and the display portion 9305. The portable amusement machine may also include other accessories as appropriate.

The portable amusement machine illustrated in FIG. 9C has a function of reading a program or data stored in a recording medium to display it in the display portion, and a function of sharing information with another portable amusement machine by wireless communication. Note that the functions of the portable amusement machine illustrated in FIG. 9C are not limited to these functions, and the portable amusement machine can have various functions.

Since the light-emitting device formed in accordance with the above embodiments has long lifetime, a portable amusement machine with long lifetime can be provided by using the light-emitting device for the display portions 9304 and 9305 of the portable amusement machine. Further, since the light-emitting device exhibits high chromaticity, by using the light-emitting device for the display portions 9304 and 9305 of the portable amusement machine, an image with improved quality can be displayed.

Figure 9D:
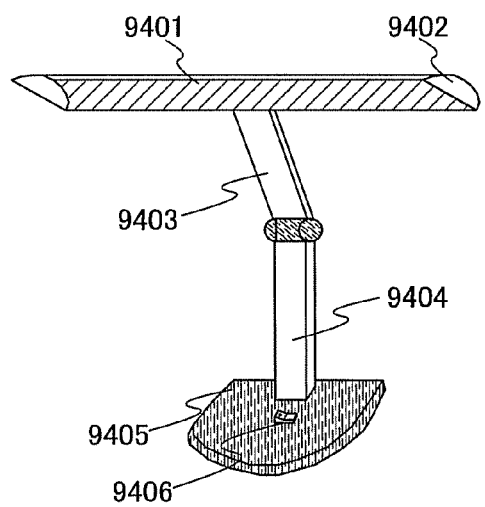

FIG. 9D illustrates a desk lamp including a lighting portion 9401, a shade 9402, an adjustable arm 9403, a support 9404, a base 9405, and a power source switch 9406. The desk lamp is manufactured using the light-emitting device which is formed in accordance with the above embodiments for the lighting portion 9401. Note that the lighting device includes a ceiling light, a wall light, and the like.

Since the light-emitting device formed in accordance with the above embodiments has long lifetime, a desk lamp with long lifetime can be provided by using the light-emitting device for the lighting portion 9401 of the desk lamp.

Figure 9E:
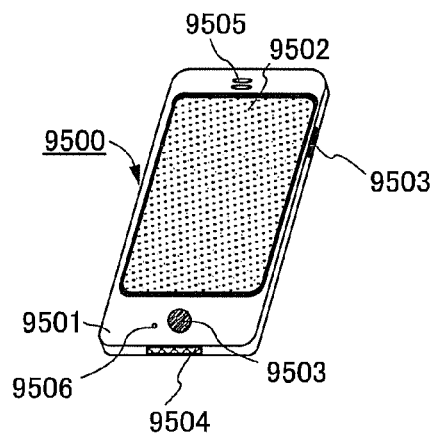

FIG. 9E illustrates an example of a mobile phone set. A mobile phone set 9500 is provided with a display portion 9502 incorporated in a housing 9501, an operation button 9503, an external connection port 9504, a speaker 9505, a microphone 9506, and the like. The mobile phone set 9500 is manufactured using the light-emitting device which is formed in accordance with the above embodiments for the display portion 9502.

When the display portion 9502 of the mobile phone set 9500 illustrated in FIG. 9E is touched with a finger or the like, data can be input to the mobile phone set 9500. In addition, operations such as phone call or composing of a mail can be conducted by touching the display portion 9502 with a finger or the like.

There are mainly three screen modes for the display portion 9502. The first mode is a display mode mainly for displaying an image. The second mode is an input mode mainly for inputting information such as text. The third mode is a display-and-input mode in which two modes of the display mode and the input mode are combined.

For example, in the case of making a phone call or composing a mail, a text input mode mainly for inputting text is selected for the display portion 9502 so that characters displayed on a screen can be input. In this case, it is preferable to display a keyboard or number buttons on almost the entire screen of the display portion 9502.

When a detection device including a sensor for detecting inclination, such as a gyroscope or an acceleration sensor, is provided inside the mobile phone set 9500, display on the screen of the display portion 9502 can be automatically switched by determining the orientation of the mobile phone set 9500 (whether the mobile phone set 9500 is placed horizontally or vertically for a landscape mode or a portrait mode).

Further, the screen modes are switched by touching the display portion 9502 or operating the operation button 9503 provided on the housing 9501. Alternatively, the screen modes can be switched depending on kinds of images displayed in the display portion 9502. For example, when a signal for an image displayed in the display portion is data of moving images, the screen mode is switched to the display mode. When the signal is text data, the screen mode is switched to the input mode.

Moreover, in the input mode, when input by touching the display portion 9502 is not performed within a specified period of time while a signal detected by an optical sensor in the display portion 9502 is detected, the screen mode may be controlled so as to be switched from the input mode to the display mode.

The display portion 9502 may also function as an image sensor. For example, an image of a palm print, a fingerprint, or the like is taken by touching the display portion 9502 with a palm or a finger, whereby personal authentication can be performed. Furthermore, by providing a backlight or a sensing light source emitting near-infrared light for the display portion, an image of a finger vein, a palm vein, or the like can also be taken.

Since the light-emitting device formed in accordance with the above embodiments has long lifetime, a mobile phone set with long lifetime can be provided by using the light-emitting device for the display portion 9502 of the mobile phone set. Further, since the light-emitting device exhibits high chromaticity, by using the light-emitting device for the display portion 9502 of the mobile phone set, an image with improved quality can be displayed.

FIG. 10 is an example in which the light-emitting device formed in accordance with the above embodiments is used as an indoor lighting device 1001. Since the light-emitting device described in the above embodiments can be increased in area, the light-emitting device can be used as a lighting device having a large area. In addition, the light-emitting device described in the above embodiments can be thinned and thus can be used as a roll-up type lighting device 1002. Since the light-emitting device formed in accordance with the above embodiments has a long-lifetime light-emitting element, the light-emitting device can be used as a long-lifetime lighting device. As illustrated in FIG. 10, a desk lamp 1003 as illustrated in FIG. 9E may be used in a room provided with the indoor lighting device 1001.

As described above, an electronic appliance or a lighting device can be obtained by using the light-emitting device described in the above embodiments. The light-emitting device has a remarkably wide application range, and can be applied to electronic appliances in various fields.

Note that the structure described in this embodiment can be combined with any of the structures described in other embodiments as appropriate.

EXAMPLE 1

In this example, light-emitting elements having the structures described in the above embodiments are described in detail.

The molecular structures of organic compounds used in this example are represented by the following structural formulae (10) to (14). The structure of a light-emitting element of this example is illustrated in FIG. 2A.

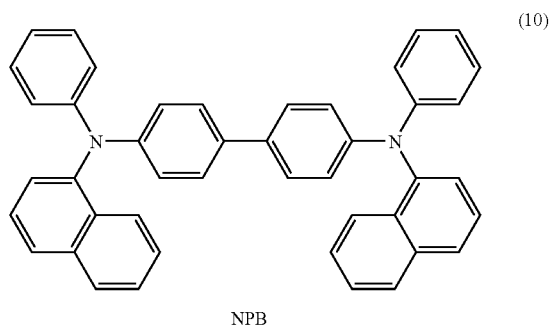

(10)

NPB

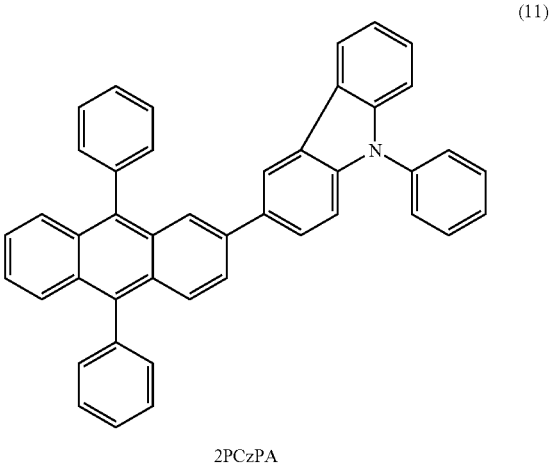

(11)

2PCzPA

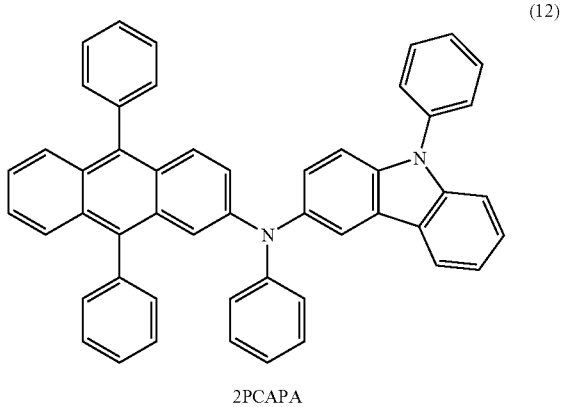

(12)

2PCAPA

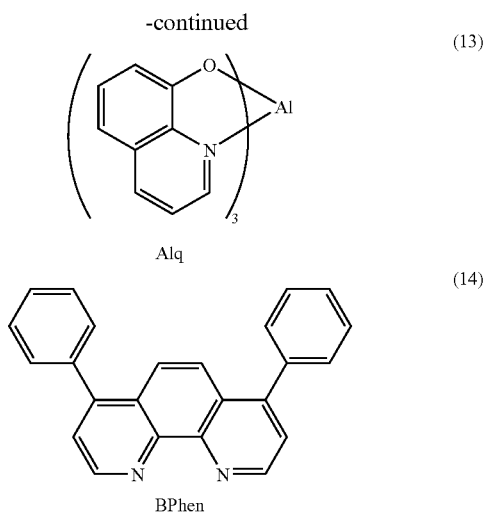

Alq (13)

BPhen (14)

A method for manufacturing a light-emitting element 1 of this example will be described below.

(Light-Emitting Element 1)

First, a glass substrate over which indium tin silicon oxide (ITSO) was deposited to have a thickness of 110 nm was prepared as an anode 102. The periphery of a surface of ITSO was covered with a polyimide film so that an area of 2 mm square of the surface was exposed. The electrode area was 2 mm×2 mm. As a pretreatment for forming a light-emitting element over the substrate, the surface of the substrate was washed with water and baked at 200° C. for one hour, and then a UV ozone treatment was performed for 370 seconds. After that, the substrate was transferred into a vacuum evaporation apparatus whose pressure was reduced to about $10^{-4}$ Pa, vacuum baking at 170° C. for 30 minutes was performed in a heating chamber in the vacuum evaporation apparatus, and then the substrate was cooled down for about 30 minutes.

Next, the substrate was fixed to a holder provided in the vacuum evaporation apparatus so that the surface where ITSO was deposited faced downward.

After the pressure in the vacuum evaporation apparatus was reduced to $10^{-4}$ Pa, 4,4'-bis[N-(1-naphthyl)-N-phenylamino]biphenyl (abbreviation: NPB) represented by the structural formula (10) and molybdenum(VI)oxide were co-evaporated so as to meet NPB: molybdenum(VI)oxide=1:4 (mass ratio), whereby a hole-transport layer 104 was formed. The thickness was set to be 20 nm. Note that a co-evaporation method is an evaporation method in which a plurality of different substances is simultaneously vaporized from respective different evaporation sources.

Further, the layer 106 containing a light-emitting substance was formed over the hole-transport layer 104.

The layer 106 containing a light-emitting substance was formed by co-evaporation of 3-(9,10-diphenyl-2-anthryl)-9-phenyl-9H-carbazole (abbreviation: 2PCzPA) represented by the above structural formula (11) and 9,10-diphenyl-2-[N-phenyl-N-(9-phenyl-9H-carbazol-3-yl)amino]anthracene (abbreviation: 2PCAPA) represented by the above structural formula (12). In the layer 106 containing a light-emitting substance, the mass ratio was set to be 2PCzPA:2PCAPA=1: 0.1 and the thickness was set to be 50 nm.

Next, an electron-transport layer 110 was formed by evaporating tris(8-quinolinolato)aluminum(III) (abbreviation: Alq) represented by the above structural formula (13) with a thickness of 10 nm, and bathophenanthroline (abbreviation: BPhen) represented by the above structural formula (14) with a thickness of 20 nm. The electron-injection layer 112 was formed by depositing lithium fluoride to have a thickness of 1 nm over the electron-transport layer 110. Lastly, aluminum was deposited to have a thickness of 200 nm as the cathode 108. In this manner, the light-emitting element 1 of this example was manufactured. In the above evaporation process, evaporation was all performed by a resistance heating method.

The element structure of the light-emitting element 1 manufactured as described above is shown in Table 1. Here, the light-emitting element 1 has the structure described in Embodiment 1.

TABLE 1

| | 102 | 104 | 106 | 110 | 112 | 108 |
|---|---|---|---|---|---|---|
| Light-emitting element 1 | ITSO 110 nm | NPB:MoOx (=1:4) 20 nm | 2PCzPA:2PCAPA (=1:0.1) 50 nm | Alq 10 nm | BPhen 20 nm | LiF 1 nm | Al 200 nm |

The light-emitting element 1 thus obtained was sealed in a glove box under a nitrogen atmosphere without being exposed to the atmosphere. Then, the operating characteristics of the light-emitting element were measured. Note that the measurement was carried out at room temperature (in an atmosphere kept at 25° C.).

Figure 11:
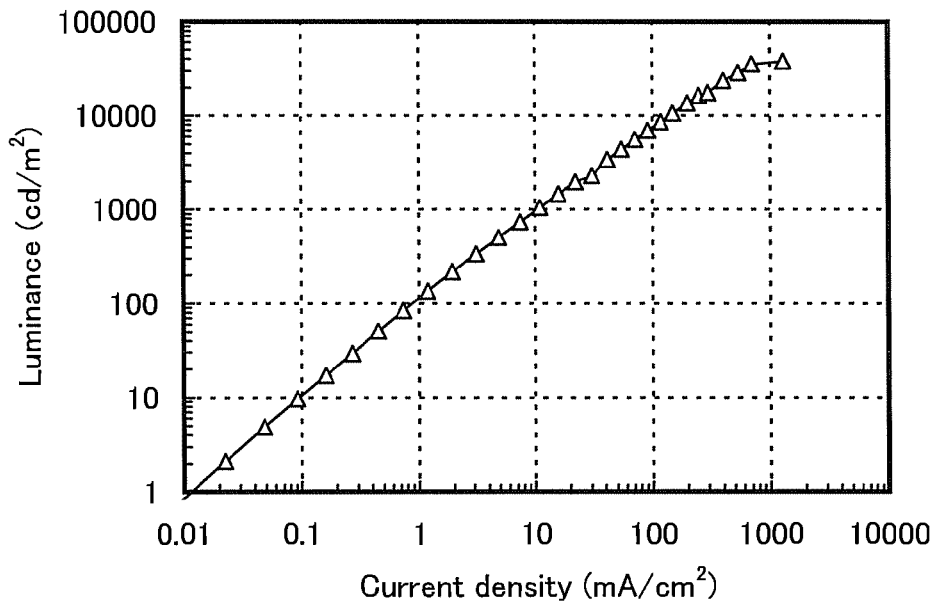
FIG. 11 is a graph showing characteristics of a light-emitting element of Example 1.
Figure 12:
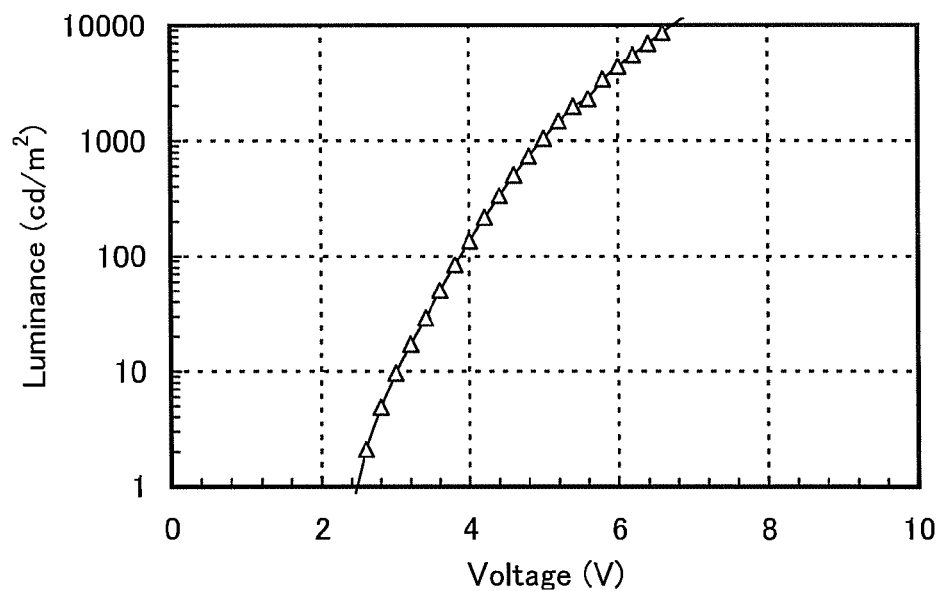
FIG. 12 is a graph showing characteristics of the light-emitting element of Example 1.
Figure 13:
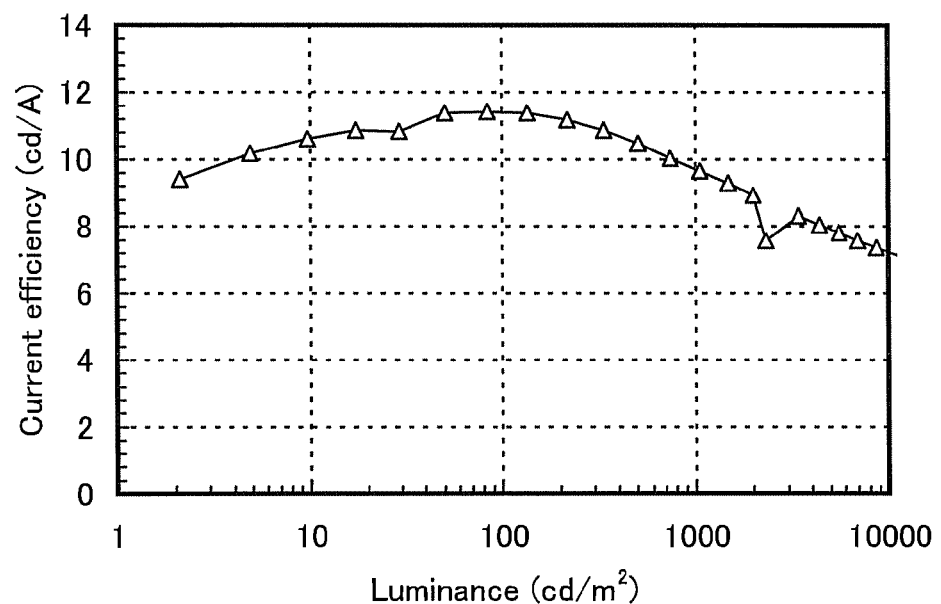
FIG. 13 is a graph showing characteristics of the light-emitting element of Example 1.
Figure 14:
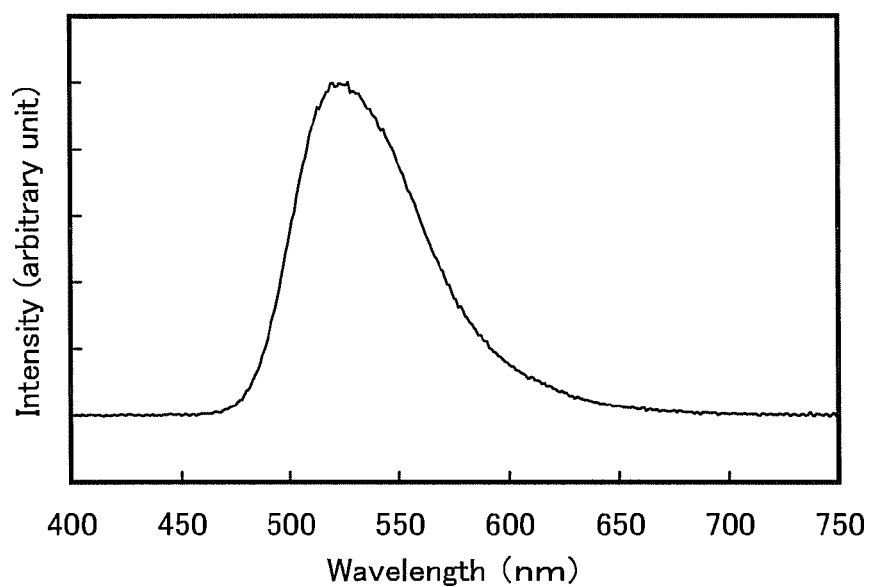
FIG. 14 is a graph showing characteristics of the light-emitting element of Example 1.

Current density-luminance characteristics, voltage-luminance characteristics, and luminance-current efficiency characteristics of the light-emitting element are shown in FIG. 11, FIG. 12, and FIG. 13, respectively. The light emission spectrum when a current of 1 mA flows is shown in FIG. 14. The voltage and the chromaticity of the light-emitting element around 1000 cd/m² are shown in Table 2.

TABLE 2

| | Light-emitting element 1 |
|---|---|
| Luminance (cd/m²) | 1050 |
| Voltage (V) | 5.0 |
| Chromaticity (x, y) | (0.28, 0.65) |

Figure 15:
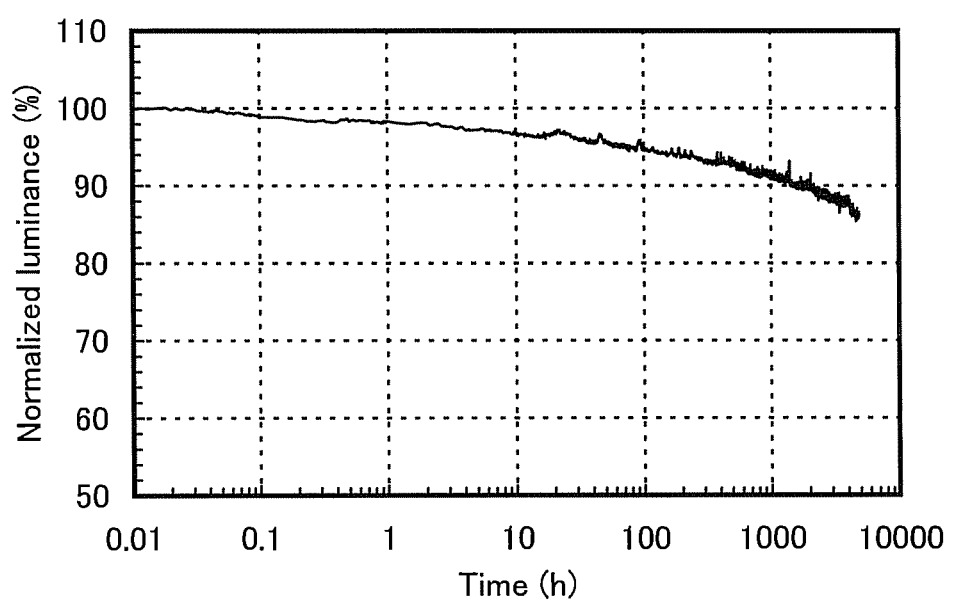
FIG. 15 is a graph showing characteristics of the light-emitting element of Example 1.

Further, a reliability test of the manufactured light-emitting element 1 was performed. In the reliability test, the initial luminance was set at 1000 cd/m², the light-emitting element was operated at a constant current density, and the luminance was measured at regular intervals. The result obtained by the reliability test is shown in FIG. 15. In FIG. 15, the horizontal axis represents current flow time (hour) and the vertical axis represents the percentage of luminance to the initial luminance at each time, that is, normalized luminance (%).

As can be seen from FIG. 15, after the driving for 4900 hours, the light-emitting element 1 kept 86% of the initial luminance. Accordingly, it is found that the luminance of the light-emitting element 1 does not easily decrease with the passage of time, and the light-emitting element 1 has long lifetime. The results suggest that in the light-emitting element 1, since the hole-transport layer 104 in which molybdenum oxide is contained as the anti-reduction substance is adjacent to the layer 106 containing a light-emitting substance, even when an electron passes through the layer 106 containing a light-emitting substance and reaches the side of the hole-transport layer, the electron can be recombined with the anti-reduction substance; therefore, accumulation of electrons at the interface between the hole-transport layer 104 and the layer 106 containing a light-emitting substance is suppressed.

As described above, according to this example, it was confirmed that the light-emitting element of this example has characteristics as a light-emitting element and functions well. In addition, the light-emitting element 1 of this example can be considered to be a light-emitting element achieved high reliability.

EXAMPLE 2

In this example, a light-emitting element having a structure different from that of Example 1 is described. The molecular structure of an organic compound used in this example is represented by the following structural formula (15). Note that the organic compounds whose molecular structures are already shown in the other example are not described in this example. The element structure in this example is the same as that in Example 1, about which FIG. 2A is referred to.

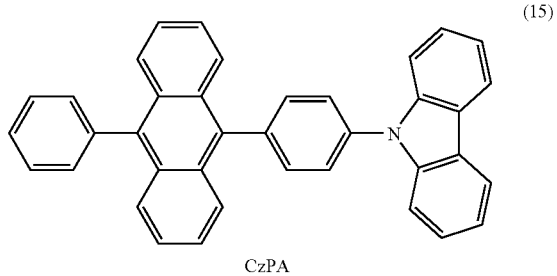 [SMILES: c1ccc(-c2c3ccccc3c(-c3ccc(-n4c5ccccc5c5ccccc54)cc3)c3ccccc23)cc1]

(15)

CzPA

A method for manufacturing a light-emitting element 2 of this example will be described below. The light-emitting element 2 of this example was manufactured in a manner similar to that of the light-emitting element 1 of Example 1, except for the layer 106 containing a light-emitting substance.

(Light-Emitting Element 2)

In the light-emitting element 2, the layer 106 containing a light-emitting substance was formed by co-evaporation of 3-(9,10-diphenyl-2-anthryl)-9-phenyl-9H-carbazole (abbreviation: 2PCzPA) represented by the above structural formula (11), 9-[4-(N-carbazolyl)phenyl]-10-phenylanthracene (abbreviation: CzPA) represented by the above structural formula (15), and 9,10-diphenyl-2-[N-phenyl-N-(9-phenyl-9H-carbazol-3-yl)amino]anthracene (abbreviation: 2PCAPA) represented by the above structural formula (12). In the layer 106 containing a light-emitting substance, the mass ratio was set to be 2PCzPA: CzPA: 2PCAPA=0.5:0.5:0.1 and the thickness was set to be 50 nm.

The element structure of the manufactured light-emitting element 2 is shown in Table 3. The light-emitting element 2 has the structure described in Embodiment 1.

TABLE 3

| | 102 | 104 | 106 | 110 | 112 | 108 |
|---|---|---|---|---|---|---|
| Light-emitting element 2 | ITSO 110 nm | NPB:MoOx (=1:4) 20 nm | 2PCzPA:CzPA:2PCAPA (=0.5:0.5:0.1) 50 nm | Alq 10 nm | BPhen 20 nm | LiF 1 nm | Al 200 nm |

The light-emitting element 2 thus obtained was sealed in a glove box under a nitrogen atmosphere without being exposed to the atmosphere. Then, the operating characteristics of the light-emitting element were measured. Note that the measurement was carried out at room temperature (in an atmosphere kept at 25° C.).

Figure 16:
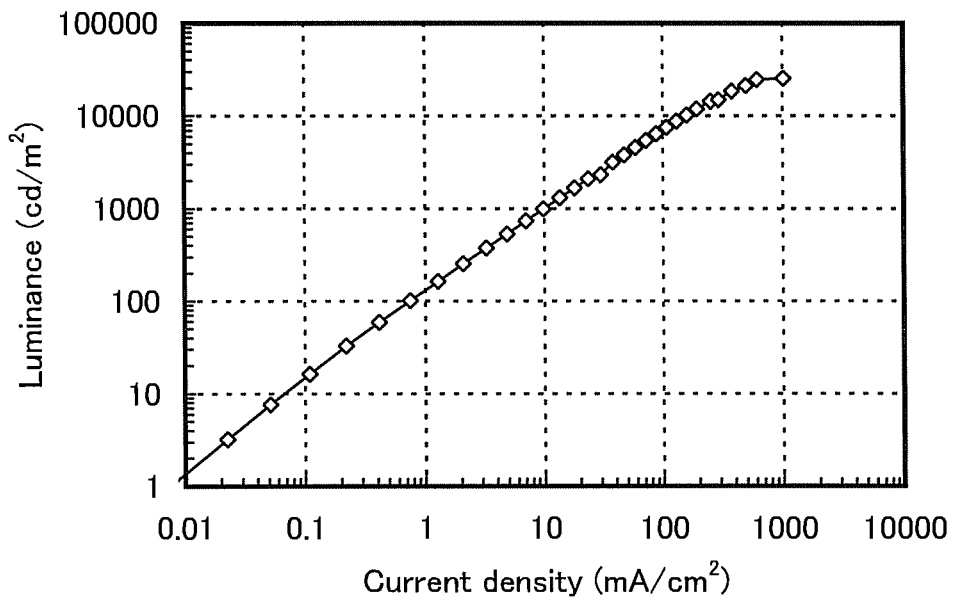
FIG. 16 is a graph showing characteristics of a light-emitting element of Example 2.
Figure 17:
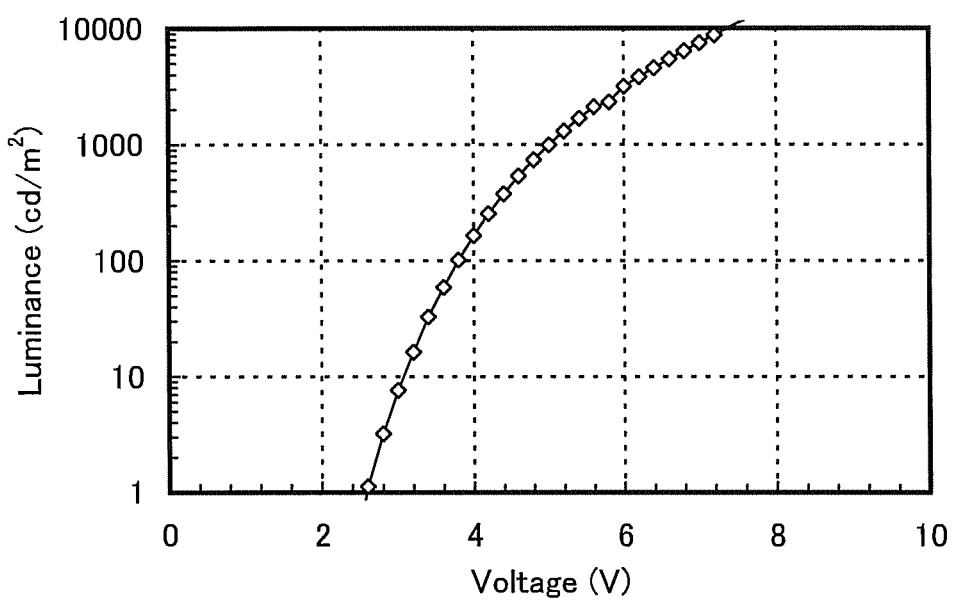
FIG. 17 is a graph showing characteristics of the light-emitting element of Example 2.
Figure 18:
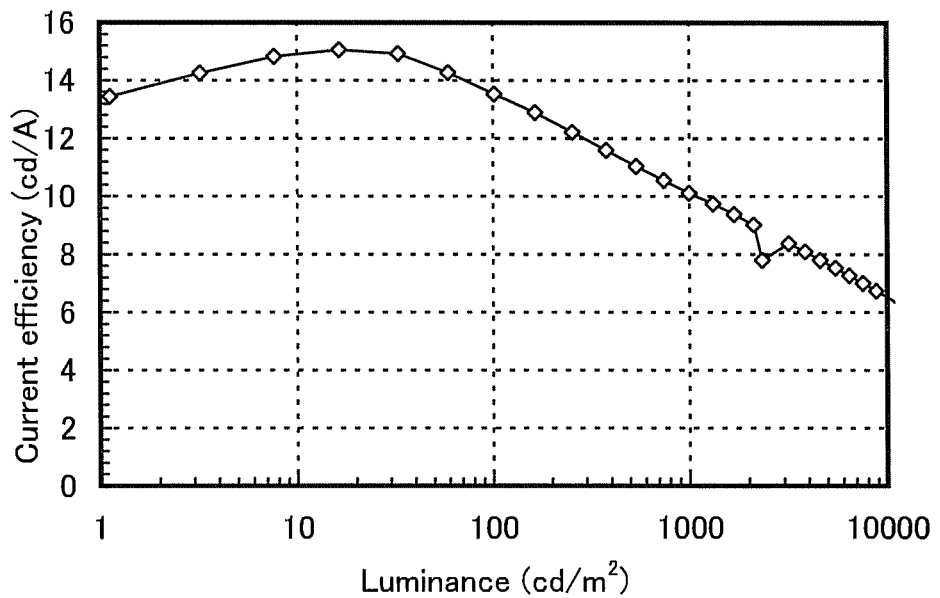
FIG. 18 is a graph showing characteristics of the light-emitting element of Example 2.
Figure 19:
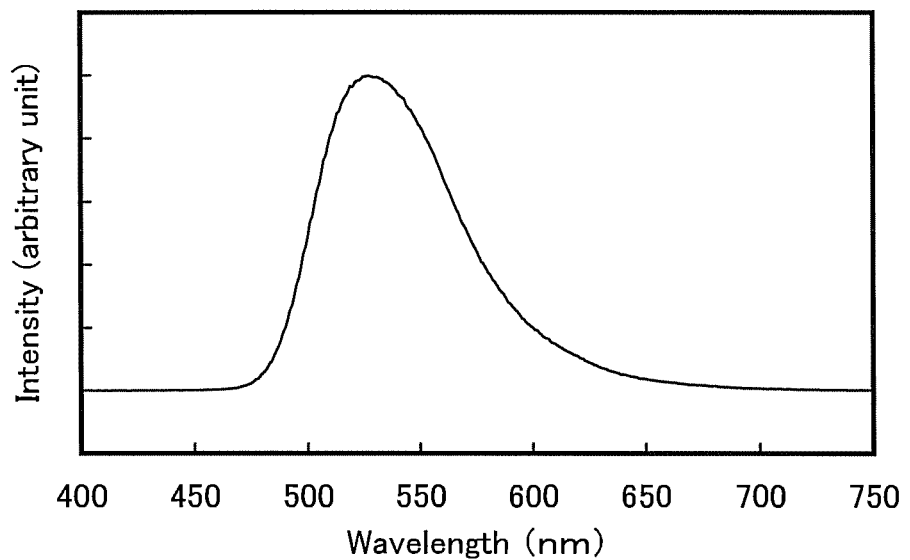
FIG. 19 is a graph showing characteristics of the light-emitting element of Example 2.

Current density-luminance characteristics, voltage-luminance characteristics, luminance-current efficiency characteristics, of the light-emitting element are shown in FIG. 16, FIG. 17, and FIG. 18, respectively. The light emission spectrum when a current of 1 mA flows is shown in FIG. 19. The voltage and the chromaticity of the light-emitting element around 1000 cd/m$^2$ are shown in Table 4.

TABLE 4

| | Light-emitting element 2 |
|---|---|
| Luminance (cd/m$^2$) | 1000 |
| Voltage (V) | 5.0 |
| Chromaticity (x, y) | (0.31, 0.63) |

Figure 20:
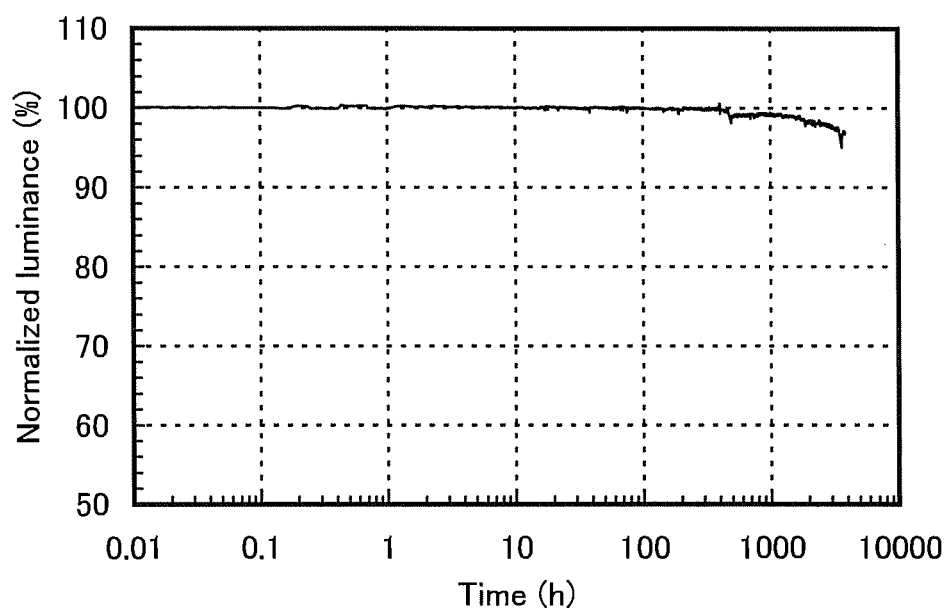
FIG. 20 is a graph showing characteristics of the light-emitting element of Example 2.

Further, a reliability test of the manufactured light-emitting element 2 was performed. In the reliability test, the initial luminance was set at 1000 cd/m$^2$, the light-emitting element was operated at a constant current density, and the luminance was measured at regular intervals. The result obtained by the reliability test is shown in FIG. 20. In FIG. 20, the horizontal axis represents current flow time (hour) and the vertical axis represents the percentage of luminance to the initial luminance at each time, that is, normalized luminance (%).

As can be seen from FIG. 20, after the driving for the 3900 hours, the light-emitting element 2 kept 97% of the initial luminance. Accordingly, it is found that the luminance of the light-emitting element 2 does not easily decrease with the passage of time, and the light-emitting element 2 has long lifetime. The results suggest that in the light-emitting element 2, since the hole-transport layer 104 in which molybdenum oxide is contained as the anti-reduction substance is adjacent to the layer 106 containing a light-emitting substance, even when an electron passes through the layer 106 containing a light-emitting substance and reaches the side of the hole-transport layer, the electron can be recombined with the anti-reduction substance; therefore, accumulation of electrons at the interface between the hole-transport layer 104 and the layer 106 containing a light-emitting substance is suppressed.

As described above, according to this example, it was confirmed that the light-emitting element of this example has characteristics as a light-emitting element and functions well. In addition, the light-emitting element 2 of this example can be considered to be a light-emitting element achieved high reliability.

EXAMPLE 3

In this example, a light-emitting element having a structure different from the structures of Example 1 and Example 2 is described. The molecular structure of an organic compound used in this example is represented by the following structural formula (16). Note that the organic compounds whose molecular structures are already shown in other examples are not described in this example. The element structure in this example is the same as that in Example 1, about which FIG. 2A is referred to.

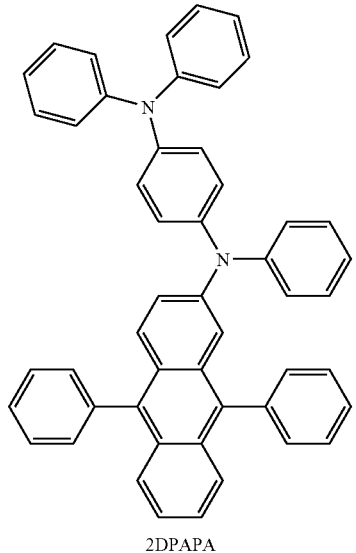

(16)

2DPAPA

A method for manufacturing a light-emitting element 3 of this example will be described below. Note that the light-emitting element 3 of the present invention was manufactured in a manner similar to that of the light-emitting element 1 in Example 1, except for the layer 106 containing a light-emitting substance.

(Light-Emitting Element 3)

In the light-emitting element 3, the layer 106 containing a light-emitting substance was formed by co-evaporation of 3-(9,10-diphenyl-2-anthryl)-9-phenyl-9H-carbazole (abbreviation: 2PCzPA) represented by the above structural formula (11) and 9,10-diphenyl-2-[N-(4-diphenylaminophenyl)-N-phenylamino]anthracene (abbreviation: 2DPAPA) represented by the above structural formula (16). In the layer 106 containing a light-emitting substance, the mass ratio was set to be 2PCzPA: 2DPAPA=1:0.2 and the thickness was set to be 50 nm.

The element structure of the manufactured light-emitting element 3 is shown in Table 5. The light-emitting element 3 has the structure described in Embodiment 1.

TABLE 5

|  | 102 | 104 | 106 |  | 110 | 112 |
|---|---|---|---|---|---|---|
| Light-emitting element 3 | ITSO 110 nm | NPB:MoOx (=1:4) 20 nm | 2PCzPA:2DPAPA (=1:0.2) 50 nm | Alq 10 nm | BPhen 20 nm | LiF 1 nm |

The light-emitting element 3 thus obtained was sealed in a glove box under a nitrogen atmosphere without being exposed to the atmosphere. Then, the operating characteristics of the light-emitting element were measured. Note that the measurement was carried out at room temperature (in an atmosphere kept at 25° C.).

Figure 21:
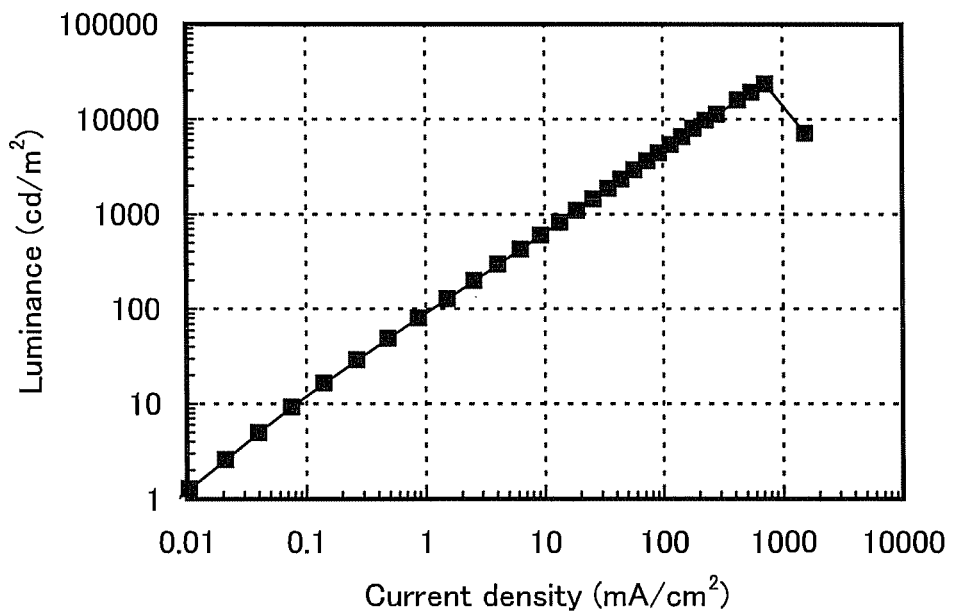
FIG. 21 is a graph showing characteristics of a light-emitting element of Example 3.
Figure 22:
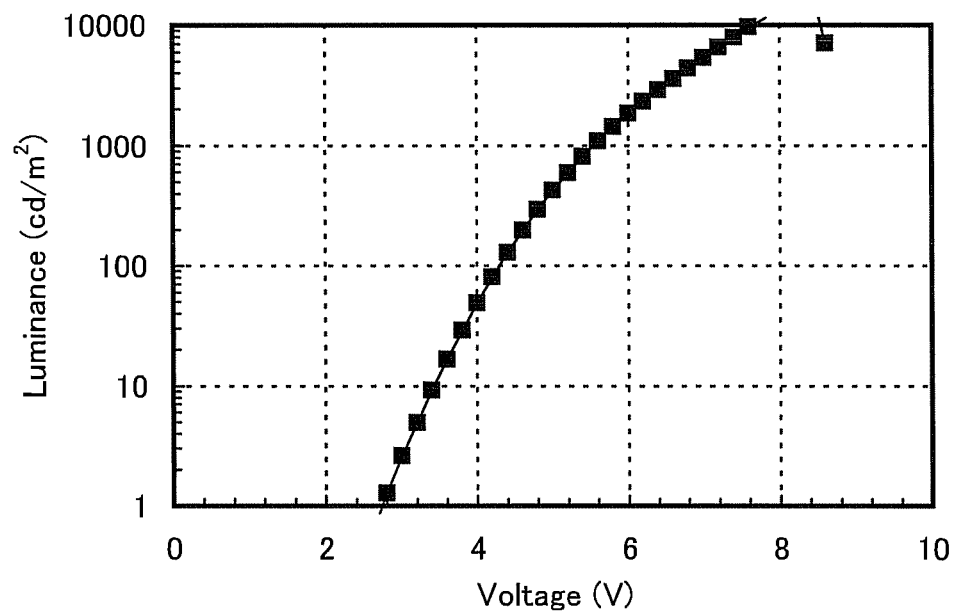
FIG. 22 is a graph showing characteristics of the light-emitting element of Example 3.
Figure 23:
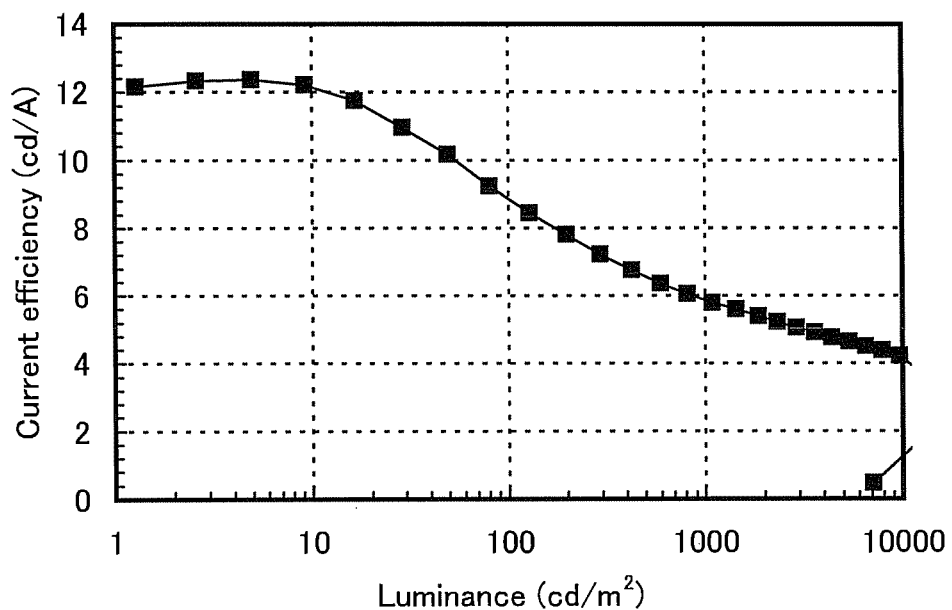
FIG. 23 is a graph showing characteristics of the light-emitting element of Example 3.
Figure 24:
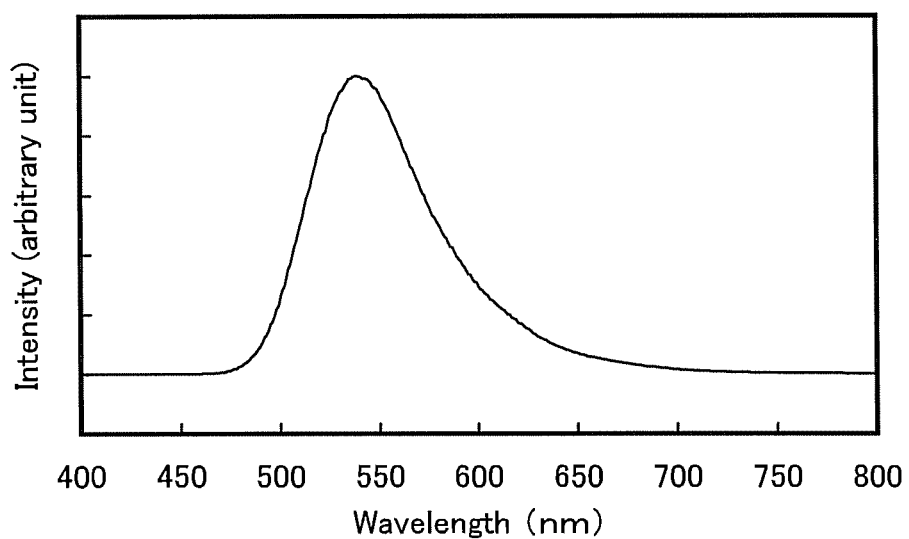
FIG. 24 is a graph showing characteristics of the light-emitting element of Example 3.

Current density-luminance characteristics, voltage-luminance characteristics, luminance-current efficiency characteristics, of the light-emitting element are shown in FIG. 21, FIG. 22, and FIG. 23, respectively. The light emission spectrum when a current of 1 mA flows is shown in FIG. 24. The voltage and the chromaticity of the light-emitting element around 1000 cd/m$^2$ are shown in Table 6.

TABLE 6

|  | Light-emitting element 3 |
|---|---|
| Luminance (cd/m$^2$) | 1090 |
| Voltage (V) | 5.6 |
| Chromaticity (x, y) | (0.35, 0.61) |

Figure 25:
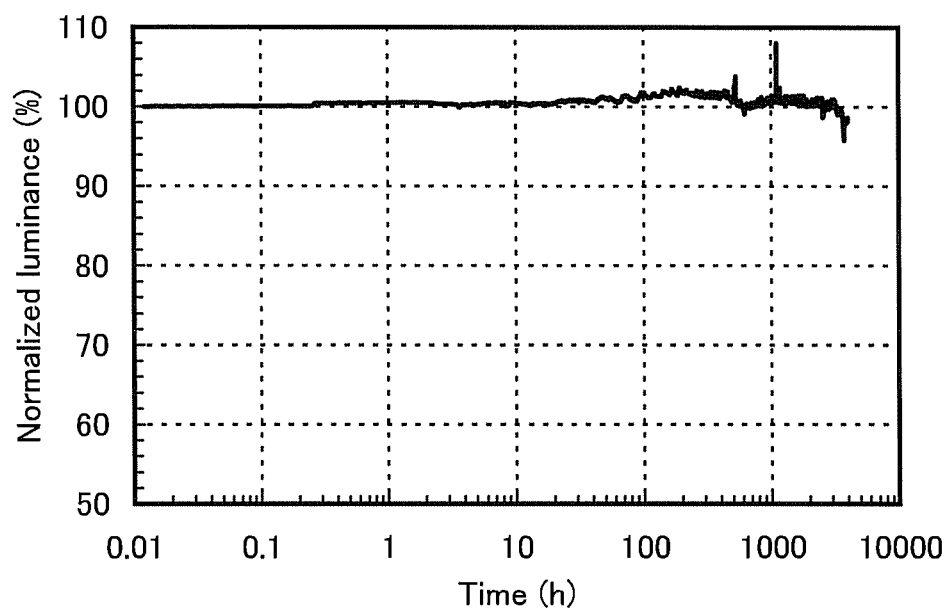
FIG. 25 is a graph showing characteristics of the light-emitting element of Example 3.

Further, a reliability test of the manufactured light-emitting element 3 was performed. In the reliability test, the initial luminance was set at 1000 cd/m$^2$, the light-emitting element was operated at a constant current density, and the luminance was measured at regular intervals. The result obtained by the reliability test is shown in FIG. 25. In FIG. 25, the horizontal axis represents current flow time (hour) and the vertical axis represents the percentage of luminance to the initial luminance at each time, that is, normalized luminance (%).

As can be seen from FIG. 25, after the driving for the 4000 hours, the light-emitting element 3 kept 99% of the initial luminance. Accordingly, it is found that the luminance of the light-emitting element 3 does not easily decrease with the passage of time, and the light-emitting element 3 has long lifetime. The result suggest that in the light-emitting element 3, since the hole-transport layer 104 in which molybdenum oxide is contained as the anti-reduction substance is adjacent to the layer 106 containing a light-emitting substance, even when an electron passes through the layer 106 containing a light-emitting substance and reaches the side of the hole-transport layer, the electron can be recombined with the anti-reduction substance; therefore, accumulation of electrons at the interface between the hole-transport layer 104 and the layer 106 containing a light-emitting substance is suppressed.

As described above, according to this example, it was confirmed that the light-emitting element of this example has characteristics as a light-emitting element and functions well. In addition, the light-emitting element 3 of this example can be considered to be a light-emitting element achieved high reliability.

EXAMPLE 4

In this example, a light-emitting element having a structure different from the structures of the above examples is described. The molecular structure of an organic compound used in this example is represented by the following structural formula (17). Note that the organic compounds whose molecular structures are already shown in other examples are not described in this example. The element structure in this example is the same as that in Example 1, about which FIG. 2A is referred to.

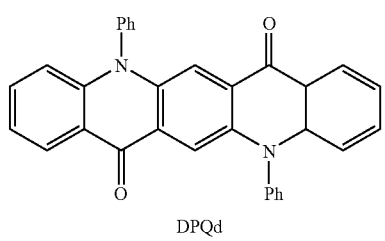

DPQd (17)

Methods for manufacturing a light-emitting element 4 and a light-emitting element 5 of this example will be described below. Note that the light-emitting element 4 of the present invention was manufactured in a manner similar to that of the light-emitting element 1 in Example 1, expect for the layer 106 containing a light-emitting substance. The light-emitting element 5 of this example was manufactured in a manner similar to that of the light-emitting element 1 in Example 1, except for the layer 106 containing a light-emitting substance and the electron-transport layer 110.

(Light-Emitting Element 4)

In the light-emitting element 4, the layer 106 containing a light-emitting substance was formed by co-evaporation of 9-[4-(N-carbazolyl)phenyl]-10-phenylanthracene (abbreviation: CzPA) represented by the above structural formula (15) and 9,10-diphenyl-2-[N-phenyl-N-(9-phenyl-9H-carbazol-3-yl)amino]anthracene (abbreviation: 2PCAPA) represented by the above structural formula (12). In the layer 106 containing a light-emitting substance, the mass ratio was set to be CzPA: 2PCAPA=1:0.1 and the thickness was set to be 50 nm.

(Light-Emitting Element 5)

The layer 106 containing a light-emitting substance of the light-emitting element 5 was manufactured in a manner that is similar to a manner of the light-emitting element 4 described above. Over the layer 106 containing a light-emitting substance, tris(8-quinolinolato)aluminum(III) (abbreviation: Alq) represented by the above structural formula (13) and N,N'-diphenylquinacridone (abbreviation: DPQd) were co-evaporated to a thickness of 10 nm, and bathophenanthroline (abbreviation: BPhen) represented by the above structural formula (14) was further evaporated to a thickness of 20 nm; whereby the electron-transport layer 110 was formed. Note that the mass ratio of Alq and DPQd was set to be 1:0.005 (=Alq: DPQd).

The element structures of the manufactured light-emitting element 4 and light-emitting element 5 are shown in Table 7. The light-emitting element 4 and the light-emitting element 5 each have the structure described in Embodiment 1.

The light-emitting elements 4 and 5 thus obtained were sealed in a glove box under a nitrogen atmosphere without being exposed to the atmosphere. Then, the operating characteristics of the light-emitting elements were measured. Note that the measurement was carried out at room temperature (in an atmosphere kept at 25° C.).

Figure 26:
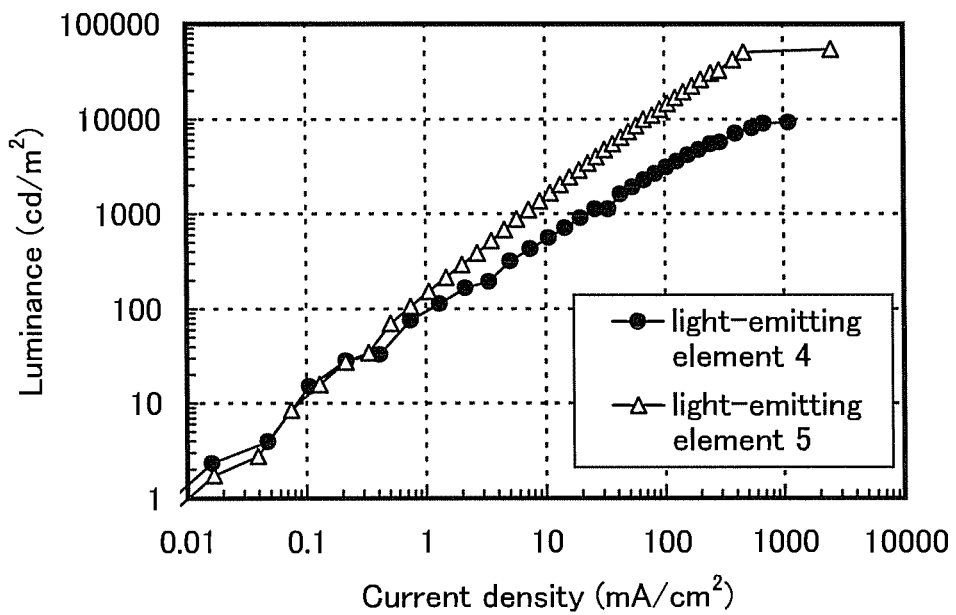
FIG. 26 is a graph showing characteristics of light-emitting elements of Example 4.
Figure 27:
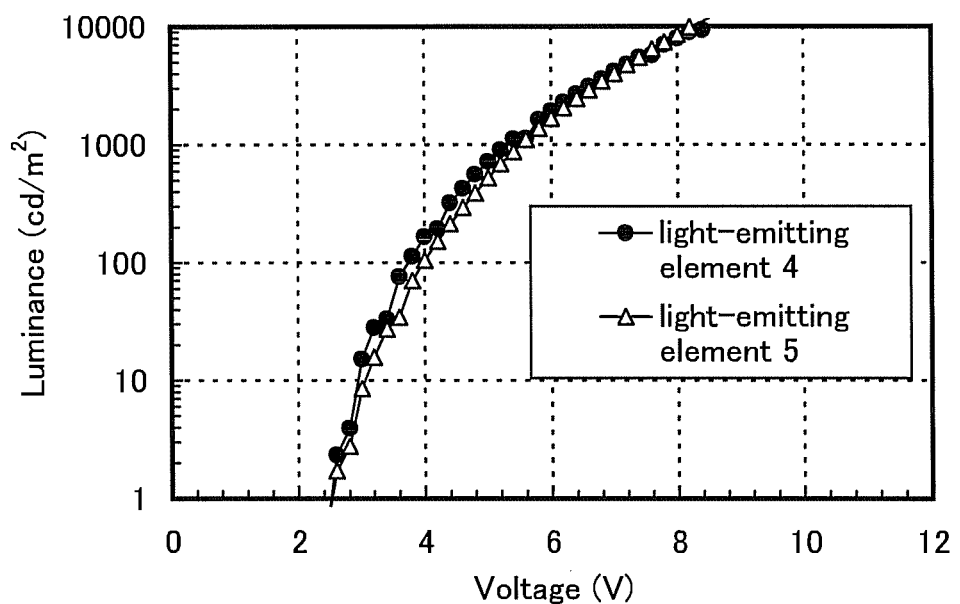
FIG. 27 is a graph showing characteristics of the light-emitting elements of Example 4.
Figure 28:
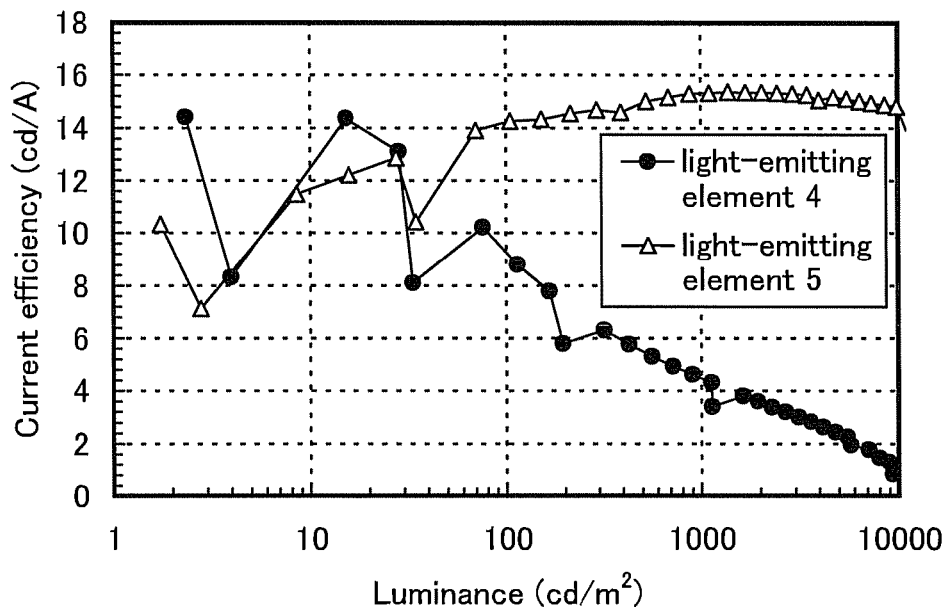
FIG. 28 is a graph showing characteristics of the light-emitting elements of Example 4.
Figure 29:
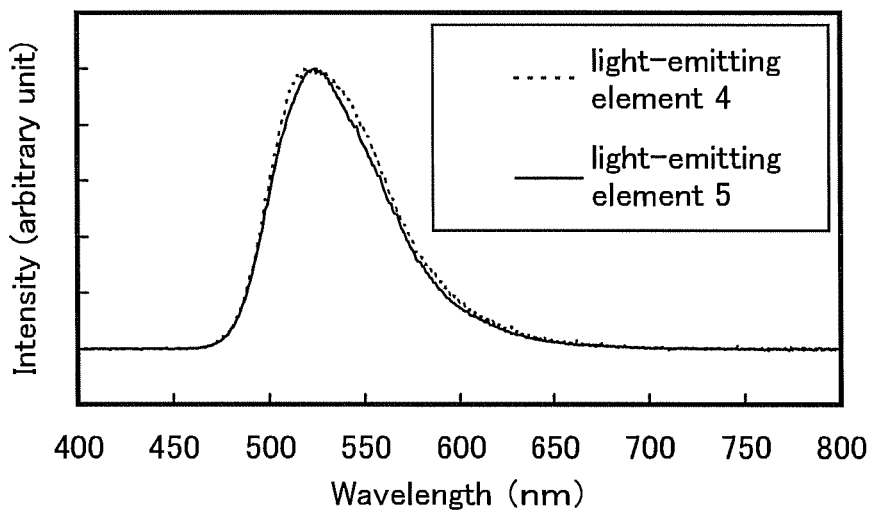
FIG. 29 is a graph showing characteristics of the light-emitting elements of Example 4.

Current density-luminance characteristics, voltage-luminance characteristics, luminance-current efficiency characteristics, of each of the light-emitting elements are shown in FIG. 26, FIG. 27, and FIG. 28, respectively. The light emission spectra when a current of 1 mA flows are shown in FIG. 29. The voltage and the chromaticity of each of the light-emitting elements around 1000 cd/m$^2$ are shown in Table 8.

TABLE 8

|  | Light-emitting element 4 | Light-emitting element 5 |
|---|---|---|
| Luminance (cd/m$^2$) | 900 | 1100 |
| Voltage (V) | 5.2 | 5.6 |
| Chromaticity (x, y) | (0.29, 0.64) | (0.31, 0.64) |

Figure 30:
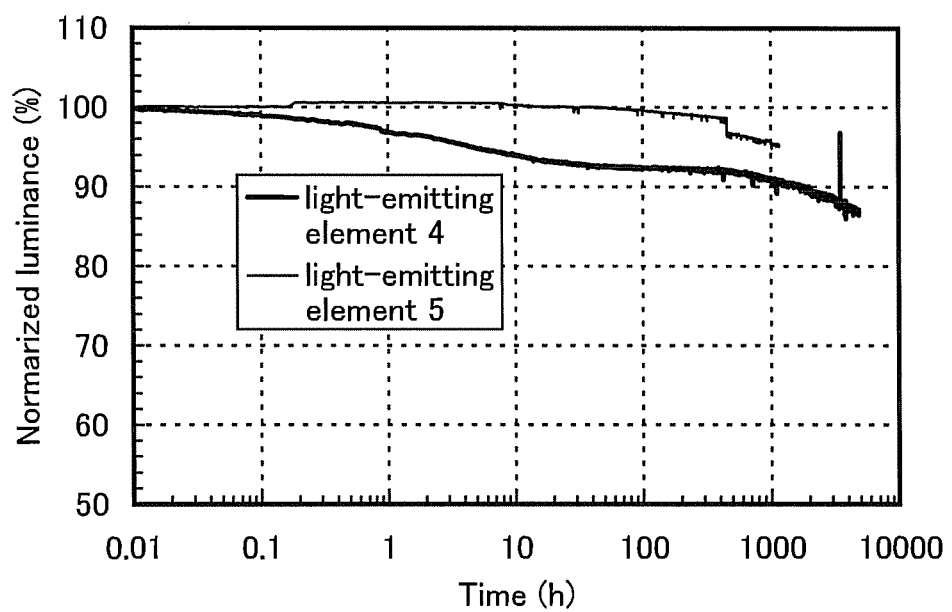
FIG. 30 is a graph showing characteristics of the light-emitting elements of Example 4.

Further, reliability tests of the manufactured light-emitting element 4 and light-emitting element 5 were performed. In the reliability test, the initial luminance was set at 1000 cd/m$^2$, these elements were operated at a constant current density, and the luminance was measured at regular intervals. The results obtained by the reliability tests are shown in FIG. 30. In FIG. 30, the horizontal axis represents current flow time (hour) and the vertical axis represents the percentage of luminance to the initial luminance at each time, that is, normalized luminance (%).

As can be seen from FIG. 30, the light-emitting element 4 kept 87% of the initial luminance after the driving for 4900 hours, and the light-emitting element 5 kept 95% of the initial luminance after the driving for 1200 hours. Accordingly, it is found that the luminance of each of the light-emitting elements 4 and 5 does not easily decrease with the passage of time, and the light-emitting elements 4 and 5 each have long lifetime. The results suggest that in the light-emitting elements 4 and 5, since the hole-transport layer 104 in which molybdenum oxide is contained as the anti-reduction substance is adjacent to the layer 106 containing a light-emitting substance, even when an electron passes through the layer 106 containing a light-emitting substance and reaches the side of the hole-transport layer, the electron can be recombined with the anti-reduction substance; therefore, accumulation of electrons at the interface between the hole-transport layer 104 and the layer 106 containing a light-emitting substance is suppressed.

As described above, according to this example, it was confirmed that the light-emitting element of this example has characteristics as a light-emitting element and functions well.

TABLE 7

|  | 102 | 104 | 106 | 110 |  | 112 | 108 |
|---|---|---|---|---|---|---|---|
| Light-emitting element 4 | ITSO 110 nm | NPB:MoOx (=1:4) 20 nm | CzPA:2PCAPA (=1:0.1) 50 nm | Alq 10 nm | BPhen 20 nm | LiF 1 nm | Al 200 nm |
| Light-emitting element 5 | ITSO 110 nm | NPB:MoOx (=1:4) 20 nm | CzPA:2PCAPA (=1:0.1) 50 nm | Alq:DPQd (=1:0.005) 10 nm | BPhen 20 nm | LiF 1 nm | Al 200 nm |

In addition, the light-emitting elements 4 and 5 of this example can be considered to be light-emitting elements achieved high reliability.

EXAMPLE 5

In this example, a light-emitting element having a structure different from the structures of the above examples is described. Note that since the molecular structures of the organic compounds used in this example are already shown in the other examples, they are not described in this example. The element structure in this example is the same as that in Example 1, about which FIG. 2A is referred to.

Methods for manufacturing a light-emitting element 6 and a light-emitting element 7 of this example will be described below. Note that the light-emitting element 6 of the present invention was manufactured in a manner similar to that of the light-emitting element 1 in Example 1, expect for the layer 106 containing a light-emitting substance. The light-emitting element 7 of this example was manufactured in a manner similar to that of the light-emitting element 1 in Example 1, except for the electron-transport layer 104 and the layer 106 containing a light-emitting substance.

(Light-Emitting Element 6)

In the light-emitting element 6, the layer 106 containing a light-emitting substance was formed by a wet method. Specifically, into a sample bottle, 0.15 g of 9-[4-(N-carbazolyl)phenyl]-10-phenylanthracene (abbreviation: CzPA) represented by the above structural formula (15) and 0.031 g of 9,10-diphenyl-2-[N-phenyl-N-(9-phenyl-9H-carbazol-3-yl)amino]anthracene (abbreviation: 2PCAPA) represented by the above structural formula (12) were measured to be put. 15 mL of dehydrated toluene (produced by Kanto Chemical Co., Inc.) was added into this bottle in an environment of a low moisture concentration (<0.1 ppm) and low oxygen concentration (to 10 ppm), and the sample bottle was stirred overnight with the lid closed, whereby a solution was prepared.

Solution was dripped onto the substrate over which the hole-transport layer 104 was manufactured, in an environment of a low moisture concentration (<0.1 ppm) and a low oxygen concentration (to 10 ppm). The substrate was spin-coated at a spinning rate of 300 rpm for 3 seconds, at a spinning rate of 1000 rpm for 60 seconds, and then at a spinning rate of 2500 rpm for 10 seconds. A film formed by the spin coating of the solution on a terminal portion was removed using toluene, and drying was conducted by performing heating for one hour in a vacuum oven in which the temperature was set to be 110° C. while the pressure was reduced with a rotary pump, whereby the layer 106 containing a light-emitting substance was formed. The thickness thereof was set to be 50 nm. After that, the substrate was disposed in a vacuum evaporation apparatus in which the pressure was reduced so that a surface on which the film was to be formed faced downward, and the electron-transport layer 110 was formed.

(Light-Emitting Element 7)

In the light-emitting element 7, the hole-transport layer 104 was formed as follows: the substrate was fixed to a holder provided in the vacuum evaporation apparatus so that the surface where the anode 102 was formed faced downward; the pressure in the vacuum evaporation apparatus was reduced to $10^{-4}$ Pa; and 9-[4-(N-carbazolyl)phenyl]-10-phenylanthracene (abbreviation: CzPA) represented by the above structural formula (15) and molybdenum(VI) oxide were co-evaporated so as to meet CzPA:molybdenum(VI) oxide=1:4 (mass ratio). The thickness was set to be 20 nm.

Further, the layer 106 containing a light-emitting substance was formed over the hole-transport layer 104. The layer 106 containing a light-emitting substance was manufactured in a manner similar to that of the light-emitting element 6 described above.

The element structures of the manufactured light-emitting element 6 and light-emitting element 7 are shown in Table 9. The light-emitting element 6 and the light-emitting element 7 each have the structure described in Embodiment 1.

TABLE 9

|  | 102 | 104 | 106 | 110 | 112 | 108 |
|---|---|---|---|---|---|---|
| Light-emitting element 6 | ITSO 110 nm | NPB:MoOx (=1:4) 20 nm | CzPA:2PCAPA (=1:0.1) 50 nm | Alq 10 nm | BPhen 20 nm | LiF 1 nm | Al 200 nm |
| Light-emitting element 7 | ITSO 110 nm | CzPA:MoOx (=1:4) 20 nm | CzPA:2PCAPA (=1:0.1) 50 nm | Alq 10 nm | BPhen 20 nm | LiF 1 nm | Al 200 nm |

The light-emitting elements 6 and 7 thus obtained were sealed in a glove box under a nitrogen atmosphere without being exposed to the atmosphere. Then, the operating characteristics of the light-emitting elements were measured. Note that the measurement was carried out at room temperature (in an atmosphere kept at 25° C.).

Figure 31:
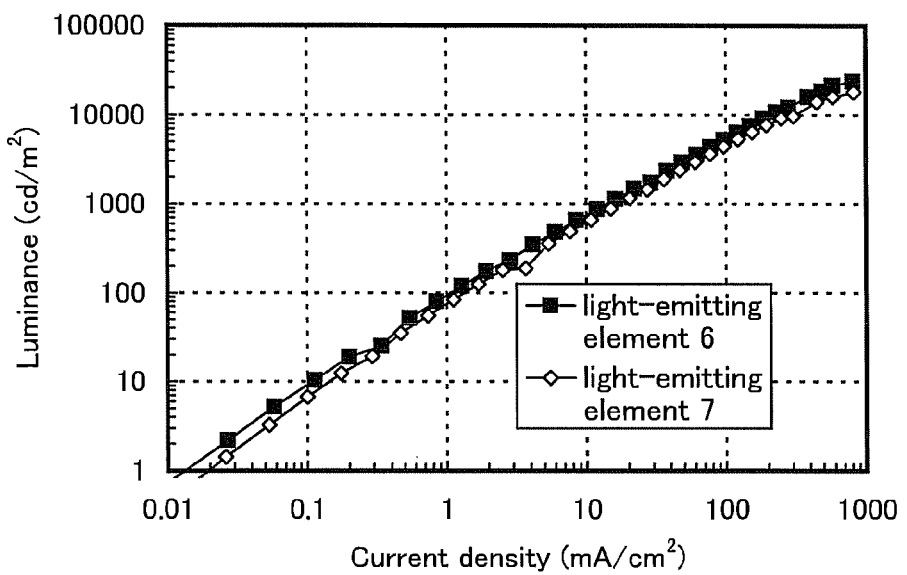
FIG. 31 is a graph showing characteristics of light-emitting elements of Example 5.
Figure 32:
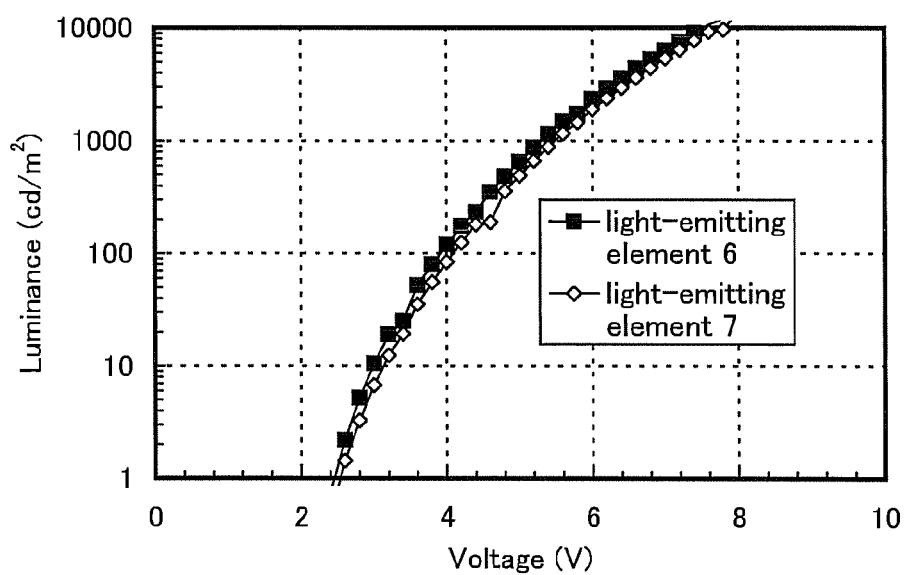
FIG. 32 is a graph showing characteristics of the light-emitting elements of Example 5.
Figure 33:
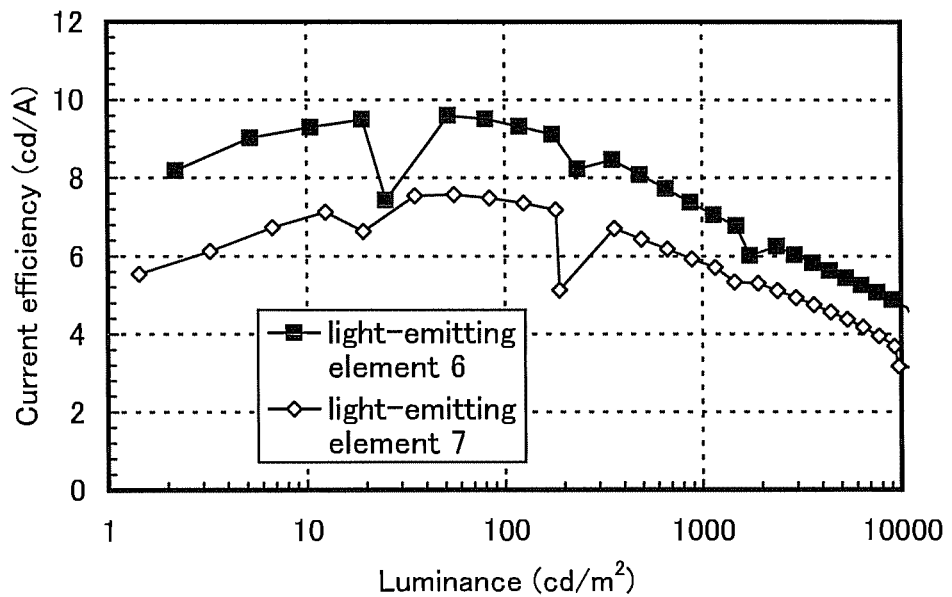
FIG. 33 is a graph showing characteristics of the light-emitting elements of Example 5.
Figure 34:
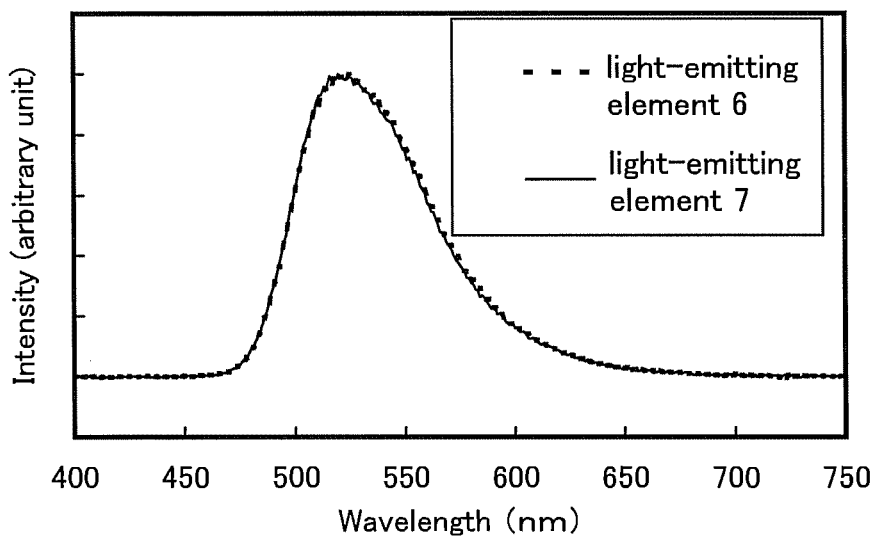
FIG. 34 is a graph showing characteristics of the light-emitting elements of Example 5.

Current density-luminance characteristics, voltage-luminance characteristics, luminance-current efficiency characteristics, of the light-emitting element are shown in FIG. 31, FIG. 32, and FIG. 33, respectively. The voltage and the chromaticity of each of the light-emitting elements around 1000 cd/m$^2$ are shown in Table 10.

TABLE 10

|  | Light-emitting element 6 | Light-emitting element 7 |
|---|---|---|
| Luminance (cd/m$^2$) | 870 | 880 |
| Voltage (V) | 5.2 | 5.1 |
| Chromaticity (x, y) | (0.29, 0.64) | (0.29, 0.64) |

Figure 35:
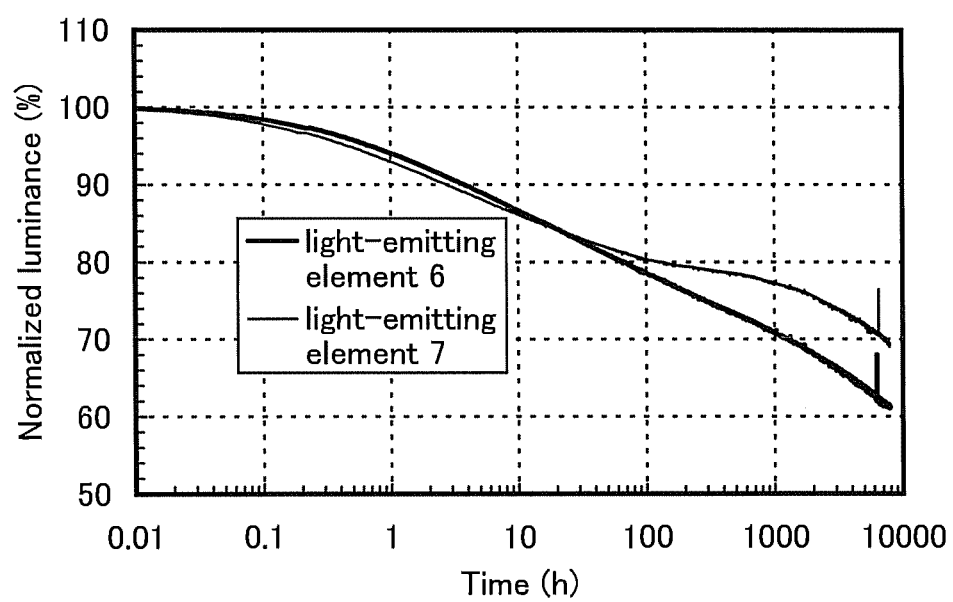
FIG. 35 is a graph showing characteristics of the light-emitting elements of Example 5.
Figure 36A:
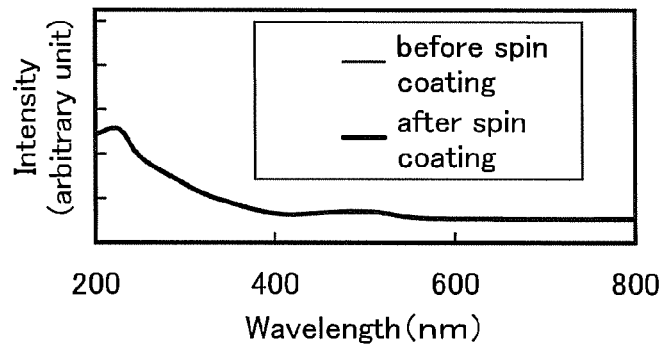
FIGS. 36A to 36D are each a graph showing resistance of a film including metal oxide to solvent.
Figure 36B:
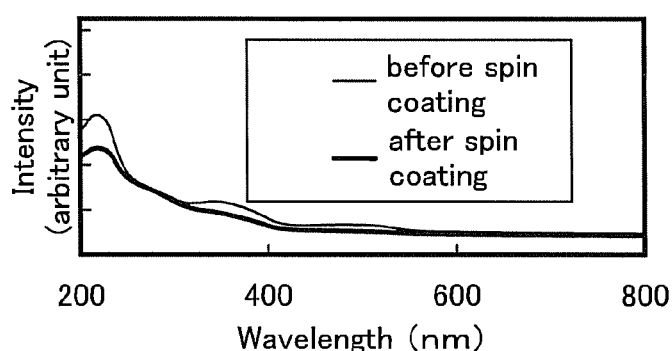
Figure 36C:
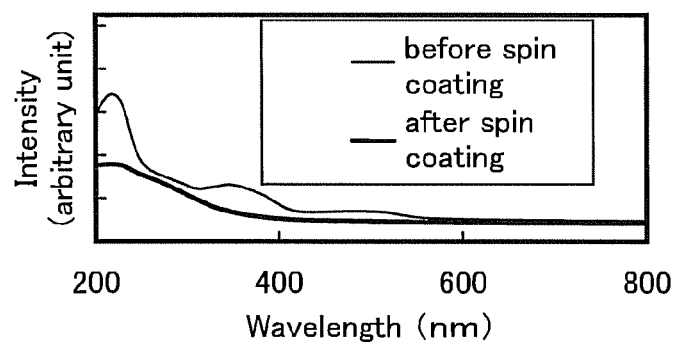
Figure 36D:
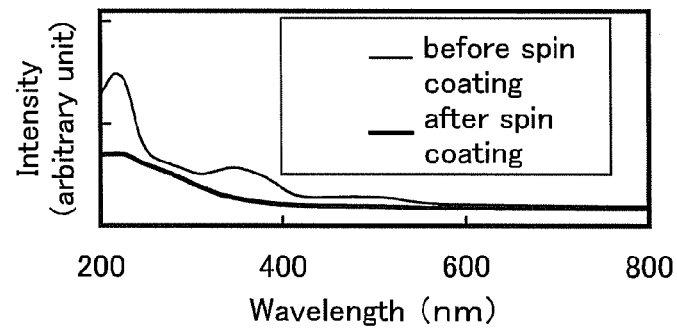

Further, reliability tests of the manufactured light-emitting element 6 and light-emitting element 7 were performed. In the reliability test, the initial luminance was set at 1000 cd/m$^2$, these elements were operated at a constant current density, and the luminance was measured at regular intervals. The results obtained by the reliability tests are shown in FIG. 35. In FIG. 35, the horizontal axis represents current flow time (hour) and the vertical axis represents the percentage of luminance to the initial luminance at each time, that is, normalized luminance (%).

As can be seen from FIG. 35, the light-emitting element 6 kept 61% of the initial luminance after the driving for 7900 hours, and the light-emitting element 7 kept 69% of the initial luminance after the driving for 7900 hours. Accordingly, it is found that although the light-emitting elements 6 and 7 are significantly deteriorated in the initial stage, the luminance does not easily decrease with the passage of time, and the light-emitting elements 6 and 7 have long lifetime. The results suggest that in the light-emitting elements 6 and 7, since the hole-transport layer 104 in which molybdenum oxide is contained as the anti-reduction substance is adjacent to the layer 106 containing a light-emitting substance, even when an electron passes through the layer 106 containing a light-emitting substance and reaches the side of the hole-transport layer, the electron can be recombined with the anti-reduction substance; therefore, accumulation of electrons at the interface between the hole-transport layer 104 and the layer 106 containing a light-emitting substance is suppressed.

As described above, according to this example, it was confirmed that the light-emitting element of this example has characteristics as a light-emitting element and functions well. In addition, the light-emitting elements 6 and 7 of this example can be considered to be light-emitting elements achieved high reliability even in the case where the layer containing a light-emitting substance is formed by a wet method.

EXAMPLE 6

In this example, a thin film containing an organic compound having a hole-transport property and metal oxide was subjected to a test of resistance to solvent after a toluene solution used as a solvent of the wet method was applied to the thin film.

In this example, 4,4'-bis[N-(1-naphthyl)-N-phenylamino] biphenyl (abbreviation: NPB) represented by the structural formula (10) and molybdenum(VI) oxide were co-evaporated on a quartz substrate, whereby a thin film with a thickness of 50 nm was formed. Note that four kinds of samples with mass ratios of molybdenum(VI) oxide to NPB differ from each other were manufactured. The details of the manufactured samples are shown in Table 11.

TABLE 11

| | NPB:MoOx (mass ratio) | MoOx included in NPB (wt %) |
|---|---|---|
| Manufacture example 1 | 1:4 | 80 |
| Manufacture example 2 | 2:4 | 67 |
| Comparative example 1 | 3:4 | 57 |
| Comparative example 2 | 4:4 | 50 |

After manufacture examples 1 and 2 and comparative examples 1 and 2 were manufactured, absorption spectra of thin films thereof were measured. After that, a toluene solution used as a solvent of the wet method was dripped onto each of the thin films. The substrate provided with the thin film was spin-coated at a spinning rate of 300 rpm for 3 seconds, at a spinning rate of 1000 rpm for 60 seconds, and then at a spinning rate of 2500 rpm for 10 seconds.

Absorption spectra with respect to the thin films before and after the spin coating with a toluene solution are shown in FIGS. 36A, 36B, 36C, and 36D. FIGS. 36A, 36B, 36C, and 36D show absorption spectra of the manufacture example 1, the manufacture example 2, the comparative example 1, and the comparative example 2, respectively.

As shown in FIGS. 36A to 36D, the absorption spectrum of the manufacture example 1 hardly changed before and after the spin coating with a toluene solution. The absorption spectrum of the manufacture example 2 slightly changed, but a great change that influences a film quality of the thin film was not observed. In contrast, the absorption spectra of the comparative examples 1 and 2 each greatly changed after the spin coating with a toluene solution, and the thin films were dissolved in the toluene solution. Therefore, when the concentration of the metal oxide contained in the organic compound is set to be 67 wt % or more, a solvent used in a wet method (in this example, a toluene solution) can be applied without changing a film quality.

From the above, it is shown that by setting a concentration of the metal oxide contained in the organic compound having a hole-transport property to be 67 wt % or more, the layer containing a light-emitting substance can be formed over the hole-transport layer by a wet method.

EXAMPLE 7

Figure 37:
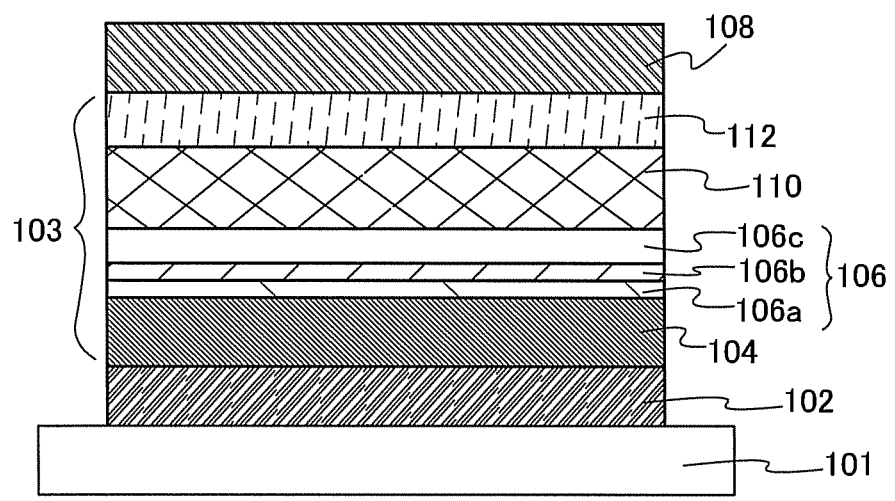
FIG. 37 is a diagram illustrating an example of an element structure of a light-emitting element according to one embodiment of the present invention.

In this example, a light-emitting element having a structure different from the structures of the above examples is described. The molecular structures of organic compounds used in this example are represented by the following structural formulae (18) and (19). Note that the organic compounds whose molecular structures are already shown in the other examples are not described in this example. The structure of a light-emitting element 8 of this example is illustrated in FIG. 37.

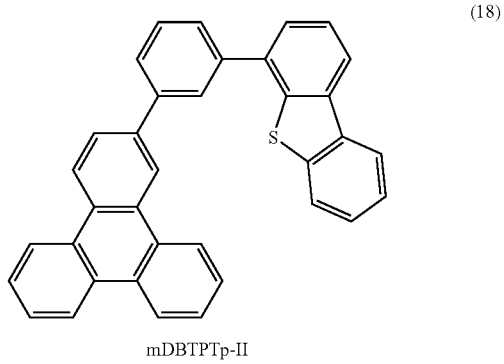

mDBTPTp-II (18)

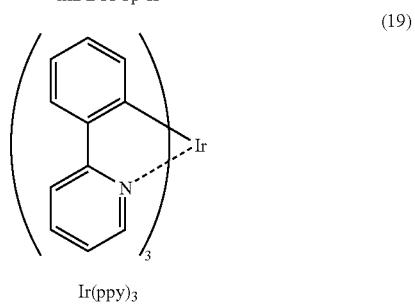

Ir(ppy)$_3$ (19)

A method for manufacturing a light-emitting element 8 of this example will be described below.

(Light-Emitting Element 8)

First, a glass substrate over which indium tin silicon oxide (ITSO) was deposited to have a thickness of 110 nm was prepared as an anode 102. The periphery of a surface of ITSO was covered with a polyimide film so that an area of 2 mm square of the surface was exposed. The electrode area was 2 mm×2 mm. As a pretreatment for forming a light-emitting element over the substrate, the surface of the substrate was washed with water and baked at 200° C. for one hour, and then a UV ozone treatment was performed for 370 seconds. After that, the substrate was transferred into a vacuum evaporation apparatus whose pressure was reduced to about $10^{-4}$ Pa, vacuum baking at 170° C. for 30 minutes was performed in a heating chamber in the vacuum evaporation apparatus, and then the substrate was cooled down for about 30 minutes.

Next, the substrate was fixed to a holder provided in the vacuum evaporation apparatus so that the surface where ITSO was deposited faced downward.

After the pressure in the vacuum evaporation apparatus was reduced to $10^{-4}$ Pa, 4-[3-(triphenylen-2-yl)phenyl]dibenzothiophene (abbreviation: mDBTPTp-II) represented by the structural formula (18) and molybdenum(VI)oxide were co-evaporated so as to meet mDBTPTp-II: molybdenum(VI) oxide=4:2 (mass ratio), whereby the hole-transport layer 104 was formed. The thickness was set to be 50 nm. Note that a co-evaporation method is an evaporation method in which a plurality of different substances is simultaneously vaporized from respective different evaporation sources.

The layer 106 containing a light-emitting substance, which includes the first light-emitting layer 106a, the second light-emitting layer 106b, and a third light-emitting layer 106c, was formed over the hole-transport layer 104.

The first light-emitting layer 106a, the second light-emitting layer 106b, and the third light-emitting layer 106c were formed by co-evaporation of mDBTPTp-II and tris(2-phenylpyridinato)iridium(III) (abbreviation: Ir(ppy)$_3$) represented by the above structural formula (19). In the first light-emitting layer 106a, the mass ratio was set to be mDBTPTp-II: Ir(ppy)$_3$=1:0.3 and the thickness was set to be 10 nm. In the second light-emitting layer 106b, the mass ratio was set to be mDBTPTp-II: Ir(ppy)$_3$=1:0.08 and the thickness was set to be 10 nm. In the third light-emitting layer 106c, the mass ratio was set to be mDBTPTp-II: Ir(ppy)$_3$=1:0.04 and the thickness was set to be 20 nm.

In the light-emitting element 8, the first light-emitting layer 106a, the second light-emitting layer 106b, and the third light-emitting layer 106c, which are components of the layer 106 containing a light-emitting substance, contain the same light-emitting substance and the same host material at different mass ratios. Note that in the first light-emitting layer 106a, the second light-emitting layer 106b, and the third light-emitting layer 106c, the HOMO level of Ir(ppy)$_3$ used as the light-emitting substance is -5.32 eV and the HOMO level of mDBTPTp-II used as the host material is -5.87 eV. The concentrations of the light-emitting substance of the first light-emitting layer 106a, the second light-emitting layer 106b, and the third light-emitting layer 106c are adjusted in descending order of concentration.

Next, an electron-transport layer 110 was formed over the layer 106 containing a light-emitting substance by evaporating tris(8-quinolinolato)aluminum(III) (abbreviation: Alq) represented by the above structural formula (13) with a thickness of 10 nm, and bathophenanthroline (abbreviation: BPhen) represented by the above structural formula (14) with a thickness of 20 nm. The electron-injection layer 112 was formed by depositing lithium fluoride to have a thickness of 1 nm over the electron-transport layer 110. Lastly, aluminum was deposited to have a thickness of 200 nm as the cathode 108. In this manner, the light-emitting element 8 of this example was manufactured. In the above evaporation process, evaporation was all performed by a resistance heating method.

The element structure of the light-emitting element 8 manufactured as described above is shown in Table 12. Here, the light-emitting element 8 has the structure described in Embodiment 2.

The light-emitting element 8 thus obtained was sealed in a glove box under a nitrogen atmosphere without being exposed to the atmosphere. Then, the operating characteristics of the light-emitting element were measured. Note that the measurement was carried out at room temperature (in an atmosphere kept at 25° C.).

Figure 38:
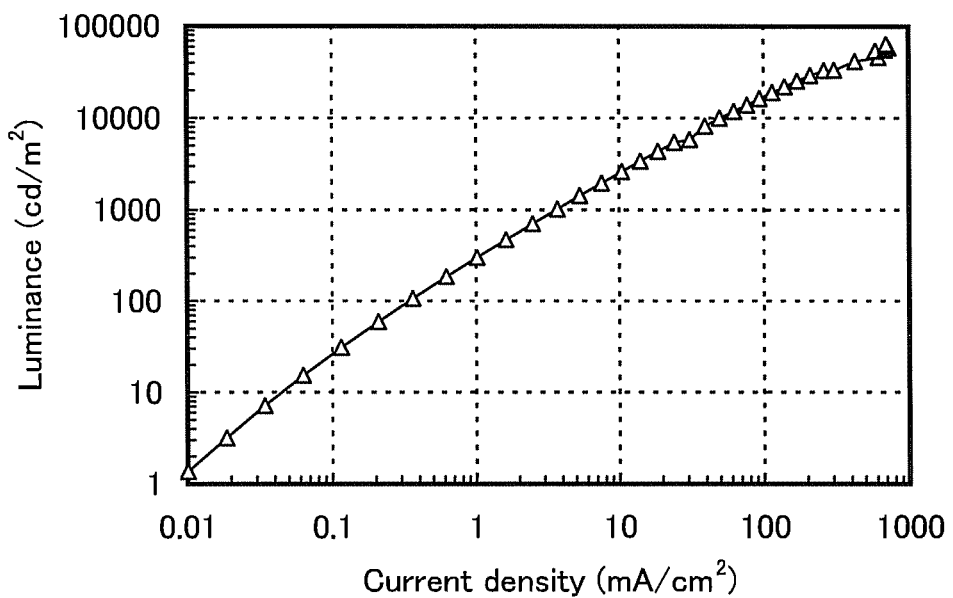
FIG. 38 is a graph showing characteristics of a light-emitting element of Example 7.
Figure 39:
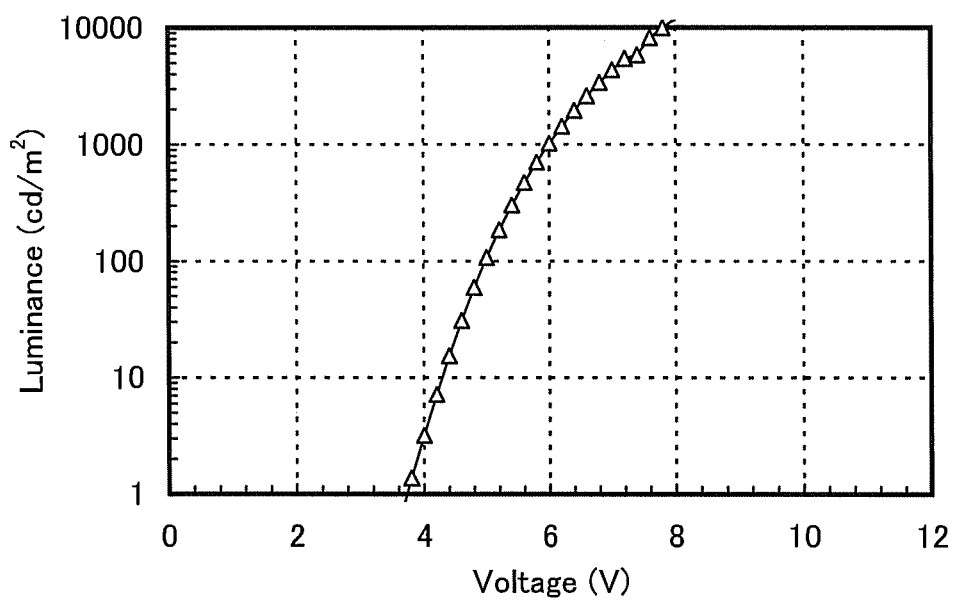
FIG. 39 is a graph showing characteristics of the light-emitting element of Example 7.
Figure 40:
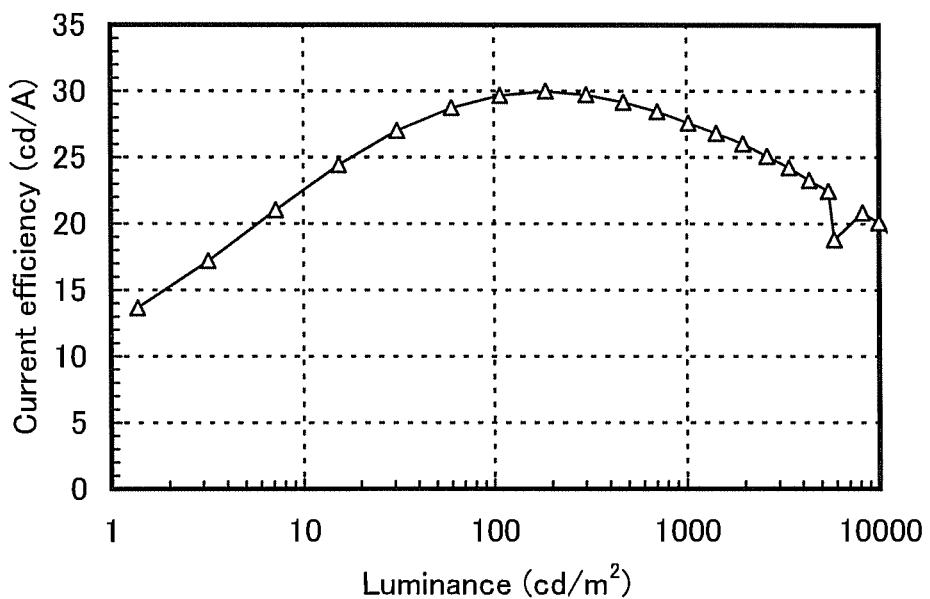
FIG. 40 is a graph showing characteristics of the light-emitting element of Example 7.
Figure 41:
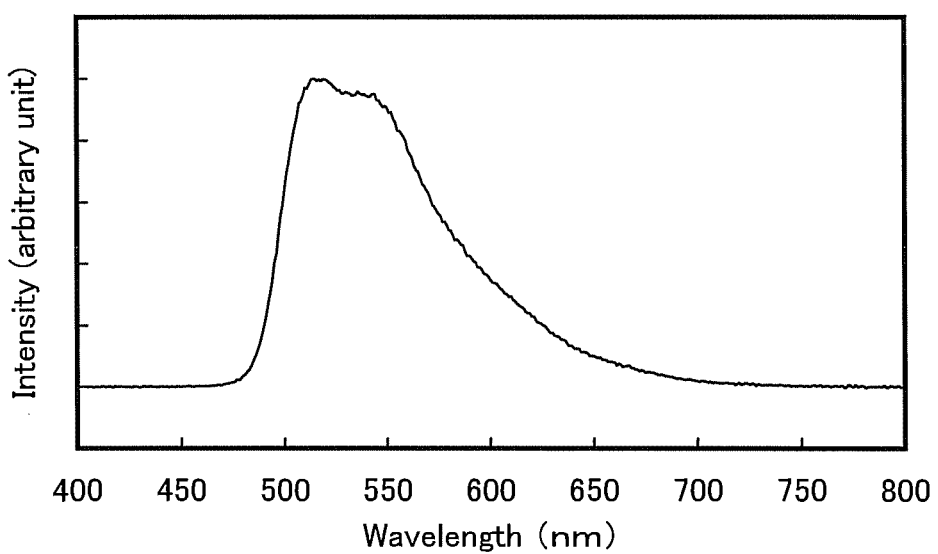
FIG. 41 is a graph showing characteristics of the light-emitting element of Example 7.

Current density-luminance characteristics, voltage-luminance characteristics, and luminance-current efficiency characteristics of the light-emitting element are shown in FIG. 38, FIG. 39, and FIG. 40, respectively. The light emission spectrum when a current of 0.1 mA flows is shown in FIG. 41. The voltage and the chromaticity of the light-emitting element around 1000 cd/m$^2$ are shown in Table 13.

TABLE 13

|  | Light-emitting element 8 |
| --- | --- |
| Luminance (cd/m$^2$) | 1020 |
| Voltage (V) | 6.0 |
| Chromaticity (x, y) | (0.35, 0.61) |

Figure 42:
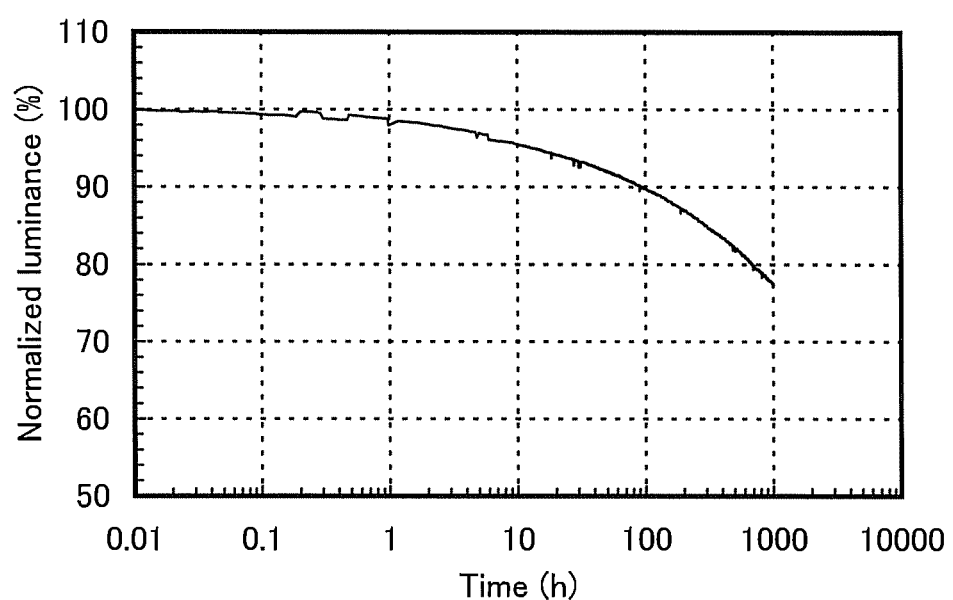
FIG. 42 is a graph showing characteristics of the light-emitting element of Example 7.

Further, a reliability test of the manufactured light-emitting element 8 was performed. In the reliability test, the initial luminance was set at 5000 cd/m$^2$, the light-emitting element was operated at a constant current density, and the luminance was measured at regular intervals. The result obtained by the reliability test is shown in FIG. 42. In FIG. 42, the horizontal axis represents current flow time (hour) and the vertical axis represents the percentage of luminance to the initial luminance at each time, that is, normalized luminance (%).

As can be seen from FIG. 42, after the driving for 1000 hours, the light-emitting element 8 kept 77% of the initial luminance. Accordingly, it is found that the luminance of the light-emitting element 8 does not easily decrease with the passage of time, and the light-emitting element 8 has long lifetime. The results suggest that in the light-emitting element 8, since the hole-transport layer 104 in which molybdenum oxide is contained as the anti-reduction substance is adjacent to the layer 106 containing a light-emitting substance, even when an electron passes through the layer 106 containing a light-emitting substance and reaches the side of the hole-transport layer, the electron can be recombined with the anti-reduction substance; therefore, accumulation of electrons at the interface between the hole-transport layer 104 and the layer 106 containing a light-emitting substance is suppressed.

In the light-emitting element 8 of this example, since the same light-emitting substance is contained in the first light-emitting layer 106a, the second light-emitting layer 106b, and the third light-emitting layer 106c, which are components of the layer 106 containing a light-emitting substance, a hole that is a carrier can be easily transported in the layer 106 containing a light-emitting substance. Further, as the host material of the layer 106 containing a light-emitting substance, a material whose HOMO level is deeper than that of the light-emitting substance is used, so that a hole is trapped by the light-emitting substance in a light-emitting layer in

TABLE 12

|  |  |  | 106 | | | | | |
| --- | --- | --- | --- | --- | --- | --- | --- | --- |
|  | 102 | 104 | 106a | 106b | 106c | 110 | 112 | 108 |
| Light-emitting element 8 | ITSO 110 nm | mDBTPTp-II:MoOx (=4:2) 50 nm | mDBTPTp-II:Ir(ppy)3 (=1:0.3) 10 nm | (=1:0.08) 10 nm | (=1:0.04) 20 nm | Alq 10 nm | BPhen 20 nm | LiF 1 nm | Al 200 nm | which the concentration of the added light-emitting substance (a guest material) is low. In other words, in the first light-emitting layer 106a containing the light-emitting substance at high concentration, a hole which passes through the HOMO level of the light-emitting substance is transported to the second light-emitting layer 106b; however, in the second light-emitting layer 106b having a low concentration of the light-emitting substance, or the third light-emitting layer 106c having a lower concentration of the light-emitting substance than the second light-emitting layer 106b, a hole is not easily transported due to the light-emitting substance having a hole-trapping property. Therefore, a light-emitting region can be controlled inside the layer 106 containing a light-emitting substance, whereby it is suggested that a light-emitting element with small decrease of the light-emitting efficiency can be manufactured.

As described above, according to this example, it was confirmed that the light-emitting element of this example has characteristics as a light-emitting element and functions well. In addition, the light-emitting element 8 of this example can be considered to be a light-emitting element achieved high reliability.

REFERENCE EXAMPLE

In this reference example, a synthesis method of the material used in the above examples is specifically described.

Synthesis Example of 2PCzPA

An example of a synthesis method of 3-(9,10-diphenyl-2-anthryl)-9-phenyl-9H-carbazole (abbreviation: 2PCzPA) which is used in Examples 1 to 3 and represented by the structural formula (11) will be described below.

A synthesis scheme of 2PCzPA is shown in (A-1).

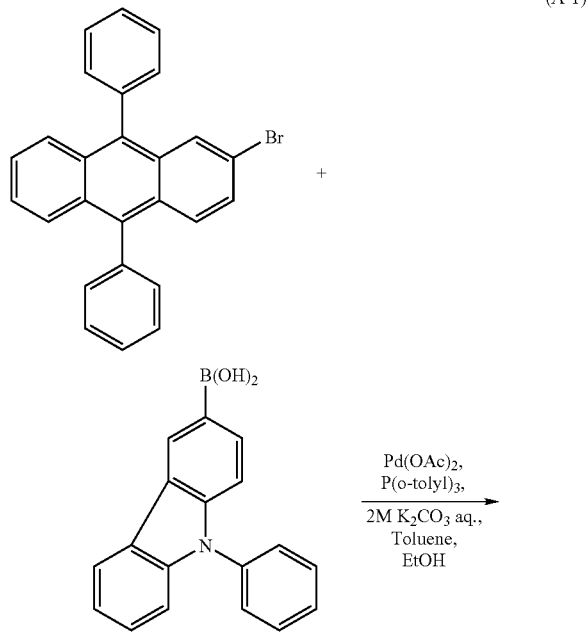

(A-1)

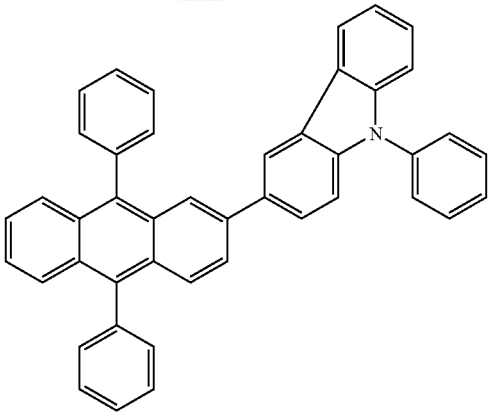

2PCzPA 1.5 g (3.7 mmol) of 2-bromo-9,10-diphenylanthracene, 1.1 g (3.7 mmol) of 9-phenyl-9H-carbazol-3-boronic acid, and 0.16 g (0.50 mmol) of tri(ortho-tolyl)phosphine were put in a 100 mL three-neck flask, and the atmosphere in the flask was replaced with nitrogen. To this mixture were added 20 mL of toluene, 10 mL of ethanol, and 13 mL of a potassium carbonate aqueous solution (2.0 mol/L). This mixture was degassed while being stirred under reduced pressure. After the degassing, the atmosphere in the flask was replaced with nitrogen. To this mixture was added 28 mg (0.10 mmol) of palladium (II)acetate. This mixture was refluxed at 110° C. for 12 hours. After the reflux, this mixture was cooled to room temperature, and then about 20 mL of toluene was added thereto, and the mixture was filtered through Celite (produced by Wako Pure Chemical Industries, Ltd., Catalog No. 531-16855). The organic layer of the obtained mixture was washed with water and a saturated saline solution, and dried with magnesium sulfate. This mixture was subjected to gravity filtration, and the obtained solution was concentrated, whereby a brown oily substance was obtained. This oily substance was purified by silica gel column chromatography (developing solvent, hexane:toluene=7:3). The obtained light-yellow solid was recrystallized with ethanol to give 1.2 g of a light-yellow powdered solid in a yield of 58%.

Then, 1.2 g of the obtained light-yellow powdered solid was sublimated and purified by train sublimation. The sublimation purification condition was as follows: the pressure was 8.7 Pa, the flow rate of argon gas was 3.0 mL/min, and heating temperature was 280° C. After the sublimation purification, 0.83 g of a light-yellow solid was obtained in a yield of 74%.

By nuclear magnetic resonance (NMR) measurement, it was confirmed that this compound was 3-(9,10-diphenyl-2-anthryl)-9-phenyl-9H-carbazole (abbreviation: 2PCzPA), which was the desired compound. The measurement data of $^1$H NMR is shown below.

$^1$H NMR (CDCl$_3$, 300 MHz): δ=7.30-7.34 (m, 3H), 7.41-7.49 (m, 4H), 7.53-7.65 (m, 15H), 7.70-7.74 (m, 2H), 7.79-7.84 (m, 2H), 7.98 (s, 1H), 8.15 (d, J=7.8 Hz, 1H), 8.31 (d, J=2.1 Hz, 1H).

This application is based on Japanese Patent Application serial no. 2009-131613 filed with Japan Patent Office on May 29, 2009, the entire contents of which are hereby incorporated by reference.

EXPLANATION OF REFERENCE

100: light-emitting element, 101: substrate, 102: anode, 103: EL layer, 104: hole-transport layer, 106: layer containing a light-emitting substance, 108: cathode, 110: electron-transport layer, 112: electron-inject layer, 120: light-emitting element, 206: LUMO level, 210: LUMO level, 218: HOMO level, 220: HOMO level, 222: HOMO level, 224: HOMO level, 500: EL layer, 511: EL layer, 512: EL layer, 513: charge-generating layer, 521: electrode, 522: electrode, 601: substrate, 602: insulating layer, 603: electrode, 604: partition wall, 605: opening, 606: partition wall, 607: EL layer, 608: electrode, 703: scanning line, 705: region, 706: partition wall, 708: data line, 709: connection wiring, 710: input terminal, 712: input terminal, 801: pixel substrate, 802: pixel portion, 803: driver circuit portion (source side driver circuit), 804: driver circuit portion (gate side driver circuit), 805: sealant, 806: sealing substrate, 807: wiring, 808: flexible printed circuit (FPC), 809: n-channel TFT, 810: p-channel TFT, 811: switching TFT, 812: current control TFT, 813: anode, 814: insulator, 815: EL layer, 816: cathode, 817: light-emitting element, 818: space, 1001: lighting device, 1002: lighting device, 1003: desk lamp, 9100: television set, 9101: housing, 9103: display portion, 9105: stand, 9107: display portion, 9109: operation key, 9110: remote controller, 9201: main body, 9202: housing, 9203: display portion, 9204: key board, 9205: external connection port, 9206: pointing device, 9301: housing, 9302: housing, 9303: connection portion, 9304: display portion, 9305: display portion, 9306: speaker portion, 9307: recording medium insertion portion, 9308: LED lamp, 9309: operation key, 9310: connection terminal, 9311: sensor, 9312: microphone, 9401: lighting portion, 9402: shade, 9403: adjustable arm, 9404: support, 9405: base, 9406: power source switch, 9500: mobile phone set, 9501: housing, 9502: display portion, 9503: operation button, 9504: external connection port, 9505: speaker, 9506: microphone

The invention claimed is:

1. A light-emitting element comprising:
an anode;
a hole-transport layer over the anode;
a first light-emitting layer over and in contact with the hole-transport layer;
a second light-emitting layer over and in contact with the first light-emitting layer; and
a cathode over the second light-emitting layer,
wherein the hole-transport layer includes a first organic compound and an anti-reduction substance,
wherein an electron-accepting property of the anti-reduction substance is higher than an electron-accepting property of the first organic compound,
wherein the first light-emitting layer includes a first host material having an electron-transport property and a first light-emitting material,
wherein the second light-emitting layer includes a second host material having an electron-transport property and a second light-emitting material having a hole-trapping property,
wherein the LUMO level of the anti-reduction substance is lower than the LUMO level of the first organic compound and the LUMO level of the first light-emitting layer, and
wherein the LUMO level of the first light-emitting layer is lower than the LUMO level of the first organic compound.

2. The light-emitting element according to claim 1, wherein the anode and the hole-transport layer are in contact with each other.

3. The light-emitting element according to claim 1, wherein the first light-emitting layer and the second light-emitting layer are formed by a wet method.

4. A light-emitting device comprising the light-emitting element according to claim 1.

5. A lighting device comprising the light-emitting device according to claim 4.

6. An electronic appliance comprising the light-emitting device according to claim 4.

7. The light-emitting element according to claim 1, wherein the HOMO level of the second host material is lower than the HOMO level of the second light-emitting material.

8. The light-emitting element according to claim 1, wherein the HOMO level of the second host material is lower than the HOMO level of the second light-emitting material, and
wherein a difference between an absolute value of the HOMO level of the second host material and an absolute value of the HOMO level of the second light-emitting material is greater than 0.2 eV.

9. A light-emitting element comprising:
an anode;
a hole-transport layer over the anode;
a first light-emitting layer over and in contact with the hole-transport layer;
a second light-emitting layer over and in contact with the first light-emitting layer; and
a cathode over the second light-emitting layer,
wherein the hole-transport layer includes a first organic compound and an anti-reduction substance,
wherein an electron-accepting property of the anti-reduction substance is higher than an electron-accepting property of the first organic compound,
wherein the first light-emitting layer includes a first host material having an electron-transport property and a first light-emitting material,
wherein the second light-emitting layer includes a second host material having an electron-transport property and a second light-emitting material having a hole-trapping property,
wherein the LUMO level of the anti-reduction substance is lower than the LUMO level of the first organic compound and the LUMO level of the first light-emitting layer,
wherein the LUMO level of the first light-emitting layer is lower than the LUMO level of the first organic compound, and
wherein a concentration of the first light-emitting material included in the first light-emitting layer is higher than a concentration of the second light-emitting material included in the second light-emitting layer.

10. The light-emitting element according to claim 9, wherein the anode and the hole-transport layer are in contact with each other.

11. The light-emitting element according to claim 9, wherein the first light-emitting layer and the second light-emitting layer are formed by a wet method.

12. A light-emitting device comprising the light-emitting element according to claim 9.

13. A lighting device comprising the light-emitting device according to claim 12.

14. An electronic appliance comprising the light-emitting device according to claim 12.

15. The light-emitting element according to claim 9, wherein the HOMO level of the second host material is lower than the HOMO level of the second light-emitting material.

16. The light-emitting element according to claim 9,
wherein the HOMO level of the second host material is lower than the HOMO level of the second light-emitting material, and
wherein a difference between an absolute value of the HOMO level of the second host material and an absolute value of the HOMO level of the second light-emitting material is greater than 0.2 eV.

17. A light-emitting element comprising:
an anode;
a hole-transport layer over the anode;
a first light-emitting layer over and in contact with the hole-transport layer;
a second light-emitting layer over and in contact with the first light-emitting layer; and
a cathode over the second light-emitting layer,
wherein the hole-transport layer includes a first organic compound and an anti-reduction substance,
wherein an electron-accepting property of the anti-reduction substance is higher than an electron-accepting property of the first organic compound,
wherein the first light-emitting layer includes a first host material having an electron-transport property and a first light-emitting material,
wherein the second light-emitting layer includes a second host material having an electron-transport property and a second light-emitting material having a hole-trapping property,
wherein the LUMO level of the anti-reduction substance is lower than the LUMO level of the first organic compound and the LUMO level of the first light-emitting layer,
wherein the LUMO level of the first light-emitting layer is lower than the LUMO level of the first organic compound, and
wherein the anti-reduction substance includes metal oxide.

18. The light-emitting element according to claim 17,
wherein a concentration of the metal oxide included in the first organic compound is greater than or equal to 67 wt % and less than 100 wt % in the hole-transport layer.

19. The light-emitting element according to claim 17,
wherein the anode and the hole-transport layer are in contact with each other.

20. The light-emitting element according to claim 17,
wherein the first light-emitting layer and the second light-emitting layer are formed by a wet method.

21. A light-emitting device comprising the light-emitting element according to claim 17.

22. A lighting device comprising the light-emitting device according to claim 21.

23. An electronic appliance comprising the light-emitting device according to claim 21.

24. The light-emitting element according to claim 17,
wherein the HOMO level of the second host material is lower than the HOMO level of the second light-emitting material.

25. The light-emitting element according to claim 17,
wherein the HOMO level of the second host material is lower than the HOMO level of the second light-emitting material, and
wherein a difference between an absolute value of the HOMO level of the second host material and an absolute value of the HOMO level of the second light-emitting material is greater than 0.2 eV.

* * * * *

UNITED STATES PATENT AND TRADEMARK OFFICE
CERTIFICATE OF CORRECTION

PATENT NO. : 8,841,653 B2
APPLICATION NO. : 12/787932
DATED : September 23, 2014
INVENTOR(S) : Satoko Shitagaki and Satoshi Seo Page 1 of 1

It is certified that error appears in the above-identified patent and that said Letters Patent is hereby corrected as shown below:

In the Specification:

Column 7, Lines 8 to 9; Change "}-N-phenyl)amino)" to --}-N-phenyl-amino)--.

Column 7, Lines 25 to 26; Change "(2-naphthyDanthracene" to --(2-naphthyl)anthracene--.

Column 9, Line 33; Change "N,N,N',N'N",N"," to --N,N,N',N',N",N",--.

Column 9, Line 35; Change "DBC1)," to --DBCl),--.

Column 9, Lines 49 to 50; Change "pro-panedintrile" to --pro-panedinitrile--.

Column 9, Line 66; Change "[in]quinolinzin" to --[ij]quinolizin--.

Column 11, Line 19; Change "(abbreviation: mCzPA) CzPAαN),"
    to --(abbreviation: CzPAαN),--.

Column 21, Line 6; Change "via all input" to --via an input--.

Signed and Sealed this
Twenty-fourth Day of March, 2015

Michelle K. Lee
*Director of the United States Patent and Trademark Office*